(12) United States Patent
Kramer

(10) Patent No.: US 6,583,934 B2
(45) Date of Patent: *Jun. 24, 2003

(54) DIFFRACTION GRATING-BASED WAVELENGTH SELECTION UNIT

(75) Inventor: Charles J. Kramer, Webster, NY (US)

(73) Assignee: Holotek, LLC, Henrietta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/780,769

(22) Filed: Feb. 9, 2001

(65) Prior Publication Data

US 2003/0076590 A1 Apr. 24, 2003

Related U.S. Application Data

(63) Continuation-in-part of application No. 09/761,509, filed on Jan. 16, 2001.

(51) Int. Cl.$^7$ ................................................. G02B 5/18
(52) U.S. Cl. ........................ 359/569; 356/328; 356/334
(58) Field of Search ................................. 359/566, 569; 356/328, 334

(56) References Cited

U.S. PATENT DOCUMENTS

| | | |
|---|---|---|
| 5,917,625 A | 6/1999 | Ogusu |
| 6,108,471 A | 8/2000 | Zhang |
| 6,262,844 B1 * | 7/2001 | Soskind ................ 359/565 |
| 6,275,630 B1 * | 8/2001 | Yang et al. ............ 385/37 |

OTHER PUBLICATIONS

Erwin G. Loewen and Evgeny Pupov, ""Diffraction Grating and Applications", " Diffraction Grating and Applications, Marcel Dekker, Inc. (New York, New Yirk ), p. 179–182, (Apr. 9, 1997).

E. G. Loewen, M. Neviere, and D. Maystre, ""Grating efficiency theory as it applies to blazed and holographic gratings", " Applied Optics, p. 2711–2721, ( Oct. 1997).

* cited by examiner

*Primary Examiner*—Mark A. Robinson
*Assistant Examiner*—Alessandro V. Amari

(57) ABSTRACT

An optical wavelength selection apparatus containing a surface-relief transmission diffraction grating, a collimating lens for collimating a beam incident to the diffraction grating, and a focusing lens for focusing the beams diffracted by the diffraction grating. The diffraction grating, after having been subjected to a test condition of 85 degrees centigrade and a relative humidity of 85 percent for at least 500 hours, has diffraction efficiency performance within 6 percent of that achieved before being subjected to these test conditions.

2 Claims, 34 Drawing Sheets

DIFFRACTION GRATING-BASED WAVELENGTH SELECTION UNIT

CROSS-REFERENCE TO RELATED PATENT APPLICATION

This application is a continuation-in-part of applicant's copending patent application 09/761,509, filed on Jan. 16, 2001.

FIELD OF THE INVENTION

A diffraction grating-based wavelength selection unit.

BACKGROUND OF THE INVENTION

U.S. Pat. No. 5,917,625 discloses, in FIG. 28, a multiplexing/demultiplexing device which utilizes a transmission type diffraction grating 140 disposed in front of a reflection mirror 115. The entire disclosure of this United States patent is hereby incorporated by reference into this specification.

A device similar to that disclosed in U.S. Pat. No. 5,917,625 is claimed in U.S. patent application Ser. No. 09/193,289. This United States patent application is discussed in Columns 1 and 2 of U.S. Pat. No. 6,108,471, the disclosure of which is also hereby incorporated by reference into this specification.

The U.S. Ser. No. 09/193,289 patent application claimed an optical multiplexing and demultiplexing device comprising a fiber mounting assembly for securing a plurality of optical fibers, collimating and focusing lens, a transmissive grating including a diffractive element formed from a photosensitive medium, and a mirror for receiving at least one beam coming from at least one of the plurality of optical fibers via the lens and the grating and for reflecting one or more of the beams back through the grating and the lens to at least one of the optical fibers. The photosensitive medium disclosed in U.S. Ser. No. 09/193,289 was dichromate gelatin (DCG).

DCG transmissive gratings are transmission volume phase gratings and, thus, the diffracting grating layer in these grating elements tend to have a thickness which is significantly larger than the corresponding layer in surface-relief grating elements. Thus, such gratings tend to change their optical properties with changes in temperature more than that achieved with surface-relief gratings fabricated on low thermal expansion substrate materials. Furthermore, because of their thickness, DCG gratings tend to be more sensitive to angular alignment issues than are surface-relief gratings; and, because of such alignment issues, the DCG gratings are not readily usable for broad spectrum wavelength beam applications that require equal diffraction efficiency for all of the spectral components of the beam. For fiber-optic telecommunication systems having wavelength channel signals over the spectrum range of from 1280 to 1620 nanamometers, the DCG grating-based devices tend not to be as useful for this system application as surface-relief grating-based devices.

Surface-relief reflection grating elements are well known to those skilled in the art, and their diffracting grating layer is substantially thinner than that incorporated in DCG grating elements; consequently, they do not suffer from many of the disadvantages of DCG gratings. The properties of surface-relief reflection grating elements are disclosed in Christopher Palmer's "Diffraction Grating Handbook," Fourth Edition (Richardson Grating Laboratory, Rochester, N.Y., 14605). Reference also may be had to a paper by E. G. Loewen et al. entitled "Grating efficiency theory as it applies to blazed and holographic gratings," (Applied Optics, Volume 16, page 2711, October, 1977).

While surface-relief transmission grating elements are not as well known or used as surface-relief reflection grating elements, they are commercially available from Holotek LLC of Henrietta, N.Y. Surface-relief transmission grating elements have the same advantages relative to DCG gratings that surface-relief reflection grating elements have; and they provide even more advantages than surface-relief reflection grating elements when used in fiber-optic communication devices. In particular, they can provide higher wavelength dispersion power while still achieving essentially equal diffraction efficiency values for S and P polarized optical components. However, when the grating surfaces of prior art surface-relief transmission grating elements are subjected to a temperature of 85 degrees centigrade at a relative humidity of 85 percent for two hours or less, the grating surfaces are degraded until the grating structure disappears. This test is often referred to as the "Bellcore High Temperature High Humidity Storage Test for Fiber Optic Devices."

It is an object of this invention to provide a surface-relief transmission grating with improved durability when subjected to the Bellcore High Temperature High Humidity Storage test conditions.

It is another object of this invention to have such improved surface-relief transmission gratings have greater than 70 percent diffraction efficiency values for S and P polarized optical components while achieving essentially equal diffraction efficiency values for these polarization components, that is, the S and P polarizations have diffraction efficiency values within about 5 percent of each other.

It is yet another object of this invention to have such improved surface-relief transmission grating use a low thermal expansion substrate material and, thereby achieve a change in grating line spacing that is in an accept range when the grating is used over the 70 degree centigrade temperature range specified for fiber-optic communication devices.

It is yet anther object of this invention to have such improved surface-relief transmission grating surface be encapsulated and, thereby protect the grating surface from being damaged due to handling and cleaning of the grating element, as well as, from contaminants, liquids or solvent vapors that could damage the grating surface.

It is yet another object of this invention to provide devices incorporating such improved surface-relief transmission grating.

It is yet another object of this invention to provide grating-based devices having higher wavelength dispersion power while providing essentially equal radiometric throughput efficiency values for S and P polarized optical components, that is, the S and P polarizations have device radiometric throughput efficiency values equal to within about 5 percent of each other.

SUMMARY OF THE INVENTION

In accordance with this invention, there is provided an optical wavelength selection unit comprising a surface-relief transmission diffraction grating which, after having been subjected to a test condition of 85 degrees centigrade and a relative humidity of 85 percent for at least 500 hours, has diffraction efficiency performance within 6 percent of that achieved before being subjected to these test conditions.

BRIEF DESCRIPTION OF THE DRAWINGS

The claimed invention will be described by reference to the specification, and to the following drawings in which like numerals refer to like elements, wherein:

DESCRIPTION OF THE PREFERRED EMBODIMENTS

Figure 1:
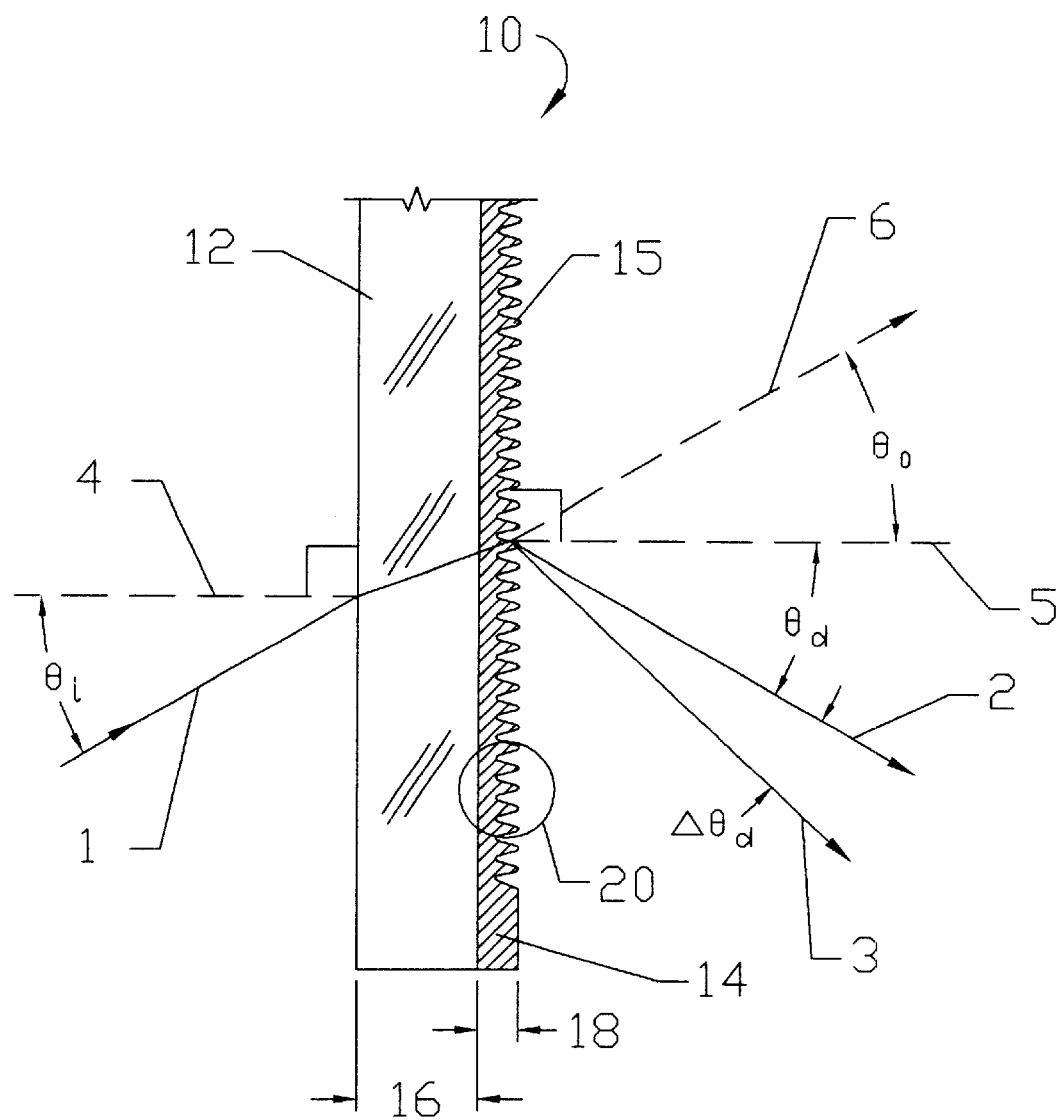
FIG. 1 is a partial sectional view of one preferred transmission grating element of the invention.

FIG. 1 is a sectional side view of a preferred sinusoidal surface-relief transmission diffraction grating element 10 comprised of a substrate 12 and a grating forming layer 14 containing surface-relief diffraction grating 15. This FIG. 1 illustrates the angular relationship between the incident optical beam 1 and the diffracted optical beams 2,3 relative to the normals 4,5 to the grating surface for this grating element 10. In the embodiment illustrated in FIG. 1, the incident beam 1 is comprised of $\lambda_1$ and $\lambda 2$ wavelength components and makes an angle of $\theta_i$ with the normal 4 to the substrate surface. After propagating through the substrate 12 and grating forming layer 14, the beam 1 is incident on the surface-relief grating 15. A portion of the incident beam 1 intensity is undiffracted and exits the grating as the zeroth order beam 6 at an angle $\theta_o$ relative to the grating normal 5, while the remaining beam intensities for each of the wavelength components of beam 1 are diffracted into first order $\lambda_1$ wavelength beam 2 and first order $\lambda_2$ wavelength beam 3 having angles of $\theta_d$ and $\theta_d + \Delta\theta_d$, respectively, with regard to the grating normal 5 for the case where $\lambda_2 > \lambda_1$. Because, in the embodiment depicted in FIG. 1, the grating forming layer 14 is parallel to the substrate surface on which it resides and the substrate 12 has parallel surfaces, one does not have to include the index of refraction of either the substrate or grating forming layer into the grating equation used to calculate the angular relationship between incident and diffracted beams for the grating element 10. Under the parallel plate conditions depicted in FIG. 1, $\theta_i$ can be used as the incident angle in the grating equation and, therefore, the undiffracted zeroth order beam makes an angle of $\theta_o = \theta_i$ with regard to the normal 6 to the grating surface.

The surface-relief diffraction grating illustrated in FIG. 1 is a surface-relief transmission diffraction grating, i.e., a transparent diffraction grating that serves to transmit light. Surface-relief diffraction gratings are well known and are referred to in, e.g., U.S. Pat. No. 6,157,042 (metal surface-relief diffraction grating with a gallium arsenide substrate), U.S. Pat. Nos. 6,108,135, 5,569,904, 5,539,206, 5,363,226 (surface-relief reflection diffraction grating), U.S. Pat. Nos. 5,162,929, 5,089,903, 4,842,633, 4,206,295, 4,204,881, 4,289,371, 4,130,347, 4,057,326, and the like. The entire disclosure of each of these United States patents is hereby incorporated by reference into this specification.

Referring again to FIG. 1, and in the preferred embodiment depicted therein, it will be seen that the substrate 12 is a transmissive material, i.e., a material with a transmittance (the ratio of the radiant power transmitted by an object to the incident radiant power) of at least about 70 percent for the wavelength spectrum to be used with the grating element. In fiber-optic telecommunication devices, such wavelength spectrum is generally from about 1280 to about 1620 nanometers.

The substrate 12 preferably is of high optical quality, i.e., it introduces less than 0.25 wave of either spherical or cylindrical wavefront power into the transmitted beam; the term wavefront power is discussed in U.S. Pat. Nos. 5,457,708, 5,264,857, 5,113,706, 5,075,695, and 4,920,348, the entire disclosures of which are hereby incorporated by reference into this specification. As will be apparent to those skilled in the art, this means that the preferred substrate 12 has flat surfaces which, in one embodiment, are preferably substantially parallel to each other, that is, being parallel within about 1 arc minute of each other.

The substrate 12 is preferably optically homogeneous, i.e., all components of volume in the substrate 12 are the same in composition and optical properties. Optically homogeneous materials are disclosed in, e.g., U.S. Pat. Nos. 6,120,839, 6,103,860, 6,084,086, 6,080,833, 6,019,472, 5,970,746, 5,914,760, 5,841,572, 5,808,784, 5,754,290, and the like; the entire disclosure of each of these United States patents is hereby incorporated by reference into this specification.

The substrate 12 depicted in FIG. 1 consists of material which has a coefficient of thermal expansion of from about $2 \times 10^{-5}$ to $-1 \times 10^{-6}$ per degree centigrade. It is preferred that the coefficient of thermal expansion to be about $6 \times 10^{-7}$ to about $-6 \times 10^{-7}$ per degree centigrade.

One may use a variety of transmissive materials known to those skilled in the art. Thus, by way of illustration and not limitation, one may use optical glass, plastics, glass-ceramic, crystalline materials, and the like. Suitable materials include, e.g., "CLEARCERAM-Z" (a glass-ceramic material made by the Ohara Incorporated of Japan), ULE (a ultra-low expansion glass sold by the Corning Company of Corning, N.Y.), fused silica, BK7 optical glass, plexiglass, crystalline quartz, silicon, etc. ULE glass is made by doping fused silica with titanium and, thus, has essentially the same optical properties as fused silica. ULE glass is referred to in, e.g., U.S. Pat. Nos. 6,048,652, 6,005,995, 5,970,082, 5,965,879, 5,831,780, 5,829,445, 5,755,850, 5,408,362, 5,358,776, 5,356,662, and the like; the entire disclosure of each of these United States patents is hereby incorporated by reference into this specification.

The substrate 12 preferably has a refractive index of from about 1.4 to about 4.0. In one embodiment, the refractive index of substrate 12 is from about 1.43 to about 1.7.

Referring again to FIG. 1, and in the preferred embodiment depicted therein, the thickness 16 of substrate 12 is generally from about 0.5 millimeters to about 100 millimeters and, preferably, from about 2 to about 20 millimeters. The thickness 18 of the grating forming layer 14 generally ranges from about 1 micron to about 5 microns. The ratio of thickness 16 to thickness 18 is generally at least about 500/1 and, more preferably, at least about 1,000/1.

Figure 2:
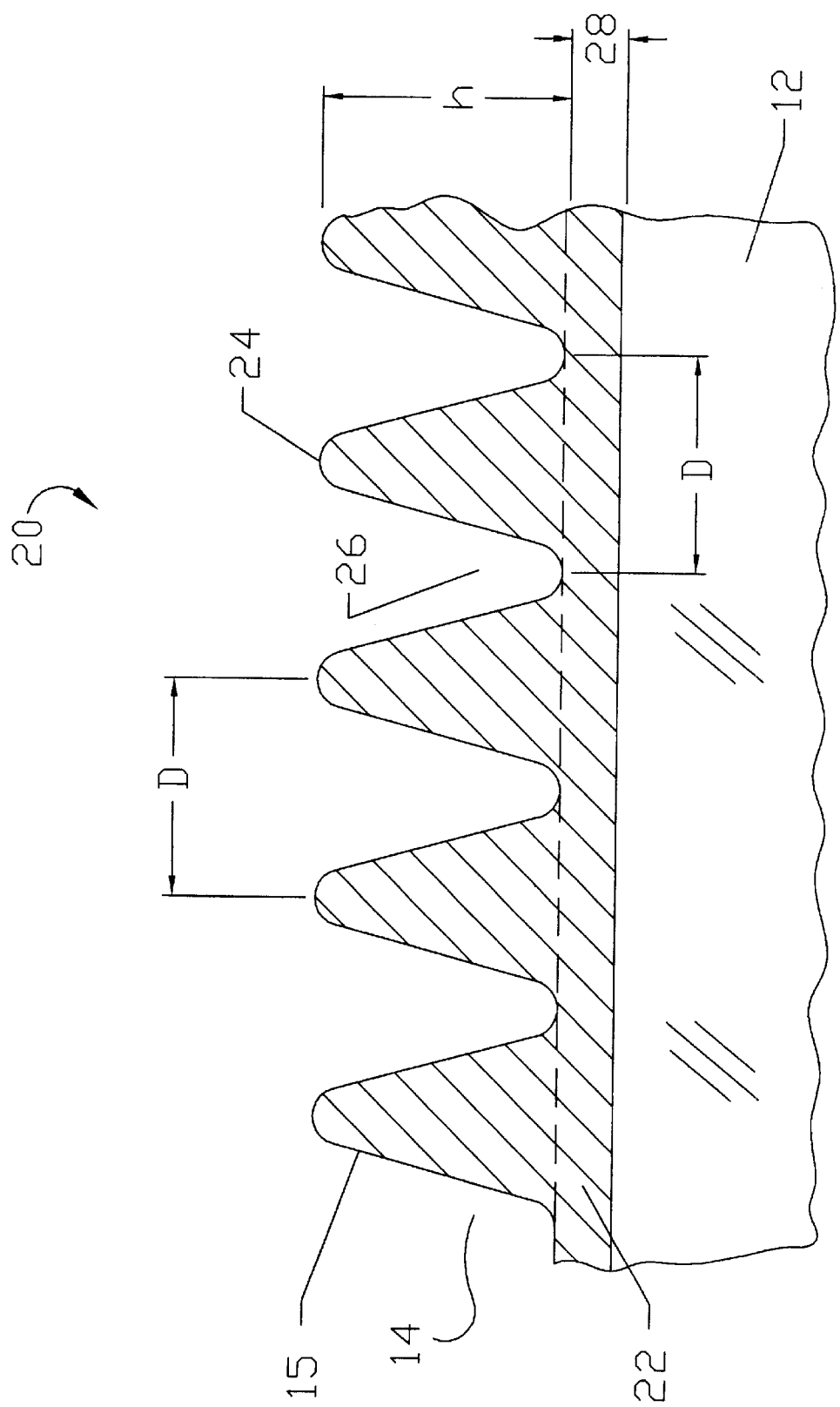
FIG. 2 is an enlarged view of a portion of the transmission grating element of FIG. 1.

FIG. 2 is an exploded partial sectional view of area 20 of FIG. 1, depicting the surface-relief diffraction grating 15 in greater detail. As will be seen from FIG. 2, in the preferred embodiment depicted the diffraction grating 15 is comprised of a base 22 integrally connected to upstanding periodically spaced grating lines 24. The periodically spaced grating grooves 26 are disposed between adjacent grating lines 24.

In one embodiment, the surface-relief grating 15 is formed in the grating forming layer 14 by a photographic process, such as holography. In another other embodiment, the surface-relief grating 15 is formed in the grating forming layer 14 by replication means. In another embodiment, the surface-relief grating 15 is etched into the substrate 12 material using either chemical or ion beam milling techniques. Normally a grating formed in a photoresist material by photographic means serves as the mask for these etching techniques. Fabrication of surface-relief diffraction gratings by holographic, replication, and ion and chemical etching techniques are described in the Erwin G. Loewen et al. book entitled "Diffraction Gratings and Applications" (Marcel Dekker, Inc., New York, 1997).

In one preferred embodiment, the grating forming layer 14 consists essentially of material with an index of refraction of from about 1.4 to about 1.8 and, more preferably, from about 1.43 to about 1.55.

In the embodiment depicted in FIG. 2, the grating 15 has a substantially sinusoidal shape. In another embodiment, not shown, grating 15 has a substantially rectangular shape (see, e.g., page 180 of said Loewen book). In another embodiment, the gratings 15 may have a substantially triangular shape (see, e.g., page 180 of said Loewen book).

Sinusoidal diffraction gratings are disclosed in U.S. Pat. Nos. 6,026,053, 5,757,544, 5,755,501, 5,742,262, 5,737,042, 5,696,628, 5,341,213, 4,842,969, 4,729,640, 4,062,628, and 3,961,836; the entire disclosure of each of these United States patents is hereby incorporated by reference into this specification.

In one embodiment, the grating is formed from a photoresist material which, after being heat-treated, becomes a substantially dry solid material. It is preferred to use a positive photoresist material. Positive photoresist materials are well known to those skilled in the art and are disclosed, e.g., in U.S. Pat. Nos. 6,094,410, 6,094,305, 6,051,348, 6,027,595, 6,005,838, 5,991,078, 5,965,323, 5,936,254, 5,910,864, 5,907,436, 5,838,853, and the like; the disclosure of each of these United States patents is hereby incorporated by reference into this specification.

In the preferred embodiment, the positive photoresist material used is Shipley S1813 Photo Resist (manufactured by The Shipley Company of 455 Forest Street, Marlboro, Mass.). This positive photoresist material is comprised of from 71 to 76 parts of electronic grade propylene glycol monomethyl ether acetate, from about 10 to about 20 parts of mixed cresol novolak resin, from about 0.01 to about 1 parts of fluoroaliphatic polymer esters, from about 1 to about 10 parts of diazo photoactive compound, and from about 0.01 to about 0.99 parts of cresol.

The Shipley S1813 Photo Resist is believed to belong to a class of diazonaphthoquinone (DNQ)-novolak positive photoresists; see, e.g., pages 431–511 of James R. Sheats et al.'s "Microlithography Science and Technology (Marcel Dekker, Inc., New York, 1998) and, in particular, an article commencing at page 429 of this book by Takumi Ueno on "Chemistry of Photoresist Materials." As is disclosed on pages 433–434 of the Sheats et al. book, the properties of positive photoresist vary with " . . . the characteristics of the novolak resins, such as the isomeric structure of cresol, the position of the methylene bond, the molecular weight, and the molecular weight distribution" (at page 433).

Novolak resins are thermoplastic phenol/formaldehyde condensation products formed by the condensation of cresol with formaldehyde. Depending upon the cresol used, one may obtain the methylene bond in the meta position (by using 3-methylphenol), and/or the ortho position (by using 2-methylphenol), and/or the para position (by using 4-methylphenol).

Shipley does not disclose for its "MICROPOSIT S1800 SERIES PHOTO RESISTS" any information relating to " . . . the characteristics of the novolak resins, such as the isomeric structure of cresol, the position of the methylene bond, the molecular weight, and the molecular weight distribution."

Referring again to FIG. 2, and in the preferred embodiment depicted therein, it will be seen that grating forming layer 14 is comprised of a base layer 22 which, preferably, is at least about 0.25 microns thick, as well as the actual surface-relief grating 15.

The surface-relief grating 15 depicted in FIG. 2 is preferably periodic, that is substantially the same shape is repeated. In the preferred embodiment depicted in FIG. 2, the grating has a groove frequency ("G") of from about 400 to about 1,100 grating lines per linear millimeter. In one embodiment, there are from about 500 to about 900 grating lines per linear millimeter.

The distance between adjacent grating line 24 peaks (or valleys) is referred to as the grating line spacing D and is shown in FIG. 2. D is the reciprocal of G, the groove frequency and, thus, ranges from about 0.91 to about 2.5 microns and, preferably, from about 1.11 to about 2.0 microns.

The peak height of the lines 24, "h," as shown in FIG. 2, is the maximum distance from the trough to the peak of the grating lines 24. In general, h ranges in height from about 0.5 microns to about 5 microns.

The ratio of h to D, which is also referred to as the grating aspect ratio, and in the preferred transmission grating embodiment has a value of about 1.3 to about 2.0. In another embodiment in which a surface-relief reflection grating is used, the h/D ratio is preferably from about 0.3 to about 0.4 for the reflection grating element.

Referring again to FIG. 1, in this preferred embodiment the grating 15 is a plane diffraction grating having parallel, equidistantly spaced grating lines which reside on a flat surface. When one looks down onto the grating surface of the grating element 10, he will see a multiplicity of parallel grating groove lines spaced equidistantly from each other. As is known to those skilled in the art, one of the properties of a plane diffraction grating, as described above, is that it does not introduce optical power into the diffracted beam, i.e., a collimated incident beam is diffracted as a collimated beam.

The grating 15 is believed to be substantially more durable, when tested by a specified test, than are comparable prior art photoresist surface-relief diffraction gratings. The test used to evaluate the durability of grating 15 is set forth in Bellcore publication GR-1221-CORE, issue 2, January, 1999, entitled "Generic Reliability Assurance Requirements for Passive Optical Components." At page 6-4 of this publication, a "High Temperature Storage Test (Damp Heat)" is described. This test requires that the item tested, when subjected to a temperature of 85 degrees centigrade and a relative humidity of 85 percent, have less than 0.5 decibel optical insertion loss variation after being tested for at least 500 hours. The functionality of the item under test is periodically evaluated. A change of 0.1 decibel in optical insertion loss corresponds to a change of 2.27 percent in the optical performance of the item while a 0.5 decibel change corresponds to a 10.875 percent change in the optical performance of the item.

The preferred diffraction grating element 10 of this invention meets the aforementioned Bellcore test requirements for at least about 1,700 hours. By comparison, a prior art photoresist surface-relief transmission diffraction grating element identical in every manner but the means in which the preferred photoresist grating element 10 is post-processed, fails the aforementioned Bellcore test completely in less than about 2 hours, that is, the grating surface structure completely disappears in less than 2 hours at these test conditions.

The production of a diffraction grating assembly from photoresist is well known to those in the art. See, e.g., U.S. Pat. No. 4,289,371.

Figure 3:
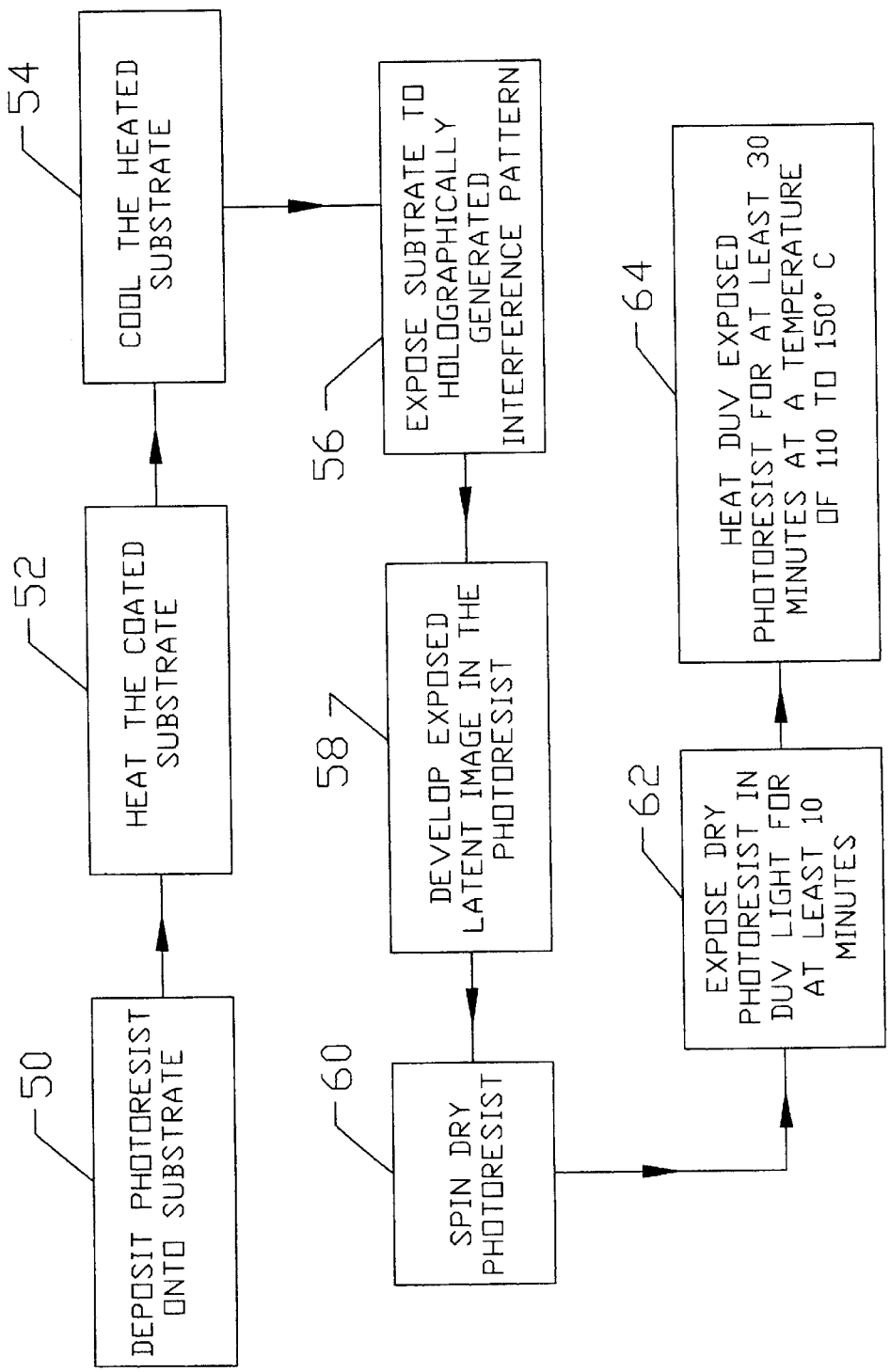
FIG. 3 is a flow diagram illustrating one preferred process for preparing the transmission grating element of FIG. 1.

One preferred process for preparing the grating element 10 of this invention is disclosed in FIG. 3. Referring to FIG. 3, and in the preferred process described therein, in step 50 photoresist is applied to the top surface of a substrate. The substrate preferably is either rectangular or circular in shape and, most preferably, is made from the ULE glass material described elsewhere in this specification. In one preferred embodiment, the substrate is about 3.5 millimeters thick.

The preferred photoresist material, which is also described elsewhere in this specification, is spread over the top surface of the substrate to a uniform thickness, preferably by a spin coating method in which the substrate is rotated at a speed of from about 2,000 to about 4,000 revolutions per minute and the photoresist is spread and dried by centrifugal force. In one embodiment, the photoresist is applied to a thickness of about 3 microns.

Thereafter, in step 52 of the process, the coated substrate is heated to vaporize any remaining solvent in the coating.

It is preferred to place the substrate onto a hot plate preheated to a temperature of about 110 degrees centigrade and to so heat the coated substrate for a period of from about 2 to about 10 minutes.

Thereafter, in step 54, the substrate is removed from the hot plate and allowed to cool under ambient conditions for at least about 5 hours.

Thereafter, in step 56, the substrate is exposed to a holographically generated optical interference pattern. Such optical interference pattern is preferably produced by two interfering collimated laser beams which are derived from the same helium cadmium laser operating at a wavelength of 442 nanometers. The angle subtended by the interfering beams determines the period of the interference pattern and, thus, the period of the final diffraction grating. Reference may be had to an article by Fujio Iwata et al. entitled "Characteristics of Photoresist Hologram and its Replica," Applied Optics, Volume 13, number 6, pages 1327 et seq. (June, 1974). Reference also may be had to a paper by H. Werlech et al. on "Fabrication of high efficiency surface-relief holograms" which was published in the Journal of Imaging Technology, 10(3):105 (1984). Reference may also be had to many different United States patents which disclose surface-relief holograms, including, e.g., U.S. Pat. Nos. 6,160,668, 6,157,474, 6,067,214, 6,049,434, 6,017,657, 5,986,838, 5,948,199, 5,917,562, 5,896,483, 5,889,612, 5,961,990, 5,856,048, 5,838,466, 5,790,242, 5,786,910, 5,757,523, 5,757,521, 5,756,981, 5,748,828, 5,742,411, 5,712,731, 5,691,831, 5,691,830, and the like; the entire disclosure of each of these United States patents is hereby incorporated by reference into this specification.

Thereafter, in step 58, the exposed latent image in the photoresist layer is developed by submerging the exposed photoresist in developer. A similar process for preparing, exposing and developing photoresist coated substrates is disclosed on the world wide web at http://www.ece.gatech.edu/research/labs/vc/processes/photoLith.html.

One may use conventional developing solutions such as, e.g., one or more of the photoresist developers disclosed in U.S. Pat. Nos. 6,087,655, 6,067,154, 5,881,083, 5,805,755, 5,607,800, 5,521,030, 5,113,286, 4,826,291, 4,804,241, 4,725,137, 4,617,252, 4,589,972, 4,566,889, 4,505,223, 4,469,544, 4,236,098, 4,204,866, 4,157,220, 3,945,825, 3,944,420, and the like. The entire disclosure of each of these United States patents is hereby incorporated by reference into this specification.

In one embodiment, the photoresist developer used is Shipley's "Microposit 303A Developer." This Shipley developer is believed to be a sodium hydroxide solution at a pH of about 14.

After the photoresist has been exposed to the developer, it is rinsed with filtered deionized water and spun dry in step 60 at a speed of about 500 revolutions per minute for about 1 minute until the grating surface appears dry.

The grating is then inspected, using a laser beam, to determine its diffraction efficiency. This diffraction efficiency information may be used to adjust either the exposure time and/or development time so that the process conditions for subsequently produced gratings may be adjusted and controlled.

The steps 50 through 60 describe one set of conditions for making a photoresist surface-relief diffraction grating element. A description of some of the technology involved in these steps 50 to 60 is set forth at pages 515 to 565 of the aforementioned James R. Sheats et al. book in an article by Bruce R. Smith entitled "Resist Processing."

The steps 62 et seq. describe critical post-exposure/development steps for insuring that the ultimate grating produced has improved durability properties, as measured by the aforementioned Bellcore test. Prior to discussing the steps 62 et seq., which produce the desired durable grating, applicant will discuss the post-processing treatment suggested by the prior art.

At page 562 to 563 of the aforementioned James R. Sheats et al. book, it is disclosed that: "Novolac resins generally suffer from thermal distortion . . . To enhance the thermal properties of DNQ/novolac resins, the UV crosslinking poperties of novolac can be utilized. Although the efficiency is quite low, novolac resin can be made to crosslink at DUV wavelengths. This is facilitated at high temperatures . . . By elevating the temperature of the "DUV" cure" process, oxidation of the bulk of the resist feature can be accomplished."

In accordance with the suggestion made in the James R. Sheats et al. book, applicant conducted an experiment in which the grating was post-processed by subjecting the grating to a high temperature (in excess of 100 degrees centigrade) while simultaneously subjecting the grating to ultraviolet light in the spectrum range of from about 200 to about 320 nanometers. As a result of these experimental conditions, the treated photoresist material became unacceptably dark.

In the preferred process of this invention, when the photoresist is sequentially subjected to the ultraviolet light exposure and thereafter subjected to high temperature, not only is a durable grating produced, not only does the treated photoresist material not become dark, but the treated photoresist material becomes clearer and optically more desirable.

In step 62 of the process, the photoresist surface of the developed diffraction grating is at ambient room temperature and pressure conditions directly exposed to a lamp producing ultraviolet light in the spectrum range of from about 200 to about 320 nanometers, which is often referred to as deep ultraviolet (DUV) radiation. For example, one may use one or more of the lamps disclosed in U.S. Pat. Nos. 4,389,482, 4,344,008, 4,312,934, 4,299,911, and 4,049,457, the entire disclosure of each of which is hereby incorporated by reference into this specification.

Unlike prior processes, there is no intermediate material, except air, positioned between the DUV light source and the photoresist. The distance between the DUV lamp and the unprotected photoresist surface is generally from about 6 to about 10 inches. One may use, e.g., conventional germicidal lamps for this purpose such as, e.g., Germicidal Lamp FG15T8. The photoresist surface is exposed to such ultraviolet light for about 10 minutes.

The Germicidal Lamp FG15T8 is 18 inches long, operates at 0.3 amperes and 56 volts, has a nominal lamp wattage of 15 watts, provides 3.5 watts of ultraviolet radiation at 253.7 nanometers, and has an average life of 8,000 hours.

Figure 9:
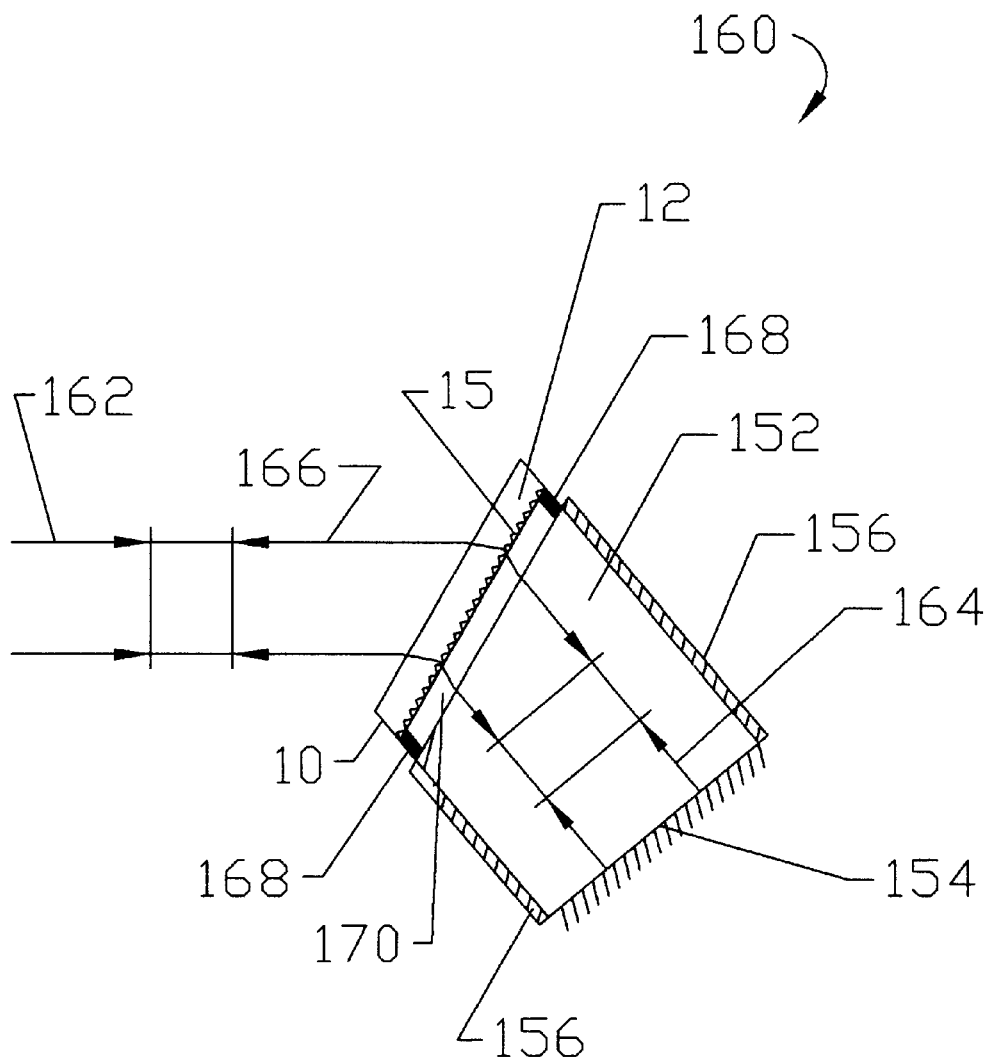
FIG. 9 is a schematic of yet another dual pass grating-based wavelength section unit utilizing the transmission grating element of FIG. 1.

Exposure of the photoresist grating forming layer to the DUV light source at ambient room temperature and pressure conditions bleaches the photoresist layer and, thereby changes the color of the photoresist layer from a yellow color to a substantially optically clear color having no visible observable color tint. This substantially optically clear color is sometimes referred to as water white. The photoresist layer stays substantially optically clear not only after being heated in step 64 of the process but also after being tested for about 1,000 hours at the previously described Bellcore test conditions, whether the grating surface is uncovered or encapsulated as illustrated in FIG. 9 of this specification. It is noticed that an uncovered grating develops a very light yellow tint color after about 1,700 hours of testing at the Bellcore test conditions. This yellow tint color does not appear to affect the diffraction efficiency performance of the grating when tested at laser wavelength of 633 nanometers.

Shipley, in their technical marketing data sheets for the Shipley S1813 Photo Resist product, presents data that shows that exposure of this photoresist to light sources having a wavelength spectrum from about 350 to 450 nanometers changes the optical absorption of the resist, particularly for optical wavelengths of less than about 500 nanometers. Applicant has observed that photoresist surface-relief transmission gratings exposed to light only in the 350 to 450 nanometer spectrum range become substantially optically clear but fail in less than about 2 hours when tested at the aforementioned Bellcore test conditions. It also has been observed that gratings exposed only to light in the 350 to 450 nanometer spectrum range fail within about 30 minutes when placed in a dry heat (<10 percent relative humidity) oven having a temperature greater than about 110 degrees centigrade. It also has been observed that gratings exposed only to light in the 350 to 450 nanometer spectrum range develop a yellow color over time if the grating surface is not encapsulated as illustrated in FIG. 9 of this specification, even when the uncovered grating elements are left at ambient room temperature and humidity conditions. It also has been observed that gratings exposed to the DUV light source but not undergoing the bake step 64 of the preferred process, appear to pass the aforementioned Bellcore test but turn a yellow color only after about 160 hours of test time at the aforementioned Bellcore test conditions.

In step 64 of the process, the DUV exposed photoresist surface is then heat treated by being heated in a relatively dry oven to a temperature of from about 110 to about 150 degrees centigrade, preferably for at least about 30 minutes. It is preferred that the photoresist surface be placed into a preheated oven at the desired temperature of from about 110 to about 150 degrees centigrade.

For surface-relief transmission grating elements that undergo steps 62 and 64 of the process presented in FIG. 3, the grating elements after being tested at the aforementioned Bellcore test conditions of 85 degrees centigrade and 85 percent relative humidity for at least 1,000 hours, have optical performance as measured by their diffraction efficiency values for light of 633 nanometers and S optical polarization that is within 6 percent of the optical performance they had prior to being tested at the Bellcore test conditions. Therefore, grating elements undergoing steps 62 and 64 of the process pass the aforementioned Bellcore test conditions since this Bellcore test deems that an item passes these test conditions if its optical performance does not change by more than 0.5 decibels (10.87 percent) after being tested for 500 hours at these test conditions.

It should be noted that the grating fabrication processing steps 50 through 64 of FIG. 3 can be utilized to produce both surface-relief transmission gratings and surface-relief reflection gratings. Surface relief transmission gratings fabricated with these processing steps are exposed and developed so that the finished grating has a grating aspect ratio in the range of about 1.3 to about 2.0 while surface-relief reflection gratings fabricated with these processing steps are exposed and developed so that the finished grating has a grating aspect ratio in the range of about 0.3 to about 0.4. After step 64 of the process, the grating surface of a reflection grating is coated with a reflecting metal film, such as gold or aluminum. The reflective metal film is usually applied to the grating surface using either evaporation or electronic beam sputtering techniques that are performed in a vacuum chamber.

The finished diffraction grating has certain unique properties. It has the durability property and substantially optically clear color property that are described elsewhere in this specification. It also preferably has a diffraction efficiency of greater than 70 percent for optical wavelengths in the 1280 to 1620 nanometer spectrum region that fiber-optic communication systems use. It also preferably has essentially equal diffraction efficiency values for S and P polarized optical components, that is, the S and P polarizations have diffraction efficiency values within about 5 percent of each other.

Figure 4:
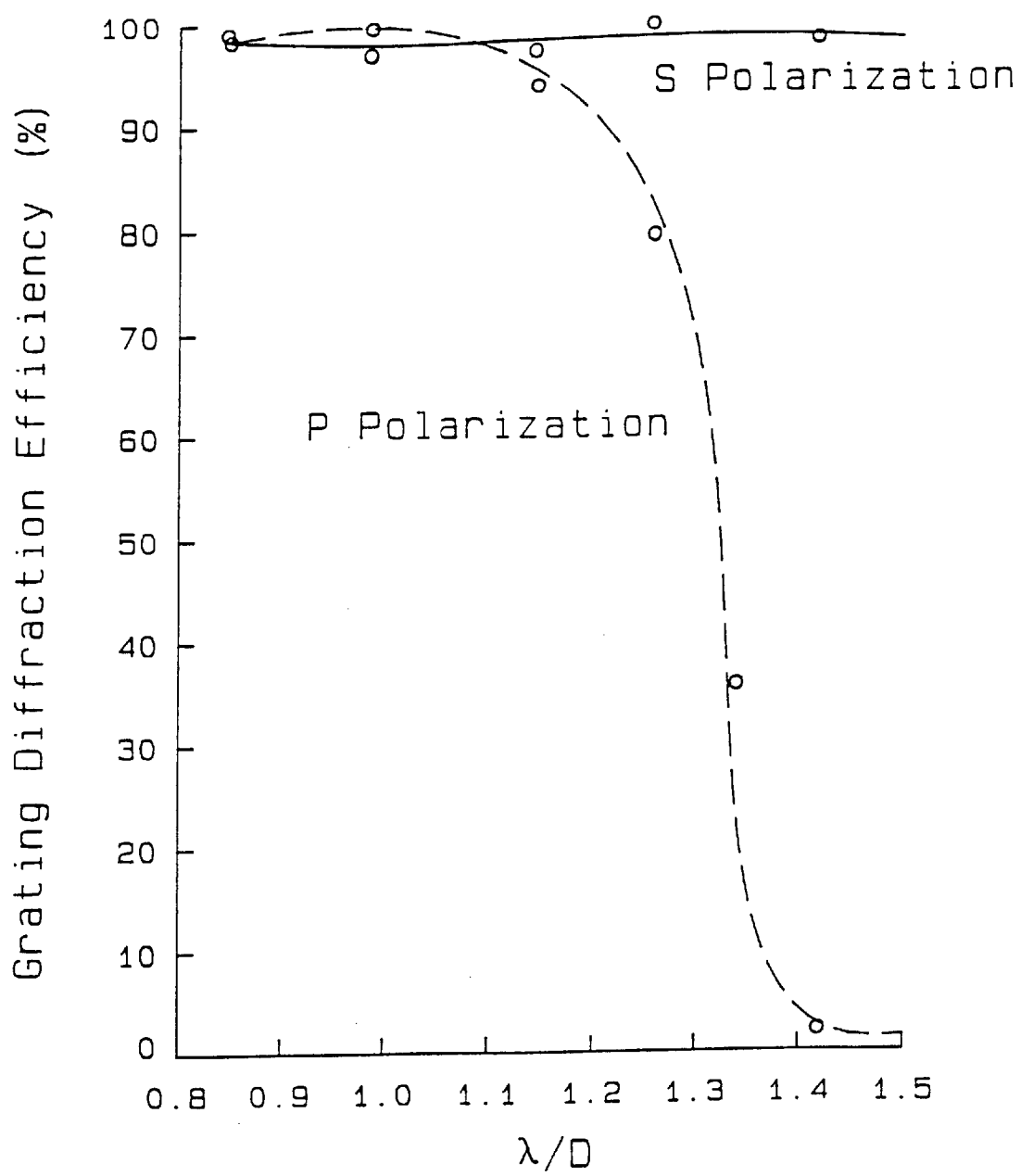
FIG. 4 is a graph illustrating the effect of varying the ratio of certain grating characteristics upon grating diffraction efficiency of the transmission grating element of FIG. 1.

FIG. 4 presents measured diffraction efficiency data for a sinusoidal surface-relief transmission grating formed in photoresist. This data is presented as a function of $\lambda/D$ which is the ratio of the optical wavelength, $\lambda$, of the beam incident on the grating to the grating line spacing D, and for the Littrow diffraction condition, that is $\theta_i=\theta_d$. The definition used to calculate the grating diffraction efficiency data values in FIG. 4, and used in this specification in reference to diffraction efficiency, is that the diffraction efficiency of a grating element is the ratio of the intensity of the first order diffracted beam divided by the intensity of the beam incident to the grating diffracting surface for either the S or P polarized optical component of the beam. This definition of diffraction efficiency does not account for optical insertion losses in the grating element due to reflection losses at the substrate non-grating surface or by optical absorption with the substrate material. These substrate related optical insertion losses can be minimized by using antireflection coatings on the non-grating substrate surfaces and/or by using substrate materials having low optical absorption for the wavelength spectrum used with the grating element. The measured data points are shown on the graph in FIG. 4 as open circles for both polarization components, while the drawn curves represent the best fix to this data. In this specification, when discussing the performance of a transmission diffraction grating, we will use the American polarization convention, that is, S polarized light has its electric field parallel to the grating lines while P polarized light has its electric field perpendicular to the grating lines. To achieve the high diffraction efficiency values presented in FIG. 4, the surface-relief transmission grating must have a deep groove profile shape, that is, the grating aspect ratio must be between about 1.3 and 2.0.

A more detailed discussion of the diffraction efficiency properties of a surface-relief transmission grating is presented at pages 179–182 of the Loewen text discussed elsewhere in this specification. As shown on these pages of this text, when the incident and diffracted optical beams to a surface-relief transmission grating have substantially equal angles with respect to the normal to the grating surface the S polarized optical component has a diffraction efficiency of at least 70 percent for $\lambda/D$ ratios of from about 0.8 to about 2.0 while the P polarized optical component has a diffraction efficiency of at least 70 percent for $\lambda/D$ ratios of from about 0.8 to about 1.2 and has a value that decreases from at least 70 percent when the $\lambda/D$ ratio is about 1.2 to a value of less than 10 percent when the $\lambda/D$ ratio is about 1.43 to about 2.0.

Examination of FIG. 4 reveals that essentially equal diffraction efficiency values for both S and P polarization optical components can be achieved with a transmission sinusoidal surface-relief grating having a $\lambda/D$ range of about 0.8 to approximately 1.2. Also, as the FIG. 4 data shows, surface-relief transmission gratings can achieve diffraction efficiency values of greater than 90 percent for both S and P polarizations for the 0.8 to 1.2 $\lambda/D$ ratio range and do not exhibit the anomalies in diffraction efficiency performance as a function of $\lambda/D$ ratio that are observed with reflecting surface-relief gratings. The high diffraction efficiency and lack of anomalies observed with surface-relief transmission gratings occur because they do not contain metal and, therefore, do not have in the visible or near infrared spectrum region complex absorption properties that are characteristic of metal coated surface-relief reflection gratings.

In one embodiment, it is preferred that grating 15 be operated so that the incident and diffracted beams have substantially equal angles with respect to the normal to the grating surface, that is, being within about 15 degrees of the Littrow diffraction condition.

In one embodiment, the diffraction grating 15 is operated so that the diffraction efficiency values for both the S and P polarized optical components are within 10 percent of each other, which corresponds to operating a surface-relief transmission grating with a $\lambda/D$ ratio of from about 0.8 to about 1.2.

Using a surface-relief transmission grating element at a $\lambda/D$ ratio value higher than about 1.2 results in the grating having different diffraction efficiency values for the S and P polarization components (see FIG. 4). Using diffraction grating-based devices that have different diffraction efficiency values for the S and P polarizations may significantly increase the polarization dependent noise level of fiber-optic communications systems incorporating the devices. In a grating-based device using a surface-relief transmission grating having a $\lambda/D$ value greater than about 1.2, this polarization dependent noise problem can be ameliorated by incorporating polarization controlling optical elements into the device so that the device achieves essentially equal radiometric throughput efficiency values for the S and P polarized optical components. Radiometric throughput efficiency for a component, device or a system is defined as the ratio of the intensity of the optical beam exiting the component, device or system divided by the intensity of the optical beam incident to the component, device, or system and is usually measured for each optical polarization component.

The polarization dependent noise level of a fiber-optic communication system is increased whenever a device having greater than about 5 percent difference between its radiometric throughput efficiency values for S and P polarized optical components is incorporated into the system. This increase in polarization dependent noise level occurs because the optical beams propagating in fiber-optic communication systems have no defined polarization direction and continually change polarization direction as a function of time.

Because the polarization dependent noise level of a device used in a fiber-optic communication system is determined by the difference between its radiometric throughput efficiency values for S and P polarized optical components, the preferred grating-based device embodiments in this specification are operated to have radiometric throughput efficiency values for S and P polarizations that are equal to within about 5 percent of each other. This is accomplished in some of the preferred grating-based device embodiments by using surface-relief diffraction grating elements that have essentially equal diffraction efficiency values for S and P optical polarizations. While not specifically stated for each of the preferred grating-based device embodiments in this specification, the other optical components used in these devices, such as fibers, lenses, mirror reflecting surfaces, non-grating transmitting surfaces, etc., incorporate thin film optical coatings that not only improve the radiometric efficiency performance of the component, and therefore the device, but also ensure that these components have radiometric throughput efficiency values for S and P optical polarization components that are equal to within about 5 percent of each other. If the grating element used in the device has a diffraction efficiency difference of up to about 10 percent between the S and P polarized optical components, its radiometric throughput inefficiency difference for S and P polarizations can be compensated for by incorporating optical components into the device that have the opposite radiometric throughput inefficiency difference with regard to the S and P polarization components. When the grating element used in the device has a difference of greater than about 15 percent between the S and P polarized optical components, the device incorporates polarization controlling optical elements that enable the device to achieve radiometric throughput efficiency values for S and P polarizations that are equal to within about 5 percent of each other.

To summarize the preceding statements, the preferred grating-based device embodiments in this specification are configured so that the optical components of the device function as an optically integrated assembly so that the device achieves radiometric throughput efficiency values for S and P polarized optical components that are equal to within about 5 percent of each other.

Figure 5:
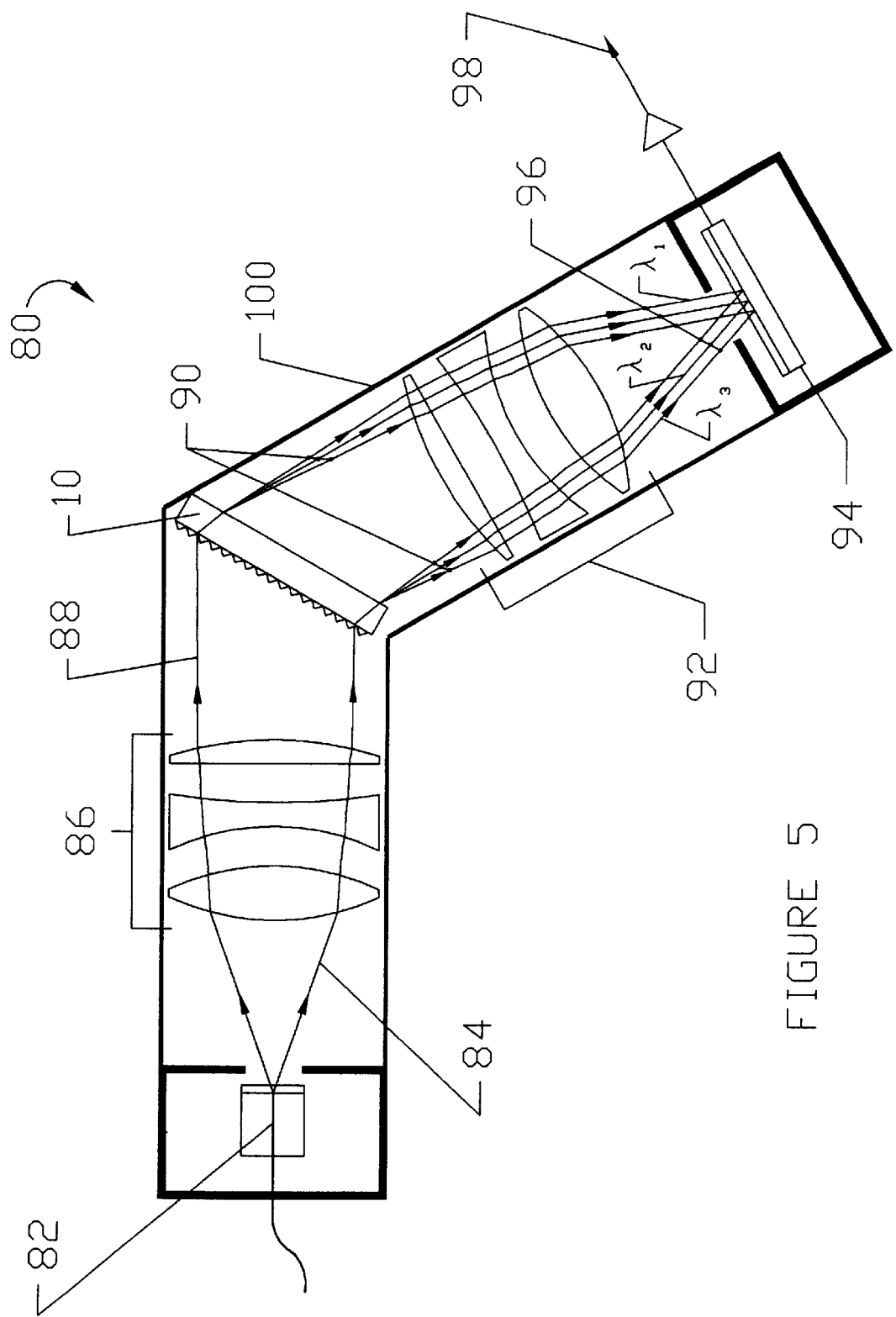
FIG. 5 is a schematic illustrating a spectrophotometer which utilizes the transmission grating element of FIG. 1.

FIG. 5 schematically illustrates a preferred embodiment in which the surface-relief transmission grating element 10 is incorporated into a spectrophotometer device 80 used as part of an on-line wavelength channel monitoring system capable of obtaining information about the optical power, wavelength and optical-signal-to-noise ratio of each wavelength signal channel in a wavelength-division multiplexing ("WDM") fiber-optic communication system.

As depicted in FIG. 5, input optical wavelength channel signal information is delivered to device 80 by transmission fiber 82. Input transmission fibers are well known to those skilled in the art and are disclosed, e.g., in U.S. Pat. Nos. 6,151,145, 5,798,855, 5,790,285, 5,745,613, 5,532,864, 5,452,124, 5,377,035, and the like. The entire disclosure of each of each of these United States patents is hereby incorporated by reference into this specification.

The input transmission fiber 82 to the spectrophotometer monitor device 80 contains $\lambda_1$, $\lambda_2$, and $\lambda_3$ wavelength channel signals which exit from the end of the fiber as a diverging optical ray bundle 84. The collimating lens assembly 86 receives the ray bundle 84 diverging from the end of the input fiber 82 and converts it into a collimated beam 88 which is incident on the transmission grating element 10. After being diffracted by element 10 the incident beam 88 is separated into $\lambda_1$, $\lambda_2$, and $\lambda_3$ wavelength channel beams 90 which propagate at slight angles with respect to each other in the plane which is perpendicular to the diffraction grating lines of element 10, which FIG. 5 resides in. The focusing lens assembly 92 receives the angularly separated collimated $\lambda_1$, $\lambda_2$, and $\lambda_3$ wavelength beams 90 from the grating element 10 and focuses these beams onto the surface of the photodetector linear array element 94.

The spatially separated focused wavelength channel beams 96 are incident on different photosensitive elements (not shown) in the photodetector array 94 and, thereby, generate an independent electrical signal 98 for each wavelength channel beam. The amplitude of each electrical signal 98 is proportional to the average light intensity of the wavelength channel beam incident on the photodetector element generating that signal. While only three wavelength channel beams are shown being used with the monitoring device 80 of FIG. 5, it is evident that device 80 can be used with many more wavelength channel beams. An InGaAs (indium gallium arsenide) photodetector array will normally be incorporated into wavelength monitoring devices used for communication systems operating in the 1280 to 1620 nanometers spectrum region. Commercial InGaAs photodetector arrays are available with 128, 256, and 512 photodetector elements having either 25 or 50 micron spacing between element centers. InGaAs photodetector fibers are well known to those skilled in the art and are disclosed, e.g., in U.S. Pat. Nos. 5,838,470, 5,714,773, 5,428,635, 5,386,128, 5,055,894, 4,879,250, and the like. The entire disclosure of each of these United States patents is hereby incorporated by reference into this specification.

In the device 80 of FIG. 5 the optical components are enclosed within a housing 100, which protects the optical components from contaminants. It is preferred that the housing 100 be comprised of components which do not adversely affect the performance of the optical components over the 70 degree operating temperature range specified for fiber-optic devices.

The spatial separation between the focused wavelength channel beams 96 at the surface of the photodetector array 94 of device 80 is proportional to the diffracted angular separation between wavelength channel beams 90. The angle through which each wavelength beam is diffracted by the grating element 10 can be calculated using the grating equation:

$$\sin\theta_i + \sin\theta_d = \frac{m\lambda}{D}, \quad (1)$$

where $\theta_i$ and $\theta_d$ are, respectively, the angles that the incident and diffracted beams make with respect to the grating surface normal, $\lambda$ is the optical wavelength of the incident and diffracted beam, D is the grating line groove spacing, and m is the diffraction order (or spectral order) which is an integer (m=0,±1,±2 . . . ). For the devices shown in this specification it will be assumed that we are using the first diffracted order beams, that is, m=1. The diffracted angular separation, $d\theta_d$, between the wavelength beams 90 is calculated by differentiating Equation (1) with respect to $d\lambda$, which gives:

$$d\theta_d = \frac{d\lambda}{D\cos\theta_d} = \frac{\lambda}{D\cos\theta_d}\frac{d\lambda}{\lambda}. \quad (2)$$

I have separated out the $\lambda/D\cos\theta_d$ and the $d\lambda/\lambda$ ratio terms in Equation (2) to emphasize that the first ratio is a measure of the wavelength dispersion power of the diffraction grating element 10 while the second ratio indicates the wavelength resolving power required of the element 10. The spatial separation, W, between the focused wavelength channel beams 96 at the surface of the photodetector array 94 of device 80 is given by:

$$W = f\tan(d\theta_d) = \frac{fd\lambda}{D\cos\theta_d} = \frac{f\lambda}{D\cos\theta_d}\frac{d\lambda}{\lambda}, \quad (3)$$

where f is the focal length of the focusing lens assembly 92 used in device 80. For devices of interest, $\tan(d\theta_d)$ is accurately approximated by using the first term in its Taylor series, as indicated in Equation (3).

Examination of Equation (3) reveals that as the spacing between wavelength channels, $d\lambda$, decreases in a WDM fiber-optic system, from 3.2 to 1.6 to 0.8 to 0.4 nanometers, corresponding to a frequency decrease in channel spacing of from 400 to 200 to 100 to 50 GigaHertz, the spatial separation between the wavelength beams 96 at the surface of the photodetector array 94 proportionally decrease. Because the spacing between the photosensitive elements of the photodetector array 94 are essentially fixed at 25 or 50 micrometers, the focal length of the collimating/focusing lens assembly 92 must be increased, and/or the grating element 10 must incorporate a finer grating line spacing (higher $\lambda/D$ ratio) to accommodate the decreases that are occurring in the wavelength spacing of WDM fiber-optic systems. Increasing the focal length of the focusing lens assembly 92 of the device 80 has a number of undesirable associated results. These undesirable results include: the scaling of lens aberrations with focal length, which increases the focused spot sizes of the wavelength beams 96 at the photodetector array 94; device performance stability becomes more sensitive with regard to both mechanical and thermal induced changes; and the size of the device increases, which is opposite to the trend for fiber-optic communication devices. Increasing the $\lambda/D$ ratio of the grating element 10 used in the device usually has the undesirable result of having the grating element 10 have significantly different diffraction efficiency values for the S and P polarized components of the optical beam, which significantly increases the polarization dependent noise level of fiber-optic systems incorporating such grating elements.

Therefore, it is desired to increase the dispersion of the grating element 10 used in the device 80 while still achieving essentially equal diffraction efficiency values for the S and P polarization components of the optical beam. To this end, one can use a $\lambda/D$ ratio of about 1.2 and still achieve essentially equal diffraction efficiency values for the S and P polarized optical components and, according to Equation (3), one can increase the dispersion power of grating element 10 by increasing the diffraction angle $\theta_d$ used in the device.

The required focal length of the focusing lens assembly 92 used in the FIG. 5 monitor device 80 can be calculated with Equation (3). For example, if it is assumed that the spatially separated focused wavelength channel beams 96 in device 80 are incident on adjacent photosensitive elements in the photodetector array 94 and that these elements have a 50 micron spacing between element centers, that the device 80 incorporates a surface-relief transmission grating element 10 having a $\lambda/D$ ratio of 1.0 for an optical wavelength of 1550 nanometers, and that $\theta_i=\theta_d=30$ degrees for a wavelength of 1550 nanometers, then the focusing lens assembly 92 used in device 80 must have a focal length of 83.9 millimeters when used with a WDM fiber-optic system having 0.8 nanometers (100 GigaHertz) spacing between wavelength channels. One could reduce the focal length for this WDM system requirement down to approximately 60 millimeters by using a surface-relief transmission grating element 10 having a $\lambda/D$ ratio of 1.15 that operated with $\theta_i=26.3°$ and $\theta_d=45°$. The focal length of the focusing lens assemblies used in spectrophotometer units used to monitor the performance of WDM fiber-optic systems having 40 or more channels cannot be made much shorter than 60 millimeters, since the lens assemblies must provide good imaging performance across a photodetector array surface area that is 2 millimeters or more in length.

Figure 6:
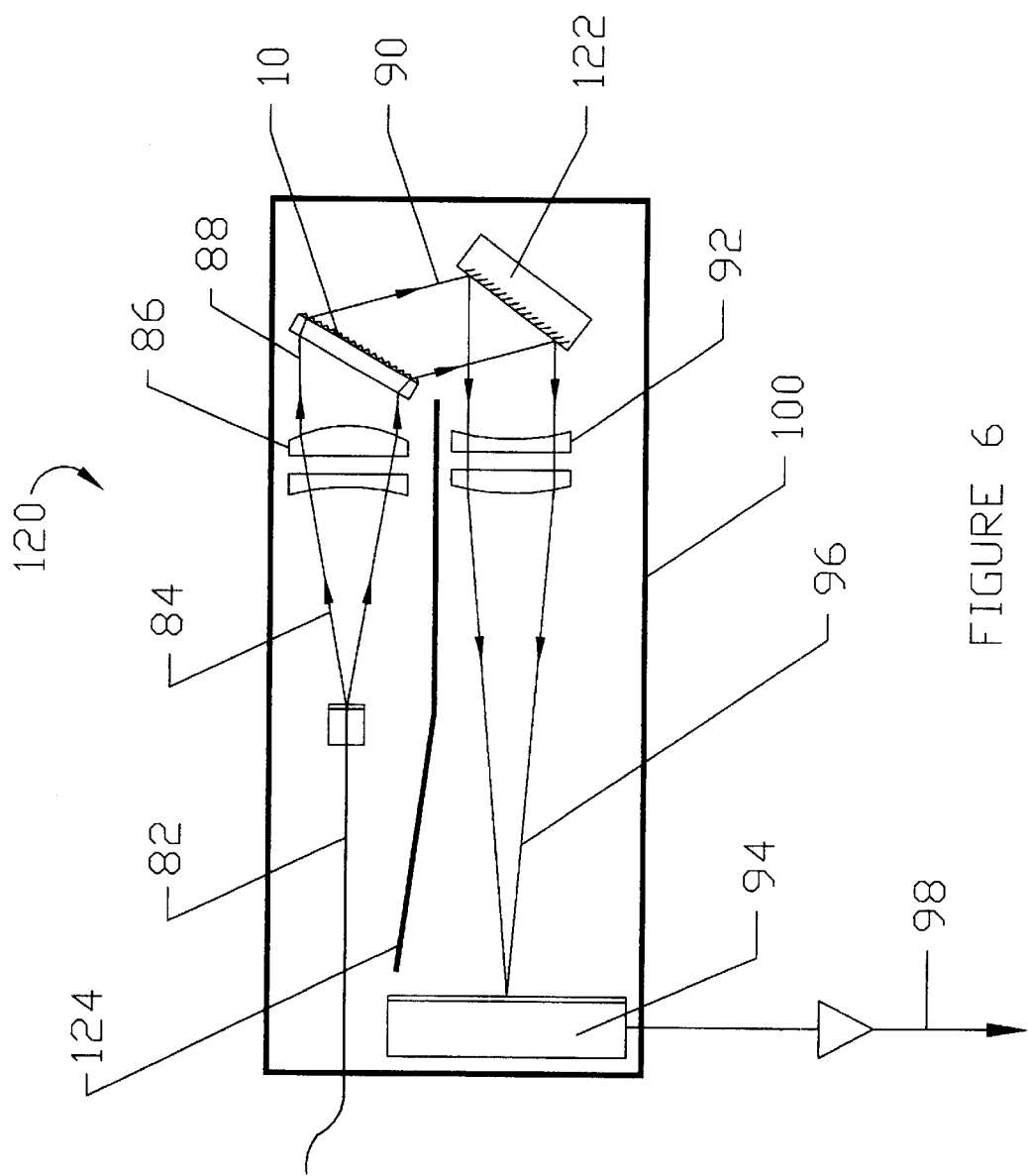
FIG. 6 is a schematic of a spectrophotometer which utilizes the transmission grating element of FIG. 1.

One may physically shorten the FIG. 5 monitoring device 80 by positioning a beam fold mirror element after the transmission grating element 10 in device 80 such that the mirror reflects the diffracted beams essentially parallel to the input beam path 88, as depicted in FIG. 6. The wavelength channel monitoring device 120 in FIG. 6 functions exactly as described for the monitoring device 80 in FIG. 5. In addition to incorporating beam fold mirror element 122, the device 120 has been modified relative to the device 80 in FIG. 5 in several ways. Only a single wavelength beam 90 is depicted in device 120. The focal length of the focusing lens assembly 92 in device 120 is significantly longer than the focal length for the collimating lens assembly 86 used in this device. The collimating and focusing lens assemblies in device 120 are depicted as air spaced doublets vs. the air spaced triplet lens assemblies depicted in device 80 of FIG. 5. The transmission grating element 10 in device 120 is depicted as functioning with $\theta_i=28$ degrees and $\theta_d=45$ degrees, while the transmission grating element 10 in device 80 of FIG. 5 is depicted as functioning with $\theta_i=\theta_d=30$ degrees. Device 120 incorporates an internal light baffle element 124 to shield the photodetector linear array element 94 from any back-scattered light originating in the input beam path prior to and including the grating element 10. The size of the photodetector linear array element 94 in FIG. 6 is depicted considerably larger than the corresponding element in FIG. 5 to more accurately reflect the dimensions of current commercially available InGaAs linear array elements.

Because the collimating and focusing lens functions in the FIGS. 5 and 6 wavelength monitoring devices are separate, one can optimize the lenses used for these imaging functions and thereby potentially improve upon the cost/performance ratio of the device. While the collimating and focusing lens assemblies in FIGS. 5 and 6 are depicted as composed of either three or two conventional singlet lens elements, one could use fewer conventional spherical lens elements, and/or lens elements having aspheric surfaces and/or gradient index based lens elements, such as a SELFOC lens (sold by NSG America, Inc. of Somerset, N.J.) for these lens assemblies. One could also use a combination of lens and mirror elements, or just mirror elements, to construct the collimating and focusing lens assemblies depicted in FIGS. 5 and 6. The collimating lens assemblies used in the FIGS. 5 and 6 devices can have a simpler lens assembly configuration than used for the focusing lens assemblies in these devices since the collimating lens function only on axis.

Appropriate lens assembly combinations will be apparent to those skilled in the art, as described in the following patents. Typical collimating lens assemblies are disclosed in U.S. Pat. Nos. 6,279,464, 6,169,630, 6,137,933, 6,028,706, 6,011,885, 6,011,884, 6,008,920, 4,852,079, 4,405,199, and the like. Focusing lens assemblies are disclosed, e.g., in U.S. Pat. Nos. 6,167,174, 6,097,860, 6,097,025, 6,094,261, 6,075,592, 5,999,672, 5,793,912, 5,450,510, 5,450,223, 5,440,669, 5,026,131, 4,479,697, and the like. The entire disclosure of each of these United States patents is hereby is incorporated by reference into this specification.

The focusing lens assembly 92 in device 120 of FIG. 6 is depicted as having a focal length that is in the range of 2 to 3 times longer than the focal length used for the collimating lens assembly 86 used in this device. This 2 to 3 difference in focal lengths between these lens assemblies can be used because the InGaAs photodetector linear arrays 94 used in the monitoring devices 80/120 have an element cell size in the range of 25 to 50 microns, while the input fibers 82 used in these devices have a core diameter in the range of 8 to 9 microns. Because of the 3 to 1 or greater ratio between input fiber core diameter and photosensitive element cell size for the FIGS. 5 and 6 monitoring devices, one can use a collimating lens assembly in these devices having a focal length which is only approximately one-third of the focal length used for the focusing lens assembly incorporated in these devices and thereby optimize the numerical aperture (NA) imaging performance for each lens assembly, which should improve the cost/performance ratio of the device.

While the inclusion of the beam fold mirror element 122 in device 120 of FIG. 6 reduces the physical size of the wavelength monitoring device relative to the embodiment illustrated in FIG. 5, it does not change the wavelength dispersion properties of the device relative to that achieved with the FIG. 5 device. The beam fold mirror element 122 can be configured so that it not only reduces the size of the device but also effectively doubles the wavelength dispersion power of the transmission grating element 10 used in the device.

Figure 7:
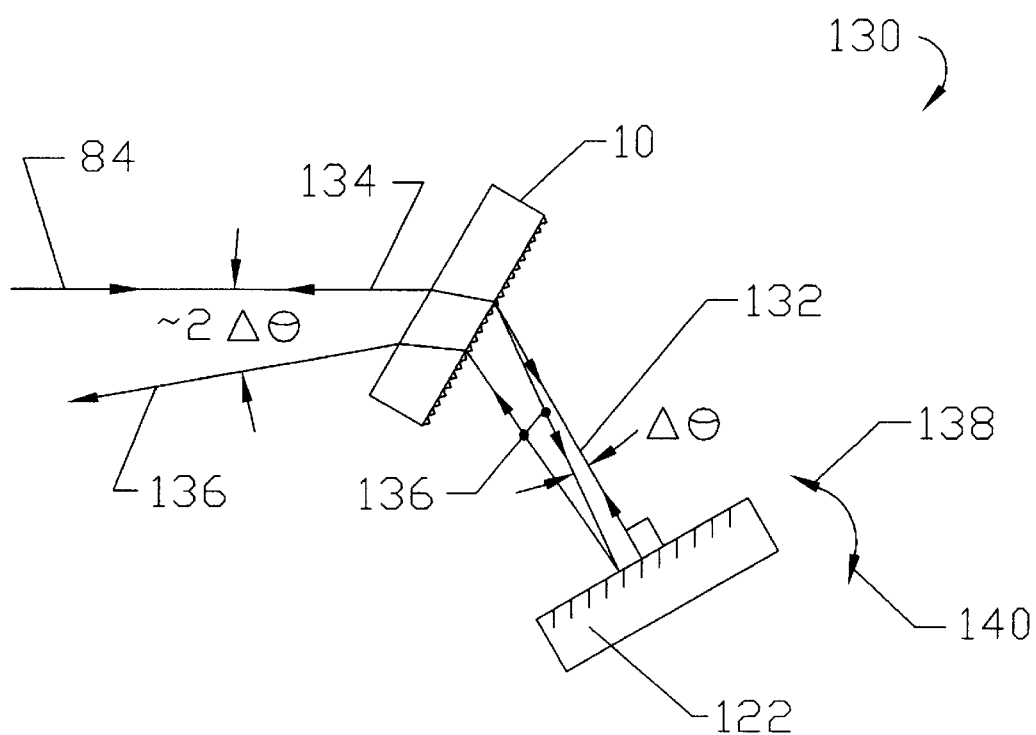
FIG. 7 is a schematic of a dual pass grating-based wavelength selection unit which utilizes the transmission grating element of FIG. 1.

FIG. 7 schematically illustrates how a beam fold mirror element 122 can be utilized so that the incident beam 84 makes a dual pass through the surface-relief transmission grating element 10 and thereby doubles the wavelength dispersion power of the grating element 10. The incident beam 84 to the transmission grating element 10 in device 130 of FIG. 7 contains $\lambda_1$ and $\lambda_2$ wavelength components. After the incident beam is diffracted by the grating element 10, these optical wavelength components are angularly separated by $\Delta\theta$. The mirror element 122 in device 130 is angularly orientated so that the $\lambda_1$ wavelength beam 132 is retroreflected back on itself. Because the grating element 10 functions in a reversible manner, the grating element 10 rediffracts the retroreflected $\lambda_1$ wavelength 132 beam back along the direction of the incident beam 84 as beam 134. The dual pass transmission grating arrangement of device 130 mimics a reflection grating element operating at the Littrow condition for the $\lambda_1$ wavelength beam, since this beam is retrodiffracted back on itself. After reflecting from the mirror element 122, the $\lambda_2$ wavelength beam 136 in device 130 propagates back to the grating element 10 where, due to its angle of incidence, the $\lambda_2$ wavelength beam 136 is rediffracted from the grating element 10 with an angle equal to approximately $2\Delta\theta$ relative to the propagating direction of the retrodiffracted $\lambda_1$ wavelength beam 134.

The angular separation, $d\theta_{dS}$, between beams 134 and 136 for the double pass grating arrangement in FIG. 7 is calculated by differentiating Equation (1) with respect to $d\theta_i$, which gives:

$$d\theta_{dS} = -[\cos\theta_i/\cos\theta_d]d\theta_i = 2[\cos\theta_i/\cos\theta_d]d\theta_d, \quad (4)$$

where for the grating/mirror arrangement in FIG. 7, $d\theta_i = -2d\theta_d$, since the angle between the $\lambda_2$ beam 136 incident on the mirror element 122 and the $\lambda_2$ beam 136 reflected from mirror element 122 is $2\Delta\theta$. Equation (2) is used to calculate the value for $d\theta_d$. For the dual pass grating arrangement depicted in FIG. 7, $\theta_i \approx \theta_d$ and, therefore, $d\theta_{dS} \approx 2d\theta_d = 2\Delta\theta$.

In effect, the grating element 10 and mirror element 122 combination in device 130 of FIG. 7 doubles the $\lambda/D$ value of the grating element 10. By using the grating/mirror combination in device 130, surface-relief transmission grating-based devices can be constructed with effective $\lambda/D$ grating values of 1.6 to 2.4 while achieving essentially equal diffraction efficiency values for S and P polarized optical components. The high wavelength dispersion power provided by these dual pass transmission grating-based devices provides significant advantages when these devices are used in WDM fiber-optic communication systems.

The grating/mirror combination in device 130 of FIG. 7 achieves the effective doubling of the $\lambda/D$ value of grating element 10 by cascading the grating dispersion power of grating element 10, similar to the narrowing of the spectrum band-pass width of an interference wavelength selection filter device by the cascading of filter elements. This cascading of the grating dispersion power does not effect the wavelength filter function of the grating-based devices incorporating this cascaded grating arrangement, since the wavelength filter function of these grating-based devices is determined by the physical dimensions of the output array structures used in those devices. The only significant negative associated with using this cascaded grating arrangement is a decrease in device throughput radiometric efficiency associated with the optical power loss due to the beam being diffracted twice by the grating element. It is estimated that greater than 80 percent radiometric throughput efficiency can be achieved for both S and P polarized beam components propagating twice through a surface-relief transmission grating element having a $\lambda/D$ ratio value in the range of 0.8 to 1.2 for optical wavelengths in the 1280 to 1620 nanometers spectrum range.

Referring again to FIG. 7, one can change the wavelength of the beam 134 retrodiffracted back on itself, and thus change the wavelength tuning parameters of the device 130, by rotating the mirror element 122 in the direction of arrow 138 and/or arrow 140 by conventional means. This wavelength tuning property is well known and is used in conventional double-pass mirror-reflection grating-based spectrophotometers, as discussed in an article by Ghislain Levesque in the June, 2000 issue of Photonics Spectra (see FIG. 5 on page 110).

Figure 8:
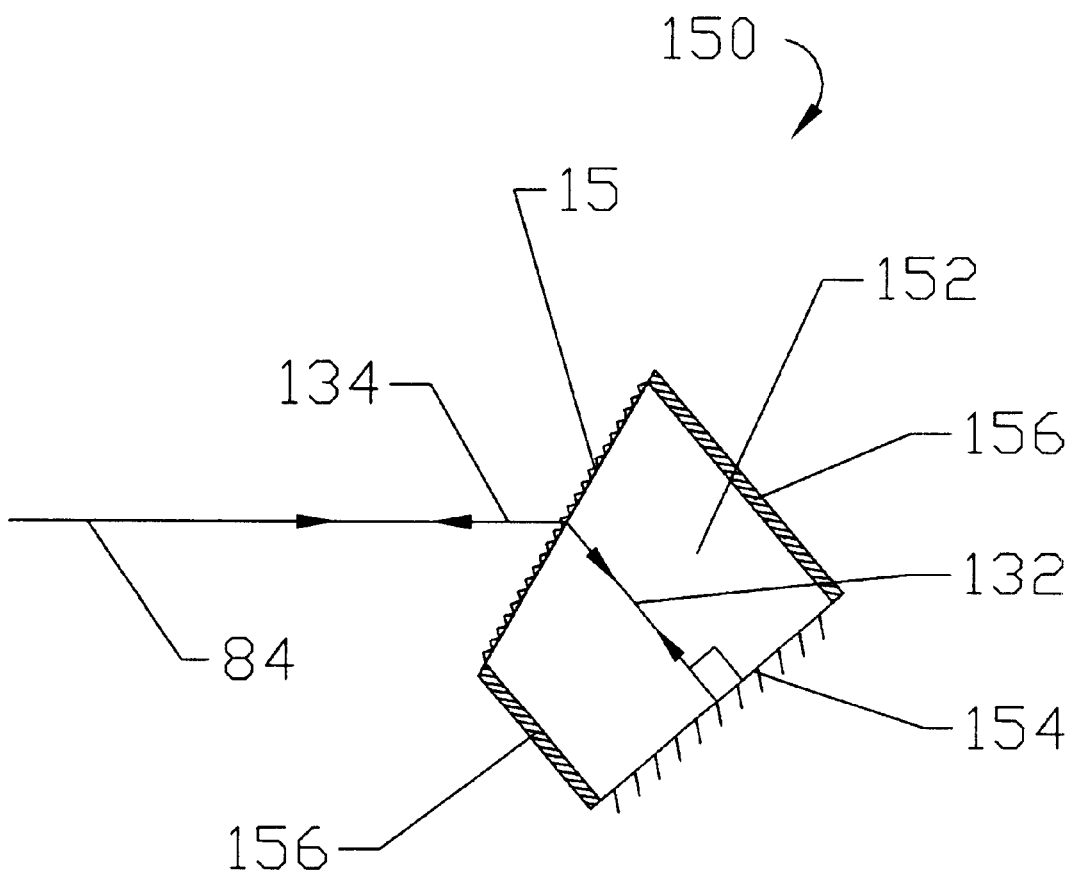
FIG. 8 is a schematic of another dual pass grating-based wavelength selection unit utilizing the transmission grating of FIG. 1.

The dual pass transmission grating arrangement in FIG. 7 is accomplished by using separately a grating element 10 and mirror element 122. By comparison, and as illustrated in FIG. 8, a dual pass transmission grating device 150 can be fabricated using a single transmission glass block element 152 that incorporates a surface-relief transmission grating 15 and a reflecting mirror surface 154. The device 150 functions as described for the device 130 in FIG. 7. As depicted in FIG. 8, a single wavelength beam 84 is incident on the dual pass grating device 150 at the Littrow diffraction condition for the dual pass arrangement depicted in device 150 and is retrodiffracted back along the incident beam path 84 as beam 134. As depicted in FIG. 8, the non-optical transmitting and reflecting surfaces of the glass block 152 have been coated with an optical absorption coating 156 that is designed to absorb the nondiffracted zeroth order beam energy and other scattered light which may occur within the glass block element 152. Optical absorption coatings are well known to those skilled in the art and are disclosed, e.g., in U.S. Pat. Nos. 6,075,635, 5,893,364, 5,633,494, and the like. The entire disclosure of each of these United States patents is hereby incorporated by reference into this specification.

FIG. 9 schematically illustrates how the dual pass transmission grating device 150 of FIG. 8 can be fabricated using a surface-relief transmission grating element 10 that is attached to the input optical transmitting surface of glass block element 152 incorporating reflecting mirror surface 154. The device 160 in FIG. 9 functions as described for the device 130 in FIG. 7. As depicted in FIG. 9 a single collimated wavelength beam 162 is incident on the dual pass grating device 160 at the Littrow diffraction condition for the dual pass arrangement depicted in device 160 and is retrodiffracted back along the incident beam path 162 as beam 166.

As depicted in FIG. 9, the device 160 is fabricated so that the grating surface 15 of the grating element 10 is encapsulated between the substrate 12 of grating element 10 and the input optical transmitting surface to the glass block element 152. A sealing element 168, such as epoxy, is used in device 160 to encapsulate the air gap layer 170 that exists between the surface-relief transmission grating surface 15 and the input optical transmitting surface of the glass block element 152. The main function of the sealing element 168 is to prevent contaminants, liquids or solvent vapors that could damage the grating surface from entering the air gap layer 170. The encapsulated grating surface configuration of device 160 also protects the grating surface from being damaged due to handling and cleaning of the grating element. The input optical transmitting surfaces of both the grating substrate 12 and the glass block 152 are antireflection coated to minimize optical reflection losses at these surfaces. As depicted in FIG. 9, the non-optical transmitting and reflecting surfaces of the glass block 152 have been coated with an optical absorption coating 156 that is designed to absorb the nondiffracted zeroth order beam energy and other scattered light which may occur within the glass block element 152. It is evident that the glass block elements depicted in FIGS. 8 and 9 can be made longer or shorter than what is depicted in these figures.

As is illustrated by the Examples set forth in this specification, devices made in accordance with FIG. 9 will pass the Bellcore high humidity/high temperature tests only if certain specified adhesives are used.

Figure 10A:
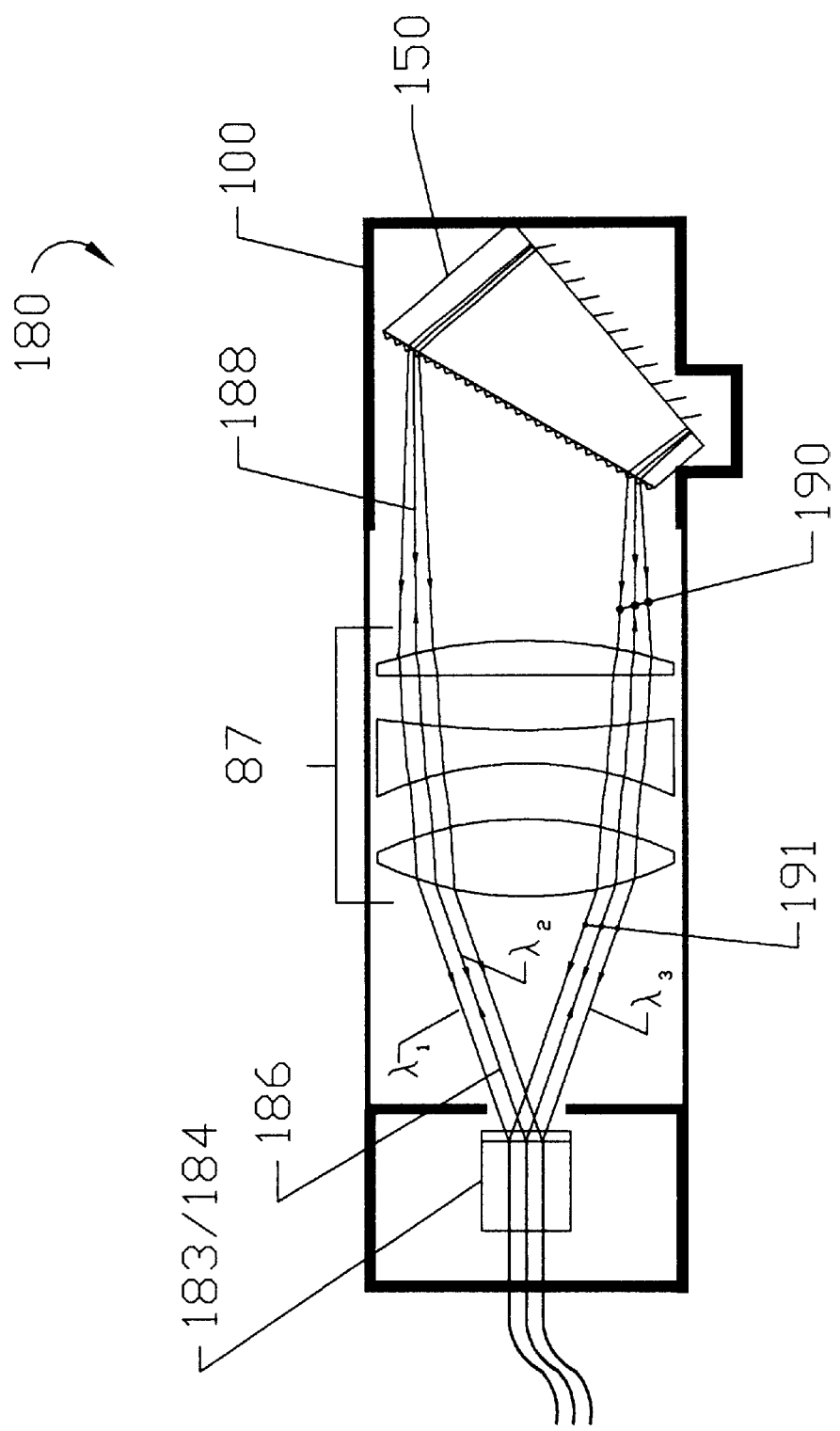
FIGS. 10A and 10B are side and top views, respectively, of a transmission grating-based demultiplexer fiber-optic unit.
Figure 10B:
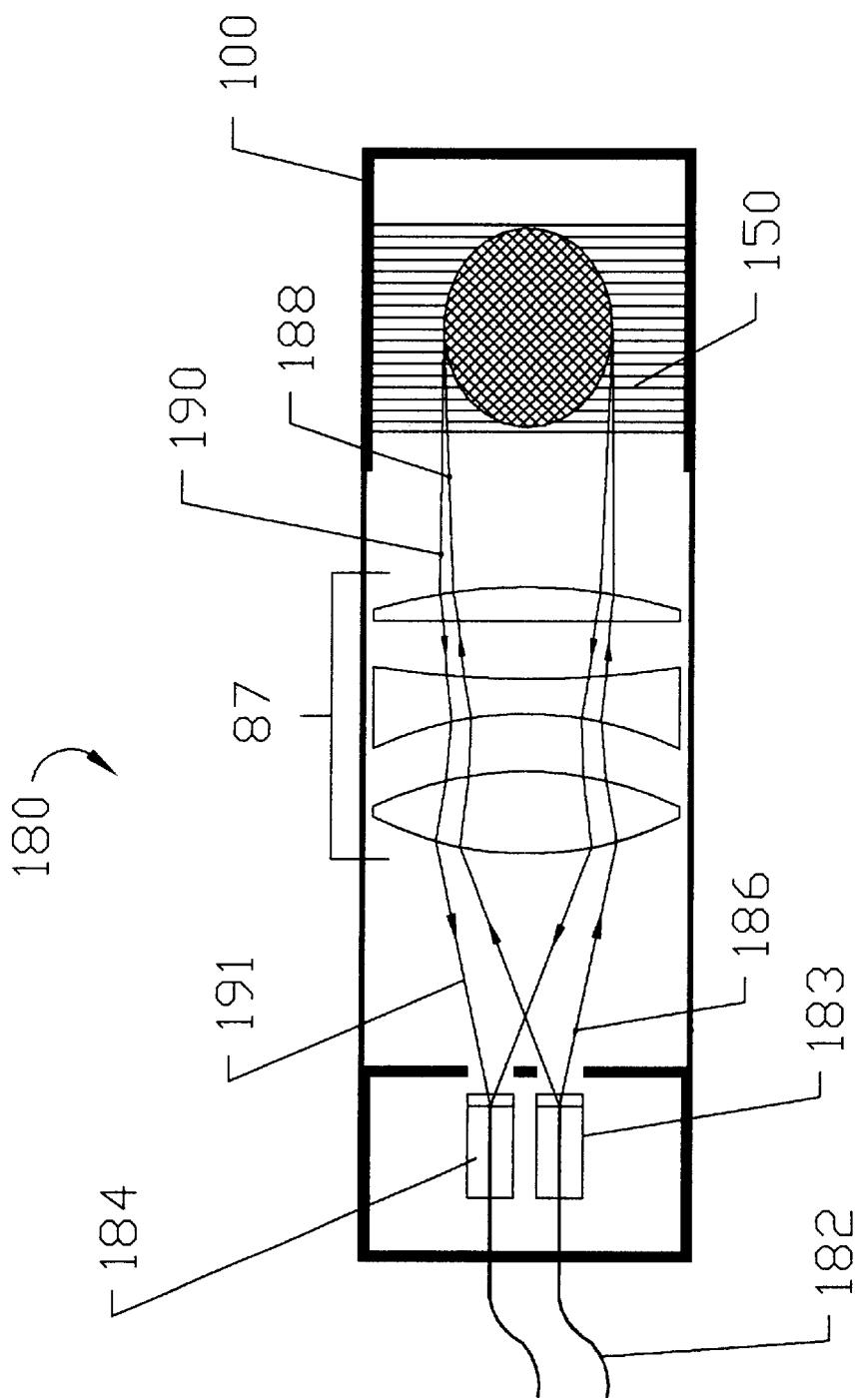
Figure 10C:
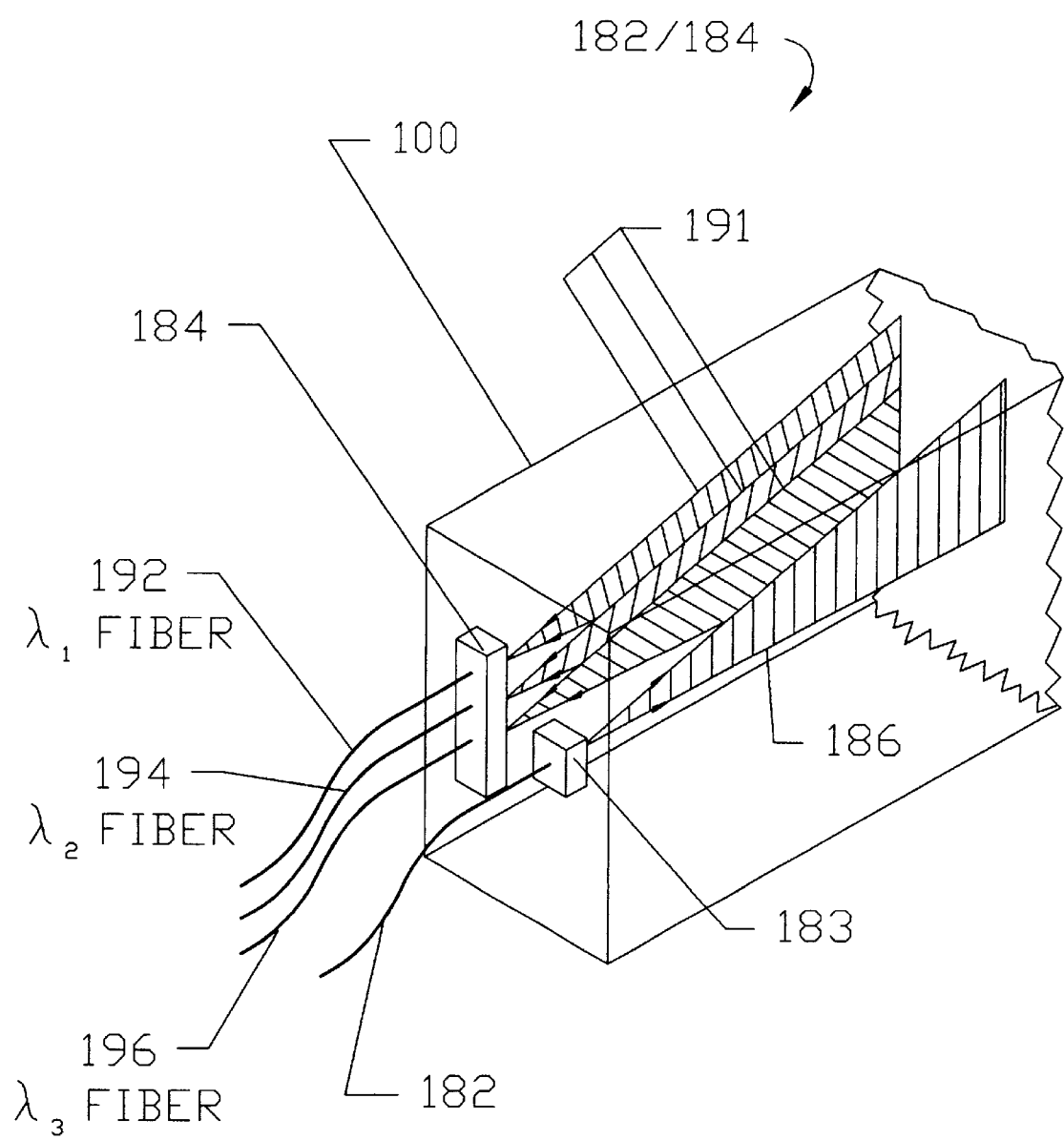
FIG. 10C is a schematic view of the fiber-optic input/output array used in the demultiplexer of FIGS. 10A and 10B.

Schematic top, side and isometric views in FIGS. 10A, 10B and 10C, respectively, illustrate how the dual pass grating element 150 of FIG. 8 can be incorporated into demultiplexer (Demux) device 180 used in fiber-optic WDM systems. The input transmission fiber 182 to the Demux device 180 contains $\lambda_1$, $\lambda_2$, and $\lambda_3$ wavelength channel signals which when exiting from the end of the fiber 182 form a diverging optical ray bundle 186 having a cone angle determined by the numerical aperture (NA) of the input fiber 182. The end of the fiber 182 is supported and positioned by holder 183 at the focal plane of the collimating/focusing lens assembly 87. The collimating/focusing lens assembly 87 receives the ray bundle 186 diverging from the end of the input fiber 182 and converts it into a collimated beam 188 which is incident on the dual pass grating element 150. As depicted in FIG. 10A, the incident beam after being diffracted by the dual pass grating element 150 is separated into $\lambda_1$, $\lambda_2$, and $\lambda_3$ beams 190 which propagate at slight angles with respect to each other in the plane perpendicular to the diffraction grating lines, which FIG. 10A resides in. In the plane parallel to the grating lines, which FIG. 10B resides in, the dual pass grating element 150 functions like a mirror in that the incident beam 188 and the different diffracted wavelength beams 190 have essentially the same angle with respect to the normal to the grating surface 15 in this plane.

As depicted in FIGS. 10A and 10B, the collimating/focusing lens assembly 87 receives the collimated diffracted $\lambda_1$, $\lambda_2$, and $\lambda_3$ wavelength beams 190 from the dual pass grating element 150 and focuses these beams onto the surface of the output fiber array 184. As indicated in FIG. 10A, and more clearly in FIG. 10C, the output fiber array 184 consists of individual fibers 192, 194, and 196 arranged in a row structure, the orientation of that row being parallel to the plane that is perpendicular to the grating lines. In the plane of the row the fibers are essentially evenly spaced by a distance W that is equal to the product of the focal length of the collimating/focusing lens assembly 87 and the diffracted angular separation between wavelength beams 190, as calculated using Equation (3). It should be noted that, when using Equation (3) to calculate the W value for the dual pass diffraction grating-based device illustrated in FIGS. 10A, 10B, and 10C, one must account for the dual pass nature of the device, that is, one must use $d\theta_{dS}$ in place of $d\theta_d$ in Equation (3). The output fiber array 184 is spatially positioned so that each of the spatially separated focused wavelength channel beams 191 is incident on its corresponding output fiber in the array 184. Essentially all of the light incident on the core are of an output fiber in the array 184 is coupled into the fiber and transmitted to a separate photodetector device (not shown) that provides an electrical data signal corresponding to the information transmitted on that wavelength channel.

In the preferred embodiment depicted in FIGS. 10A, 10B and 10C, the optical components are enclosed within a housing 100, which protects the optical components from contaminants. It is preferred that the housing 100 be comprised of components which do not adversely affect the performance of the optical components over the 70 degree operating temperature range specified for fiber-optic devices.

The Demux device depicted in FIGS. 10A, 10B and 10C functions in a reversible manner, that is, the device can be used to optically combine different wavelength channels onto a single output fiber, thereby functioning as a multiplexer (Mux) device. While the preceding discussion of the Mux/Demux operating principles of the grating-based device illustrated in FIGS. 10A, 10B, and 10C is limited to three wavelength channels, it is evident that this device can be used with many more wavelength channels. The only component in the device that need be changed when the number of wavelength channels is changed is the number of fibers contained in the fiber-optic array holder 184. The grating-based device illustrated in FIGS. 10A, 10D and 10C can be used to simultaneously Mux and Demux wavelength channels and thereby be used to construct a bi-directional fiber-optic network system which provides dramatic cost savings in local and metro area networks not incorporating in-line optical amplifiers. One method for achieving this bidirectional operation is by having adjacent wavelength channels be transmitted in opposite directions. This adjacent counter-propagating wavelength channel arrangement minimizes cross-take between both co-propagating and counter-propagating wavelength channels and still enables the input/output fiber-optic array holder to be constructed with essentially equal spacing between fibers.

Figure 11A:
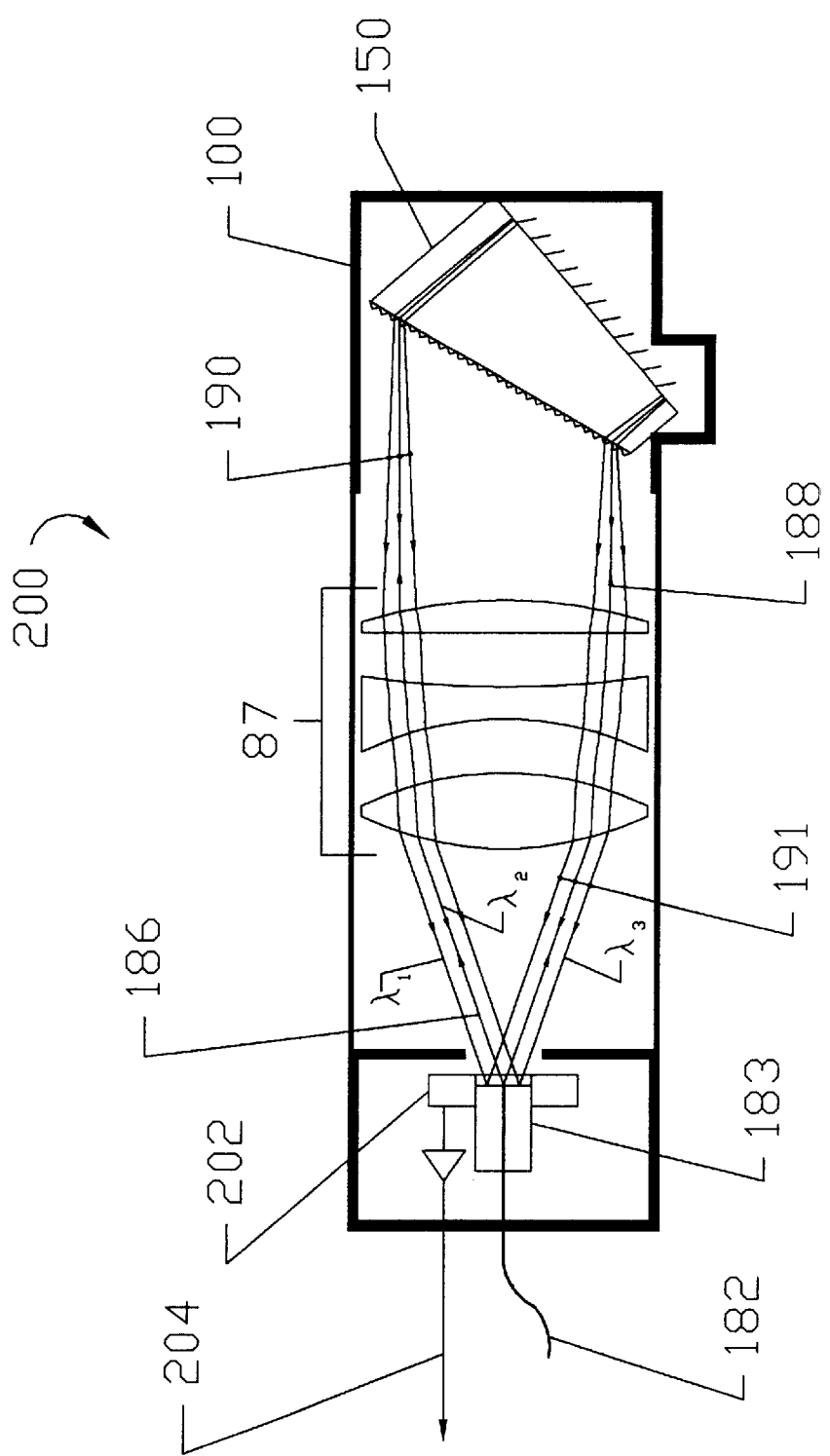
FIGS. 11A and 11B are side and top views, respectively, of a transmission grating-based fiber-optic spectrophotometer unit.
Figure 11B:
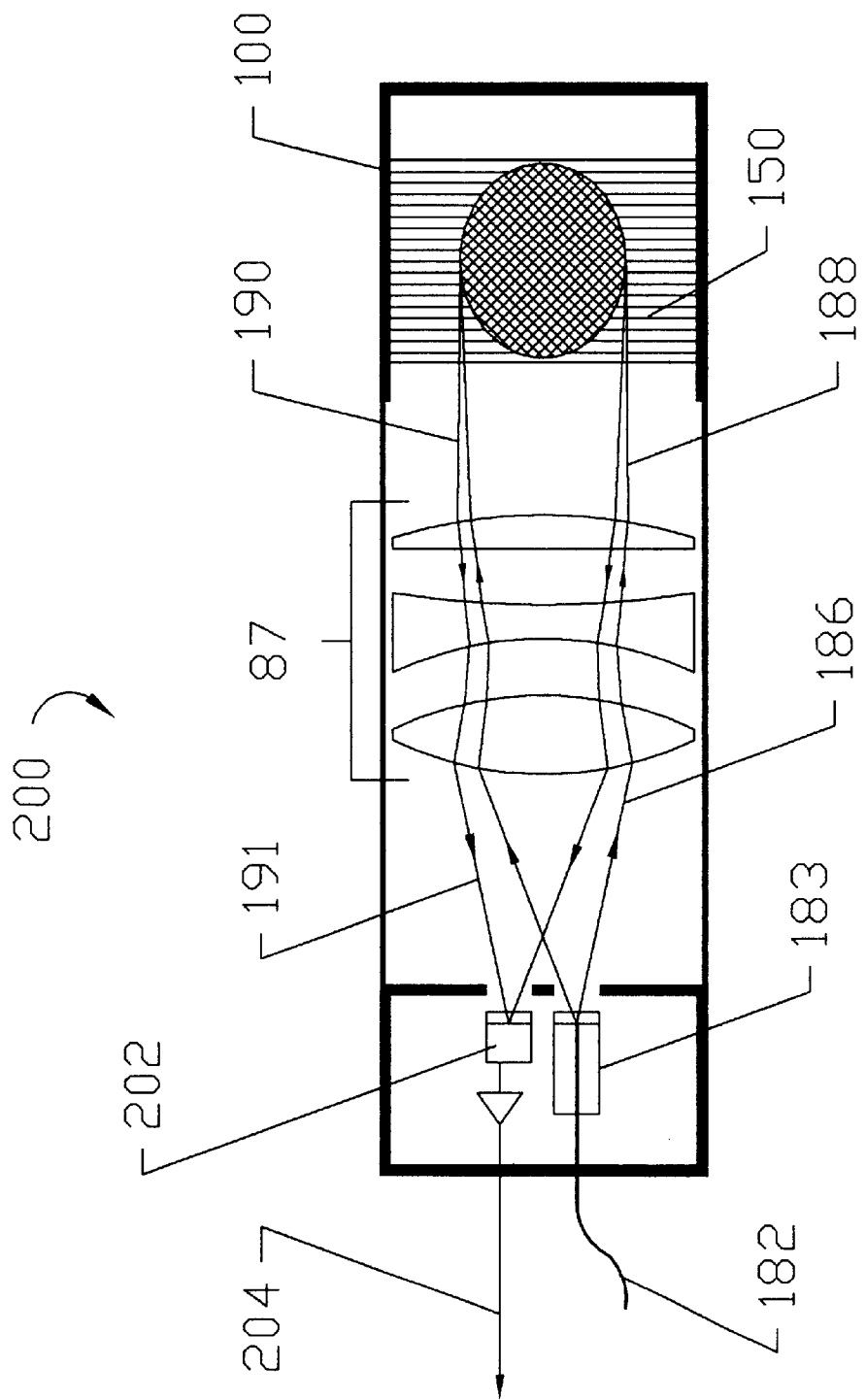
Figure 11C:
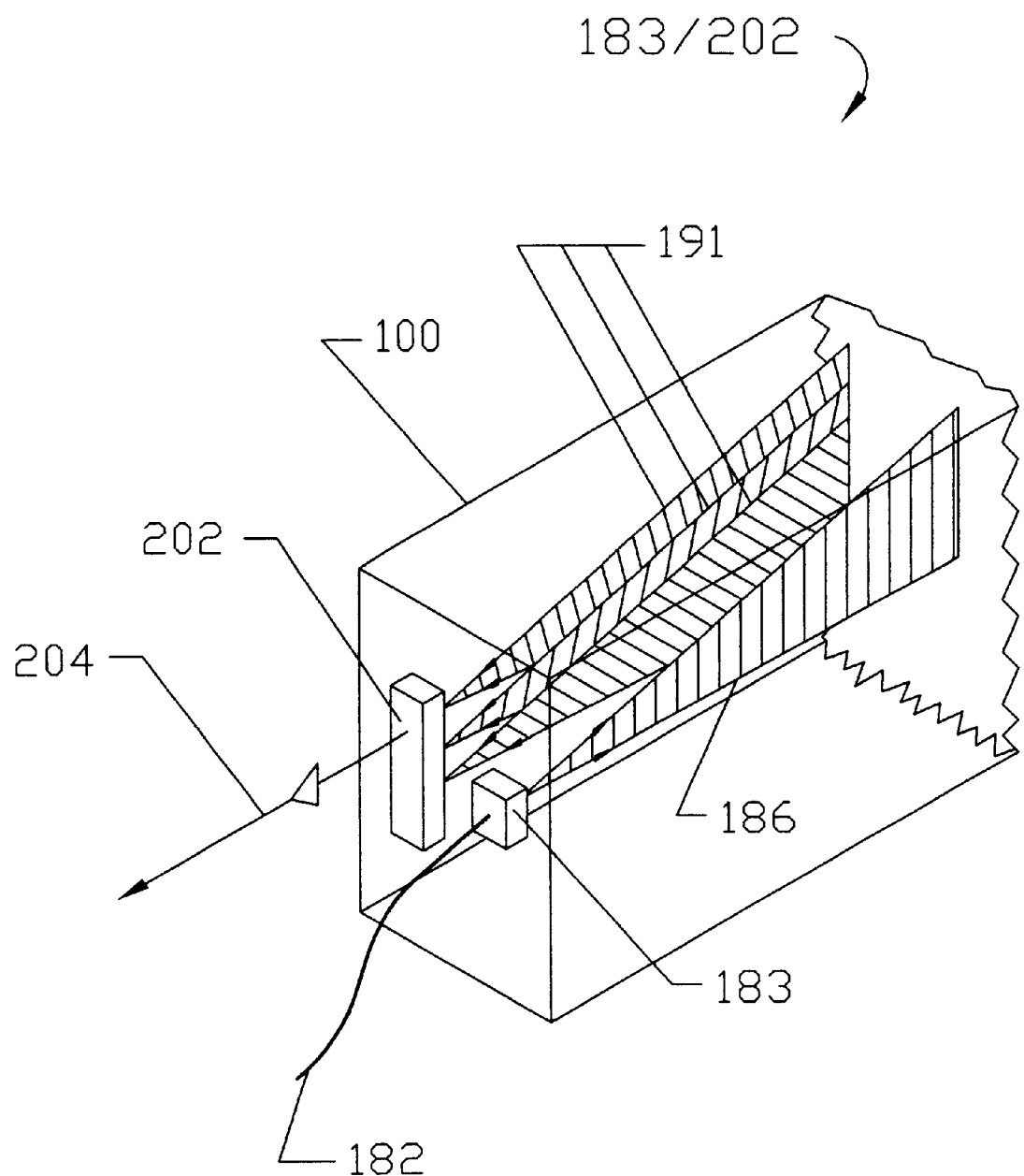
FIG. 11C is a schematic view of the fiber-optic input/output array used in the spectrophotometer of FIGS. 11A and 11B.

Schematic top, side and isometric views are, respectively, presented in FIGS. 11A, 11B and 11C of an on-line wavelength channel signal monitoring device 200 that utilizes dual pass grating element 150 of FIG. 8. Comparison of the device of FIGS. 10A, 10B and 10C with the device of FIGS. 11A, 11B and 11C reveals that the only significant difference between the Demux device 180 and the spectrophotometric monitoring device 200 is that the output fiber array 184 of the Demux device 180 is replaced in the monitoring device 200 by a photodetector linear array 202 that is positioned at the focal plane of the collimating/focusing lens assembly 87. The monitoring device 200 functions exactly as described for the Demux device 180 with the exception that in the monitoring device 200 the spatially separated focused wavelength channel beams 191 are incident on different photo-sensitive elements in the photodetector array 202 and, thereby, generate an independent electrical signal 204 for each wavelength channel. The amplitude of each electrical signal is proportional to the average light intensity of the wavelength channel beam incident on the photodetector element generating that signal. While only three wavelength channels are shown being used with the monitoring device

200 illustrated in FIGS. 11A, 11B and 11C, it is evident that this device can be used with many more wavelength channels. An InGaAs photodetector array will normally be incorporated into monitoring devices used for communication systems operating in the 1280 to 1620 nanometer spectrum region. Commercial InGaAs photodetector arrays are available with 128, 256, and 512 photodetector elements having either 25 or 50 micron spacing between element centers.

Comparison of the wavelength monitoring device depicted in FIGS. 11A, 11B, and 11C with the corresponding devices depicted in FIGS. 5 and 6 shows that, by using a dual pass transmission grating arrangement versus a single pass grating arrangement, one has spatially and functionally combined the collimating and focusing lens assemblies, significantly decreased the spatial separation between the input and output image planes of the device, and decreased the size of the device. It should be noted that current commercially available InGaAs photodetector arrays used in these devices have overall package sizes in the range of 63 millimeters by 25 millimeters, which is significantly larger than what is depicted in FIGS. 11A, 11B and 11C when compared to the other components depicted in these figures. Because of the relatively large size of current InGaAs photodetector arrays, there has to be a significantly greater distance between the array unit and input fiber element in FIG. 11B, which increases the requirements on the performance of the collimating/focusing lens assembly used in this device.

By separating the collimating and focusing lens functions in the FIGS. 5 and 6 monitoring devices, one can optimize the lenses used for these imaging functions and thereby potentially improve upon the cost/performance ratio of the device, as previously described.

Figure 12:
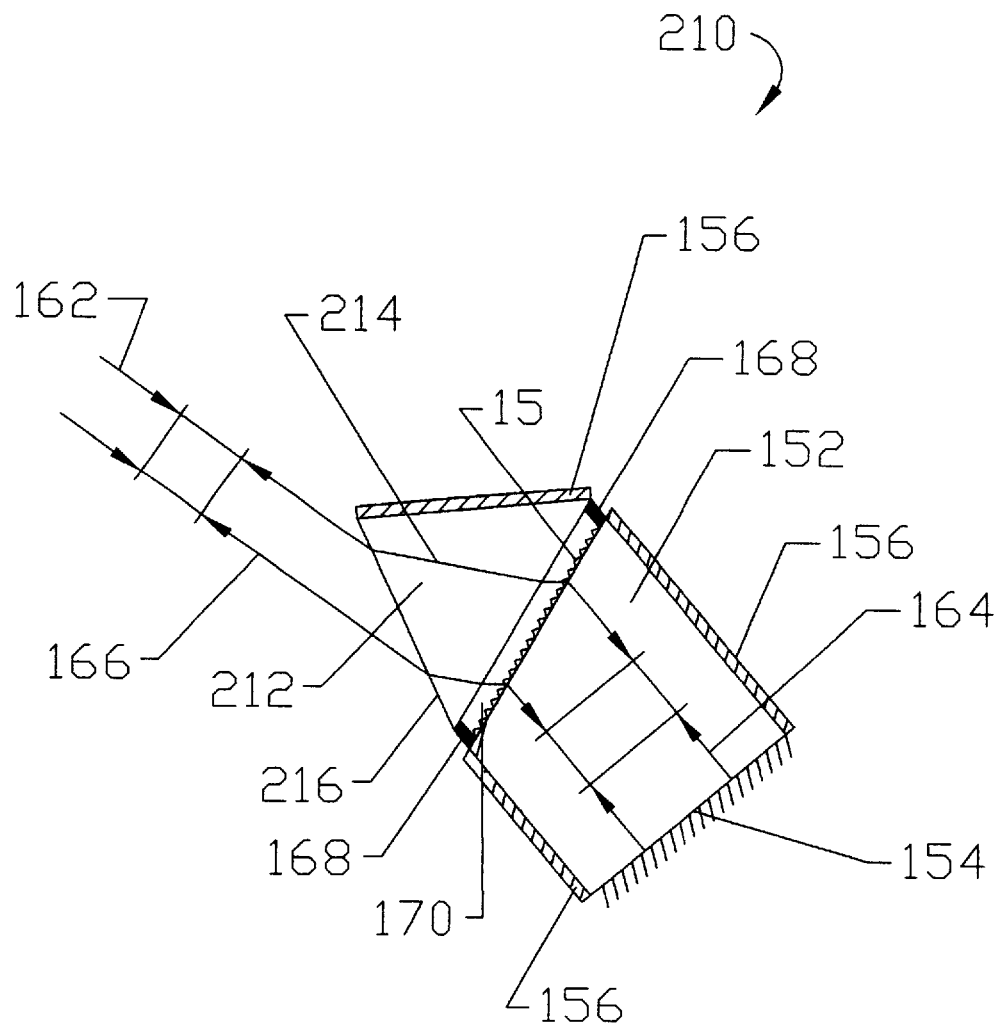
FIG. 12 is a schematic view of a dual pass grating-based wavelength section unit that utilizes the transmission grating of FIG. 1.

One can further increase the wavelength dispersion power of the dual pass grating arrangements of FIGS. 7, 8 and 9 by incorporating a beam expanding prism element into these devices as illustrated in FIG. 12. Comparison of FIG. 12 with FIG. 9 reveals that the devices in these figures are essentially the same except that the grating substrate 12 in device 160 of FIG. 9 is replaced in device 210 of FIG. 12 by the beam expanding prism element 212 and that the grating 15 is now deposited on the input optical transmitting surface of the glass block 152 in device 210. With regard to the dual pass grating diffraction properties, the device 210 functions as described for the devices illustrated in FIGS. 7, 8 and 9. As depicted in FIG. 12, a single collimated wavelength beam 162 is incident on the device 210 at the Littrow diffraction condition for the device 210 arrangement and is retrodiffracted back along the incident beam 162 as beam 166. Referring to FIG. 12, it will be seen that the prism element 212 expands the size of the incident beam 162 prior to that beam being incident on the grating surface 15 and since prism 212 functions in a reversible manner it reduces the size of the beam 214 rediffracted from grating 15.

The increase in the wavelength dispersion power of device 210, relative to that achieved with the devices of FIGS. 7, 8 and 9, is determined by how much the prism element 212 reduces the size of the beam 166 exiting from the prism 212 relative to the size of the beam 214 propagating within prism 212. It can be shown that the increased wavelength dispersion power, Q, provided by the prism element 212 of device 210 is given by:

$$Q = \cos\theta_1 / \cos\theta_2, \tag{5}$$

where $\theta_1$ and $\theta_2$ are, respectively, the angles that the beams 214 and 166 make with respect to the normal to the surface 216 of prism element 212. In the preferred 210 device embodiment, the Q value for the prism element 212 is in the range of about 1.3 to 2.0. The angular separation between the wavelength channel beams exiting the device 210 is given by the product $Q\, d\theta_{dS}$ where the value of $d\theta_{dS}$ is calculated using Equation (4).

With the device 210 of FIG. 12, one can achieve a wavelength dispersion power that is equal to an effective $\lambda/D$ ratio value in the range of about 2.0 to 4.8 and still achieve essentially equal diffraction efficiency values for S and P polarized optical components. One can achieve high radiometric throughput efficiency for the prism element 212 for both S and P optical polarization by applying antireflection coatings to the optical transmitting surfaces of the prism. As depicted in FIG. 12, the non-optical transmitting and reflecting surfaces of glass block 152 and prism element 212 have been coated with an optical absorption coating 156 that is designed to absorb the nondiffracted zeroth order beam energy and other scattered and reflected light which may occur within elements 152 and 212.

Associated with the beam size reducing property of prism element 122 of device 210 is the additional benefit with regard to linearizing the spacing of the spatially separated focused wavelength channel signal beams at either the photodetector array element in a wavelength monitoring device or at the output fiber-optic array in a Demux device. The wavelength channels of a WDM fiber-optic system are separated by a fixed frequency spacing, such as 200, 100 or 50 GigaHertz, but have a wavelength spacing between adjacent wavelength channels that varies slightly as a function of the frequency (wavelength) of the wavelength channel. For example, the wavelength spacing between adjacent wavelength channels of a WDM fiber-optic system having a 100 GigaHertz frequency spacing between channels is approximately 0.86, 0.80 and 0.78 nanometers, respectively, for wavelength channels having wavelengths in the range of 1611, 1552, and 1530 nanometers.

This slight variation in wavelength spacing between the adjacent wavelength channels in a WDM fiber-optic system produces a corresponding non-equal spacing variation in the spatial separation between the focused wavelength channel beams incident on the photodetector arrays in the wavelength monitoring devices depicted in FIGS. 5, 6, 11A, 111B and 11C and in the spatial separation between the focused wavelength channel beams incident on the fiber-optic output array in the Demux device depicted in FIGS. 10A, 10B and 10C. Another factor that contributes slightly to the non-equal spacing of the spatially separated focused wavelength channel beams in these wavelength selection devices is the $1/\cos\theta_d$ term in Equation (2), which is used for calculating the angular separation between the diffracted wavelength beams in these devices. The prism element 122 of device 210 can be designed so that it linearizes the diffracted angular spacing between the wavelength channel beams exiting from the prism element 122 and, thereby, enables Demux and wavelength monitoring devices that incorporate device 210 to utilize a linear spacing between adjacent channels in their output arrays.

Given its relatively high radiometric throughput efficiency, its high effective $\lambda/D$ value, and its linearizing properties, the device 210 of FIG. 12 provides significant advantages for use in WDM fiber-optic communication systems having 100, 50 or 25 GigaHertz spacing between wavelength channels. Beam expanding prism elements are used to increase the wavelength dispersion resolution of grating-based wavelength tunable dye laser systems, as shown in an article by F. J. Duarte, "Newton, Prisms, and the "Optics" of Tunable Lasers," Optics and Photonics News, May 2000.

Figure 13:
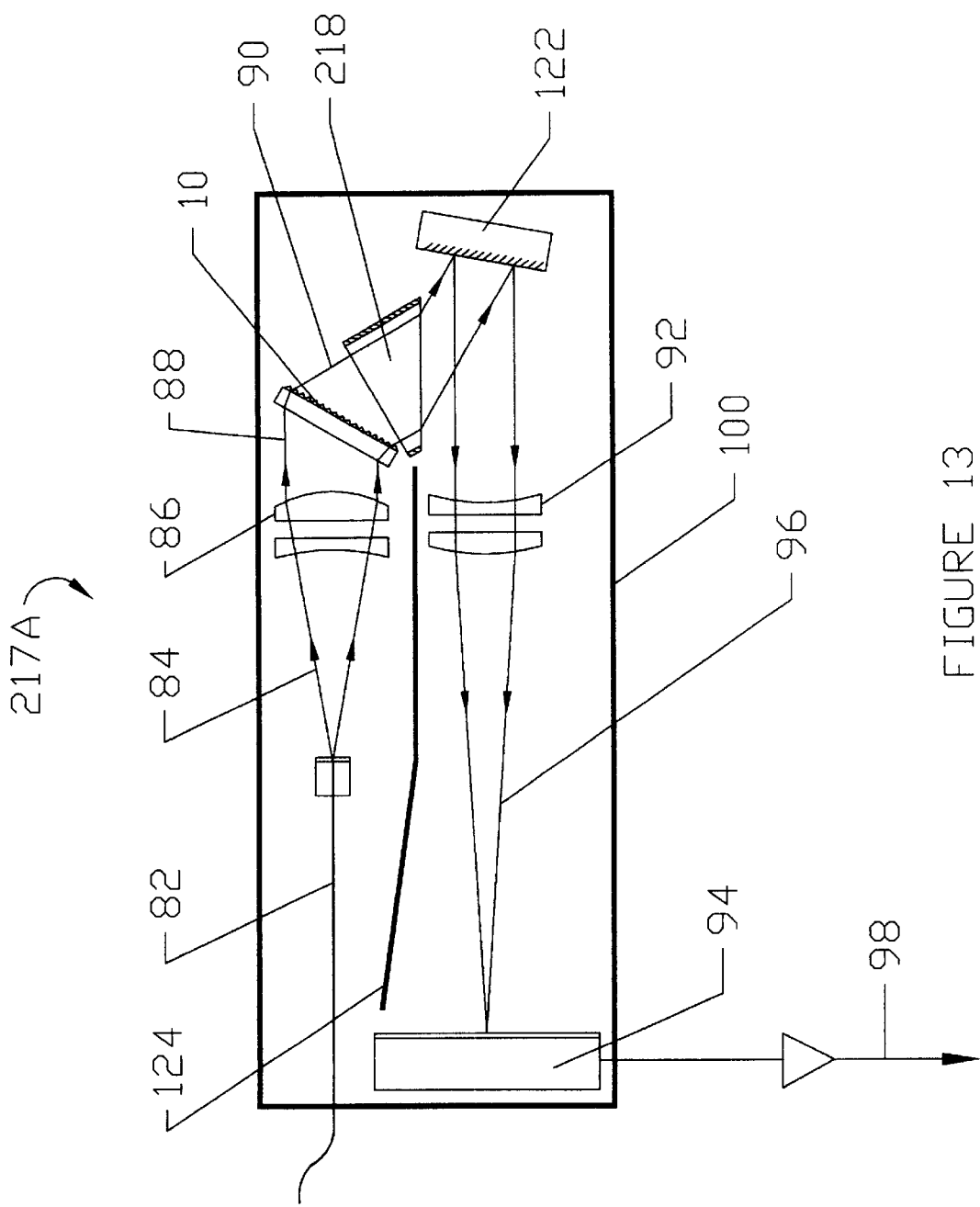
FIGS. 13 and 14 each present a schematic of a spectrophotometer which utilizes the transmission grating of FIG. 1.

Schematically illustrated in FIG. 13 is spectrophotometer device 217A that is essentially identical to the spectrophotometer device 120 of FIG. 6 with the expectation that the device 217A incorporates a linearizing prism element 218 that functions similar to the prism element 122 of device 210 in FIG. 12. The prism element 218 differs somewhat from the prism element 122 in that the angles of the prism have been changed so that the diffracted beam from grating element 10 is substantially perpendicular to the input surface of prism element 218. Due to this prism angle change, the prism element 218 is not attached to the grating element 10, as was the case for the prism element 212 of device 210. As depicted in FIG. 13, prism element 218 has the same beam size reducing property as described for prism element 212 of device 210 which increases the wavelength dispersion power of device 217A and provides the benefit with regard to linearizing the spacing of the spatially separated focused wavelength channel signal beams at the photodetector array 94 of device 217A. As also depicted in FIG. 13, the non-optical transmitting surfaces of prism element 218 have been coated with an optical absorption coating that is designed to absorb any non-diffracted zeroth order beam energy that might enter the prism and other scattered and reflected light which may occur within prism element 218.

As depicted in FIG. 13, the prism element 218 reduces the size of the beam exiting prism element 218 by about 1.65 times compared to the beam propagating within the prism element. The angular separation between the wavelength channel beams exiting prism element 218 is approximately 1.65 $d\theta_d$ where $d\theta_d$ is the diffracted angular separation between wavelength beams exiting the grating element 10 as calculated by Equation (2). Prism element 218 increases the wavelength dispersion power of device 217A by approximately 1.65 times that achieved by device 120 of FIG. 6. Therefore, device 217A can achieve the same spatial separation between focused wavelength channel beams at the photodetector array 94 that device 120 achieves, but can achieve this separation using a focusing lens assembly 92 that has a focal length that is approximately 1.65 times shorter than the corresponding focal length used in device 120.

As previously noted, prism element 218 provides additional benefit with regard to linearizing the spacing of the spatially separated focused wavelength channel beams at the photodetector array 94. Analysis has shown that when the spectrophotometer device 120 of FIG. 6 is used to monitor the signal of a WDM fiber-optic system having a 100 GigaHertz frequency spacing between wavelength channels, the spatial separations between the focused wavelength channel beams at the photodetector array 94 in device 120 are non-equally spaced and, therefore, do not match the 25 or 50 micron equally spaced intervals between the photosensitive elements of commercial available InGaAs photodetector linear arrays.

To illustrate the non-equal spacing error in the spatially separated focused wavelength channel beams in device 120, it is assumed that the spatial separated focused channel beams in device 120 are incident on adjacent photosensitive elements in the photodetector array 94 and that these elements have a 50 micron spacing between element centers, that the device 120 incorporates a surface-relief transmission grating element 10 having a $\lambda/D$ ratio of 1.0 for an optical wavelength of 1550 nanometers, that $\theta_i=\theta d=30$ degrees for a wavelength of 1550 nanometers and that the focusing lens assembly 92 in this device has a focal length of approximately 84 millimeters. When this device 120 configuration is used to monitor a WDM fiber-optic system beam having 100 different wavelength channel signals each spaced by 100 GigaHertz and having a wavelength spectrum from about 1530 to 1612 nanometers, calculations indicate that the non-equal spacing error between the adjacent focused wavelength channel beams at the photodetector array 94 accumulates and results in a total spacing error of approximately 49 microns between the shortest and longest focused wavelength channel signal beams. That is, if the photodetector array 94 in device 120 is positioned so that the shortest wavelength channel signal beam is incident on the center of the first photosensitive element of the photodetector array 94, the longest wavelength channel signal beam will land approximately 49 microns from the center of the hundredth photosensitive element of the photodetector array 94, with progressively shorter wavelength channel signal beams having progressively smaller positional errors with respect to the photosensitive element on which they are supposed to be incident on in the photodetector array 94. This 49-micron positional error is not acceptable.

Calculations show that when spectrophotometer device 217A of FIG. 13 is used to monitor a WDM fiber-optic system beam having 100 different wavelength channel signals each spaced by 100 GigaHertz and having a wavelength spectrum from about 1530 to 1612 nanometers, the spatially separated focused wavelength channel signal beams at the photodetector array 94 have substantially the same 50 micron spacing between all the wavelength channel signal beams, with about a total 1 micron spacing error between the shortest and longest wavelength channel signal beams, when the following configuration conditions are assumed for device 217A. Device 217A incorporates a surface-relief transmission grating having a $\lambda/D$ ratio of 1.0 with $\theta_i=\theta_d=30$ degrees for an optical wavelength of 1550 nanometers, the prism element 218 has an index of refraction of approximately 1.51 with $\theta_1$ being approximately 35 degrees and $\theta_2$ being approximately 60 degrees which corresponds to a beam size reduction by prism element 218 of approximately 1.65 times, and that the focusing lens assembly 92 has a focal length of approximately 50 millimeters. The maximum total error spacing of approximately 1 micron between the shortest and longest wavelength channel signal beams at the photodetector array 94 for this device configuration is very acceptable since each photosensitive element in a photodetector array having a 50 micron spacing between photosensitive elements has a photosensitive area width along the array equal to the element spacing of 50 microns and, therefore, a positionally error in the range of 1 to 2 microns still places the focused wavelength channel beam essentially in the middle of the photosensitive element.

Figure 14:
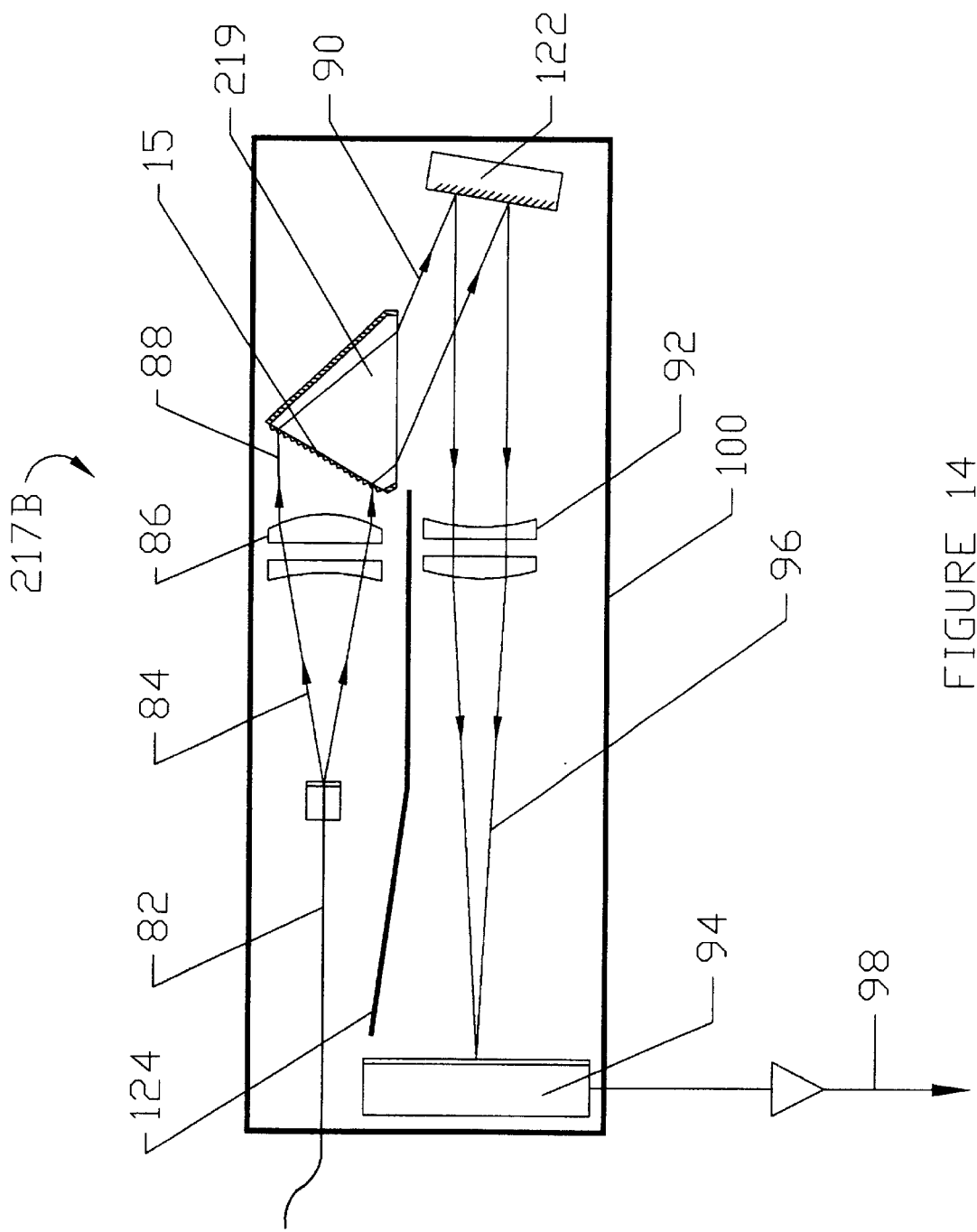

Schematically illustrated in FIG. 14 is spectrophotometer device 217B that is essentially identical to the spectrophotometer device 217A of FIG. 13 with the expectation that the linearizing prism element 219 of device 217B now incorporates the transmission surface-relief grating 15. The prism element 219 performs the same functions as the combination of the grating element 10 and prism element 218 of device 217A and, therefore, device 217B functions as described for device 217A.

While there are advantages associated with combining the functions of the grating element 10 and prism element 218 of device 217A into the single prism element 219 of device 217B, the prism element 219 does not provide as good results as the separate grating and prism elements provide with regard to passively athermalizing the performance of the spectrophotometer device so that it meets operating specifications when used over the 70 degree centigrade temperature range specified for fiber-optic telecommunication applications without the need for active control. The reason why the separate grating element 10 and the separate prism element 218 provide better results than the dual functioning prism element 219 with regard to athermalizing device performance is that the grating element achieves the best athermalization performance when fabricated using a substrate material having a low thermal expansion coefficient, such as fused silica or ULE glass, while the linearizing prism element achieves the best athermalization performance when fabricated using a glass material having a low thermal coefficient of refraction (dn/dT), such as BK7 and K5 glasses. Unfortunately, low thermal expansion glasses such as fused silica, ULE and Ohara Clearceram-Z have a thermal coefficient of refraction that is approximately 10 times larger than that achieved with K5 glass and about 5 times larger than that achieved with BK7 glass. Optical glasses such as BK7 and K5 have a thermal coefficient of thermal expansion that is approximately 10 times larger than that achieved with fused silica and about 50 to 100 times greater than that achieved with ULE or Ohara Clearceram-Z. Therefore, as the preceding discussion illustrates, better athermalization of device performance is achieved by using different glass materials for the grating and prism elements which dictates that they be fabricated as separate components to avoid thermal-induced stress associated with the optical bonding of materials having significantly different thermal expansion coefficients.

The doubling of the angular wavelength dispersion power of the transmission grating elements in FIGS. 7, 8, 9 and 12 was accomplished by reflecting the diffracted beam back through the grating element. One can achieve this doubling of grating dispersion power by cascading two separate transmission grating elements, that is, physically arranging two surface-relief transmission grating elements so that a beam diffracted by the first grating element undergoes diffraction by the second grating element. One could further increase the wavelength dispersion power of transmission grating-based devices by cascading multiple grating elements. For example, one could achieve effectively four times the wavelength dispersion power of a grating element by physically cascading four individual transmission grating elements or by reflecting the diffracted beam back through two cascaded transmission grating elements. The only significant negative associated with this multiple cascaded transmission grating technique is the radiometric efficiency loss associated with the multiple diffraction events. Surface-relief grating-based devices utilizing physically cascaded grating elements are illustrated in FIGS. 15 through 24.

It should be noted that one of the potential advantages of the physically cascaded grating arrangements in FIGS. 15 through 24 relative to the dual pass grating arrangements in FIGS. 7 through 12, is that different $\lambda/D$ ratio values can be used for the individual grating elements used in the physically cascaded grating arrangements in FIGS. 15 through 23. It should also be noted that the physically cascaded gratings in FIGS. 15 through 23 are arranged so that the wavelength dispersion power of the device incorporating the gratings is essentially equal to the sum of the wavelength dispersion power of the individual gratings used in the device. The gratings in these devices are arranged so that the beam diffracted from the first grating is incident on the second grating so that its angle of incidence is on the same relative side of the normal to the second grating surface that the incident beam makes relative to the normal of the first grating surface. That is, as illustrated in FIGS. 15 through 23, the beam is always incident on the right side of the normal to the grating surfaces as viewed in the beam propagating direction. The cascaded grating arrangements in FIGS. 15 through 23 are arranged so that the individual grating elements in these arrangements are operated relatively close to the Littrow direction condition.

Figure 15:
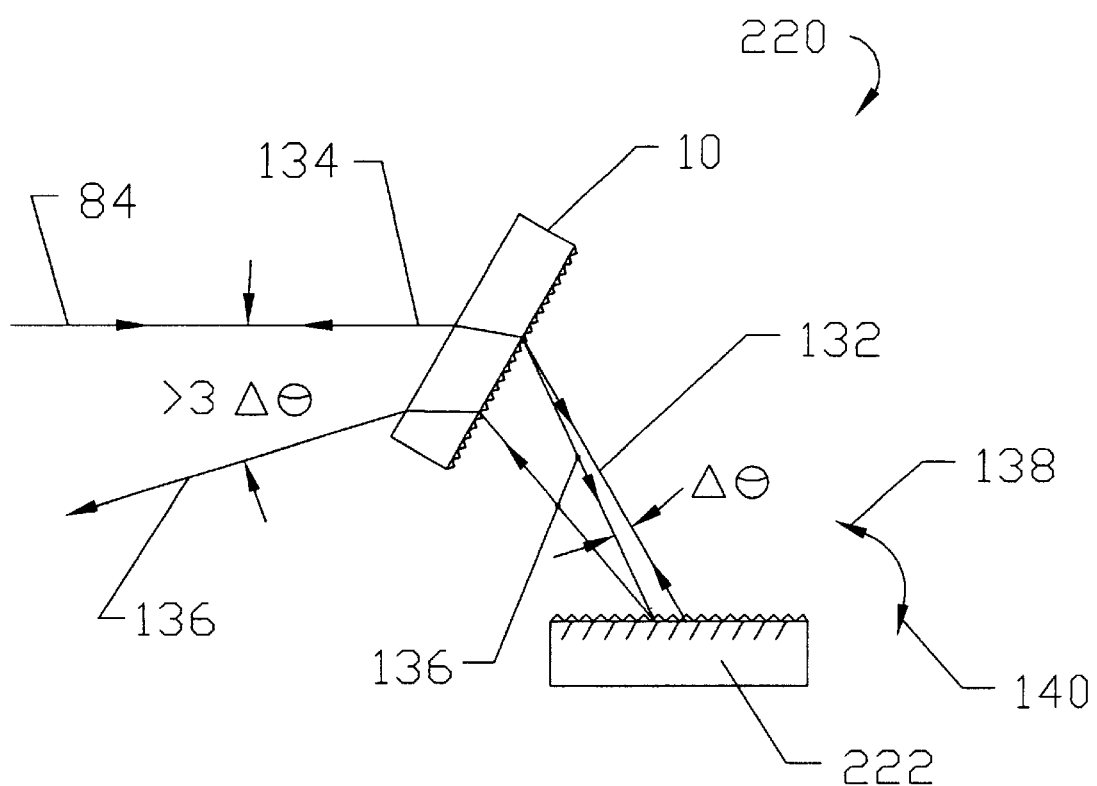
FIGS. 15, 16, 17, 18, 19, 20, 21, 22, 23 and 24 each present a schematic of a surface-relief grating-based device which utilizes physically cascaded grating elements.

FIG. 15 is a schematic of a dual pass cascaded grating-based wavelength selection device 220 which is similar to the device 130 depicted in FIG. 7 but differs therefrom in replacing the mirror element 122 in device 130 with a surface-relief reflection diffraction grating element 222 in device 220. As will be apparent, this modification significantly increases the wavelength dispersion power of the device 220 relative to that of device 130 of FIG. 7. The incident beam 84 to the transmission grating element 10 in device 220 contains $\lambda_1$ and $\lambda_2$ wavelength components. After the incident beam 84 is diffracted by the grating element 10, these optical wavelength components are angularly separated by $\Delta\theta$. The grating element 222 is angularly orientated so that the $\lambda_1$ wavelength beam 132 is retrodiffracted back on itself, that is, the grating element 222 operates at the Littrow condition, $\theta_i=\theta_d$, for the $\lambda_1$ wavelength beam 132. Because the grating element 10 functions in a reversible manner, the grating element 10 rediffracts the retrodiffracted $\lambda_1$ wavelength beam 132 back along the direction of the incident beam 84 as beam 134. This dual pass transmission multi-grating arrangement mimics a single reflection grating element operating at the Littrow condition for the $\lambda_1$ wavelength beam, since this beam is retrodiffracted back on itself. After diffracting from the grating element 222, the $\lambda_2$ wavelength beam 136 propagates back to the grating element 10 where, due to its angle of incidence, the $\lambda_2$ wavelength beam 136 is rediffracted from the grating element 10 with an angle equal to approximately $3\Delta\theta$ relative to the propagating direction of the retrodiffracted $\lambda_1$ wavelength beam 134 when the transmission grating element 10 and the reflection grating element 222 have approximately the same $\lambda/D$ ratio values.

As shown in Christopher Palmer's "Diffraction Grating Handbook," supra, essentially equal diffraction efficiency values for S and P polarized optical components can be achieved for sinusoidal surface-relief reflection gratings when their $\lambda/D$ ratio is in the range of about 0.7 to 0.85. This reference also shows that surface-relief reflection gratings having a triangular blazed grating line groove profile achieve essentially equal diffraction efficiency values for S and P polarized optical components when these gratings have $\lambda/D$ ratio values of between about 0.1 to 0.85. It is apparent from this reference that approximately 0.85 is the largest $\lambda/D$ ratio value that can be used with surface-relief reflection gratings and still achieve essentially equal diffraction efficiency values for S and P polarized optical components. Therefore, one may elect to use a surface-relief reflection grating element 222 in device 220 having a $\lambda/D$ value of about 0.8 in combination with a surface-relief transmission grating element 10 that has a $\lambda/D$ value of between 0.8 and 1.2 and, thereby increase the effective $\lambda/D$ ratio value of device 220 while still achieving essentially equal diffraction efficiency values for S and P optical polarizations.

Using the dual pass multi-grating combination in device 220, a surface-relief grating-based device can be constructed with effective $\lambda/D$ grating values of 2.3 to 3.2 while achieving essentially equal diffraction efficiency values for S and P polarized optical components. The dual pass multi-grating combination device 220 achieves these effective high $\lambda/D$ values by cascading the grating dispersion power of the grating elements in the device, that is, the effective $\lambda/D$ value is the sum of the $\lambda/D$ values of the individual grating elements that the beam is diffracted by. In FIG. 15 the beam undergoes three diffractions since the beam is passed twice through grating element 10. This cascading of the grating dispersion power does not effect the wavelength filter function of the grating-based devices incorporating this cascaded grating arrangement, since the wavelength filter function of these devices is determined by the physical dimensions of the output array structures used in those devices.

One can show that the angular separation, $d\theta_{dS}$, between the different wavelength channel beams that undergo diffraction by cascaded diffraction grating elements can accurately be approximated by using the sum of the angular separations that each grating element in the cascaded grating arrangement introduces into the beams, that is:

$$d\theta_{dS}=d\theta_{d1}+d\theta_{d2}+d\theta_{d3}+ \ldots +d\theta_{dn}, \quad (6)$$

where $d\theta_{d1}$, $d\theta_{d2}$, $d\theta_{d3}$, and $d\theta_{dn}$ are, respectively, the individual angular separations, as calculated by Equation (2), that the different wavelength beams experience as they are diffracted by the individual grating elements 1, 2, 3, and n of the cascaded grating arrangement having n cascaded grating elements. For example, the dual pass grating devices in FIGS. 7, 8 and 9 have 2 cascaded grating elements and, therefore, according to Equation (6) $d\theta_s=d\theta_{d1}+d\theta_{d2}=2d\theta_d$, as previously calculated with Equation (4). For the device 220 in FIG. 15, $d\theta_s=d\theta_{d1}+d\theta_{d2}+d\theta_{d3}=2d\theta_d+d\theta_{d2}$, where $d\theta_d$ is the angular separation for the transmission grating element 10 and $d\theta_{d2}$ is the angular separation for the reflection grating element 222.

Referring again to FIG. 15, one can change the wavelength of the beam 134 retrodiffracted back on itself and, thus change the wavelength tuning parameters of the device 220, by rotating the grating element 222 in the direction of arrow 138 and/or arrow 140 by conventional means, as was also described in regards to FIG. 7.

Figure 16:
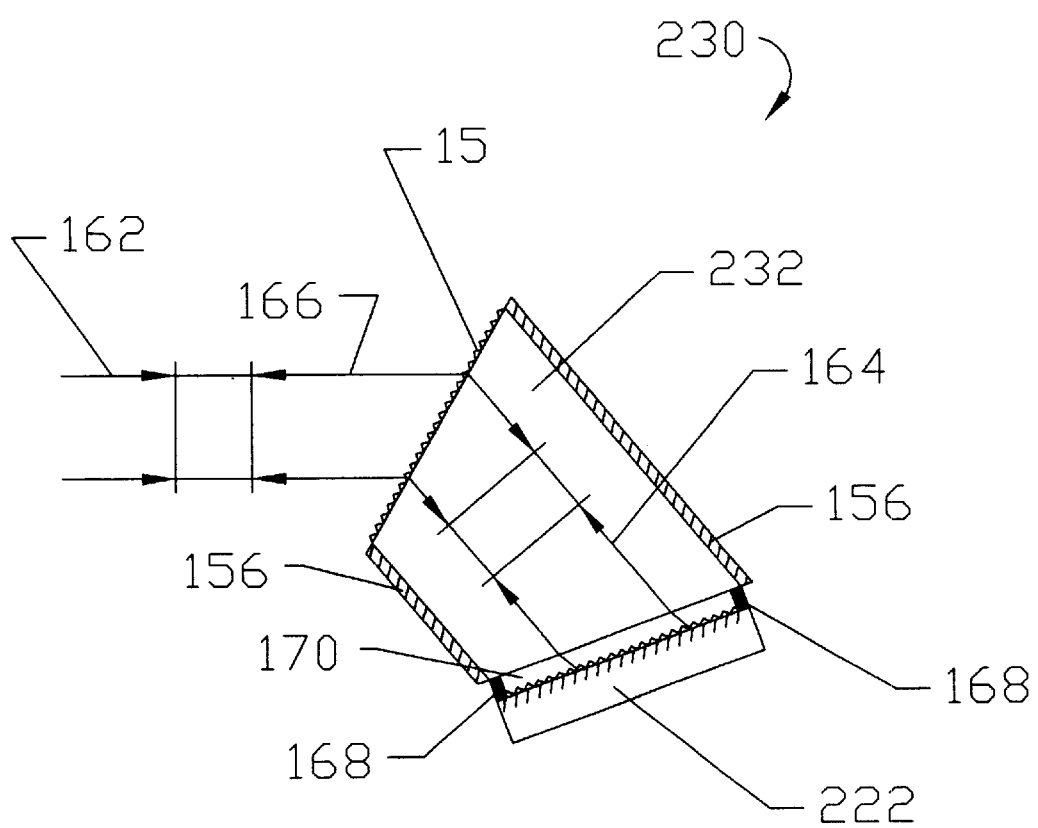

As illustrated in FIG. 16, one can configure the device 220 of FIG. 15 using a solid glass block element 232 that incorporates a surface-relief transmission grating 15 and a surface-relief reflection grating element 222 that is attached to the output optical transmitting surface of glass block 232. The dual pass multi-grating device 230 of FIG. 16 functions as described for the device 220 of FIG. 15. As depicted in FIG. 16, a single collimated wavelength beam 162 is incident on the dual pass multi-grating device 230 at the Littrow diffraction condition for the device 230 arrangement and is retrodiffracted back along the incident beam 162 as beam 166. A sealing element 168, such as epoxy, is used in device 230 to encapsulate the air gap layer 170 that exists between the surface-relief reflection grating surface of element 222 and the output optical transmitting surface of the glass block element 232. The main function of the sealing element 168 is to prevent contaminants, liquids or solvent vapors that could damage the grating surface from entering the air gap layer 170; and, as illustrated in the Examples, not every sealing element will function well in this device. The output optical transmitting surface of the glass block 152 has to be antireflection coated to minimize optical reflection losses at that surface. As depicted in FIG. 16, the non-optical transmitting surfaces of the glass block 152 have been coated with an optical absorption coating 156 that is designed to absorb the nondiffracted zeroth order beam energy and other scattered light which may occur within the glass block element 152.

Figure 17:
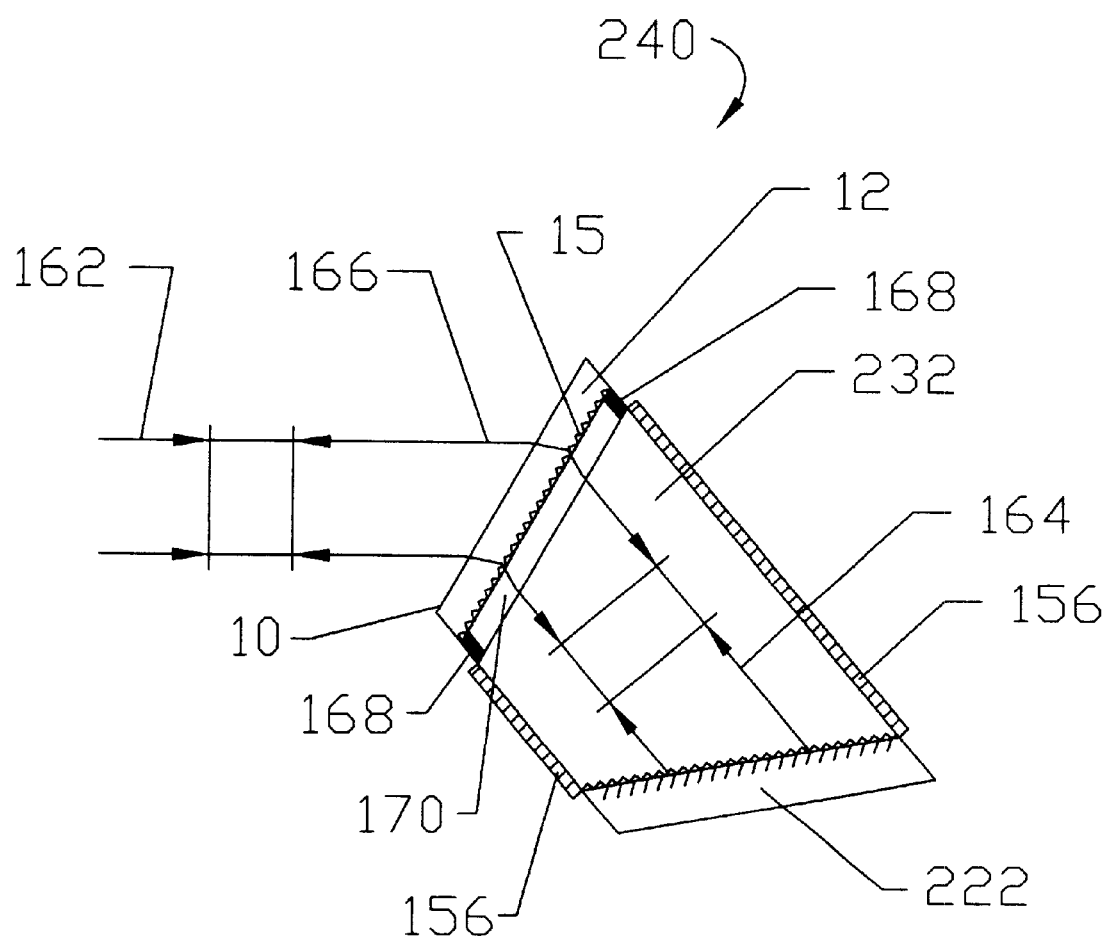

FIG. 17 is a schematic view of a dual pass multi-grating device 240 similar to the device 230 depicted in FIG. 16 but differing therefrom in that the transmission grating surface 15 in device 240 is encapsulated between the substrate 12 of grating element 10 and the input optical transmitting surface of glass block element 232 to which element 10 is attached, similar to manner shown in the device 160 of FIG. 9. Furthermore, the surface-relief reflection grating element 222 is directly attached (by, e.g., adhesive means, such as optical cement) to the glass block 232. The device 240 functions exactly as described for the device 230 of FIG. 16, except that the surface-relief reflecting grating surface of element 222 of device 240 is immersed in the optical cement used to optically bond element 222 to element 232. Under these immersed grating conditions, the effective $\lambda/D$ of the grating element 222 is reduced by the index of refraction of the optical cement used to bond the grating element 222 to the glass block 232. One can compensate for the reduction in the $\lambda/D$ of the grating element 222 as a result of being immersed in a media having an index of refraction larger than the 1.0 value for air by starting with a grating element 222 that has a higher $\lambda/D$ value. Typically one starts with a $\lambda/D$ value that is n times larger than the effective the $\lambda/D$ value that one wants to achieve for the immersed grating element, where n is the refractive index of the cement used to bond element 222 to element 232. Most optical cements have a refractive index in the range of about 1.45 to 1.6. For example, if one wants to have an immersed sinusoidal surface-relief reflection grating element 222 that has an effective $\lambda/D$ value of about 0.8 and, thereby, achieve essentially equal diffraction efficiency values for S and P polarized optical components, one would start with a grating element having a $\lambda/D$ value of about 1.2, assuming that the optical cement used to bond element 22 to element 232 in device 240 had an index of refection of 1.50.

Figure 18:
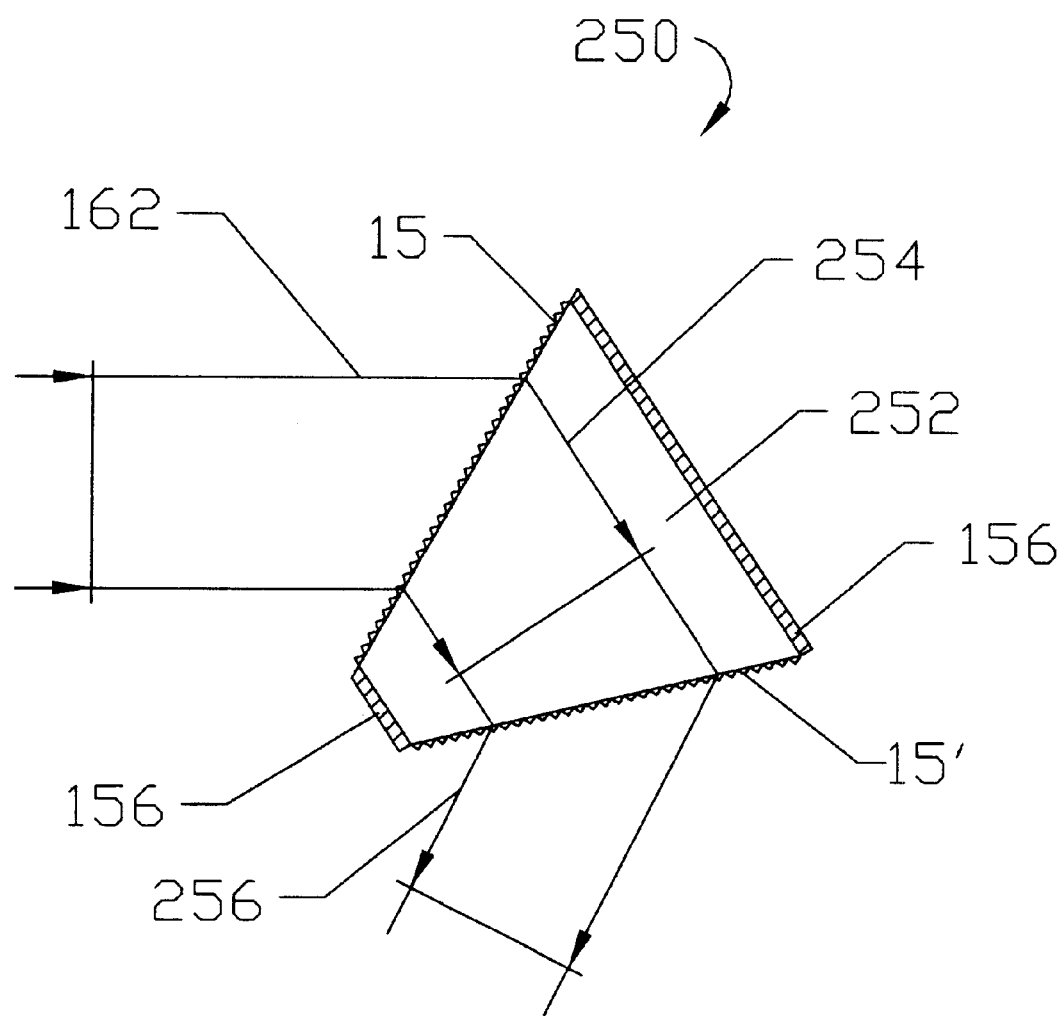

FIG. 18 illustrates how one can achieve the doubling of grating dispersion power by physically cascading two surface-relief transmission gratings 15 and 15', i.e., physically arranging two transmission grating elements so that a beam diffracted by the first grating undergoes diffraction by the second grating. As depicted in FIG. 18, the two gratings 15 and 15' are deposited onto the input and output optical transmitting surfaces of the glass block element 252. The single wavelength collimated incident beam 162 is diffracted by the first grating 15 as beam 254. The collimated diffracted beam 254 propagates in the glass block element 252 and is incident upon the second diffraction grating 15', which diffracts the beam 254 as collimated beam 256. The non-optical transmitting surfaces of the glass block 252 are coated with an optical absorption coating 156 that is designed to absorb the nondiffracted zeroth order beam energy and other scattered light that may occur within the glass block element 252.

The wavelength dispersion power of the dual cascaded transmission grating element 250 is essentially the sum of the wavelength dispersion powers of each of the gratings 15 and 15'. That is, the device 250 has an effective $\lambda/D$ value which is equal to the sum of the $\lambda/D$ values for the individual grating elements 15 and 15' used in the device. One can achieve essentially equal diffraction efficiency values for S and P polarized optical components for the element 250 by using surface-relief transmission gratings 15 and 15' that each have a $\lambda/D$ ratio in the range of about 0.8 to 1.2, as shown by the data in FIG. 4. Using this $\lambda/D$ value range for gratings 15 and 15', the element 250 can have an effective $\lambda/D$ ratio value of about 1.6 to 2.4 and achieve essentially equal diffraction efficiency values for the S and P optical polarization components. The angular separation between wavelength beams for element 260 is calculated with Equation (6) as $d\theta_{dS}=d\theta_{d1}+d\theta_{d2}$, where $d\theta_{d1}$ and $d\theta_{d2}$ are, respectively, the angular separation for gratings 15 and 15', as calculated by Equation (2).

Figure 19:
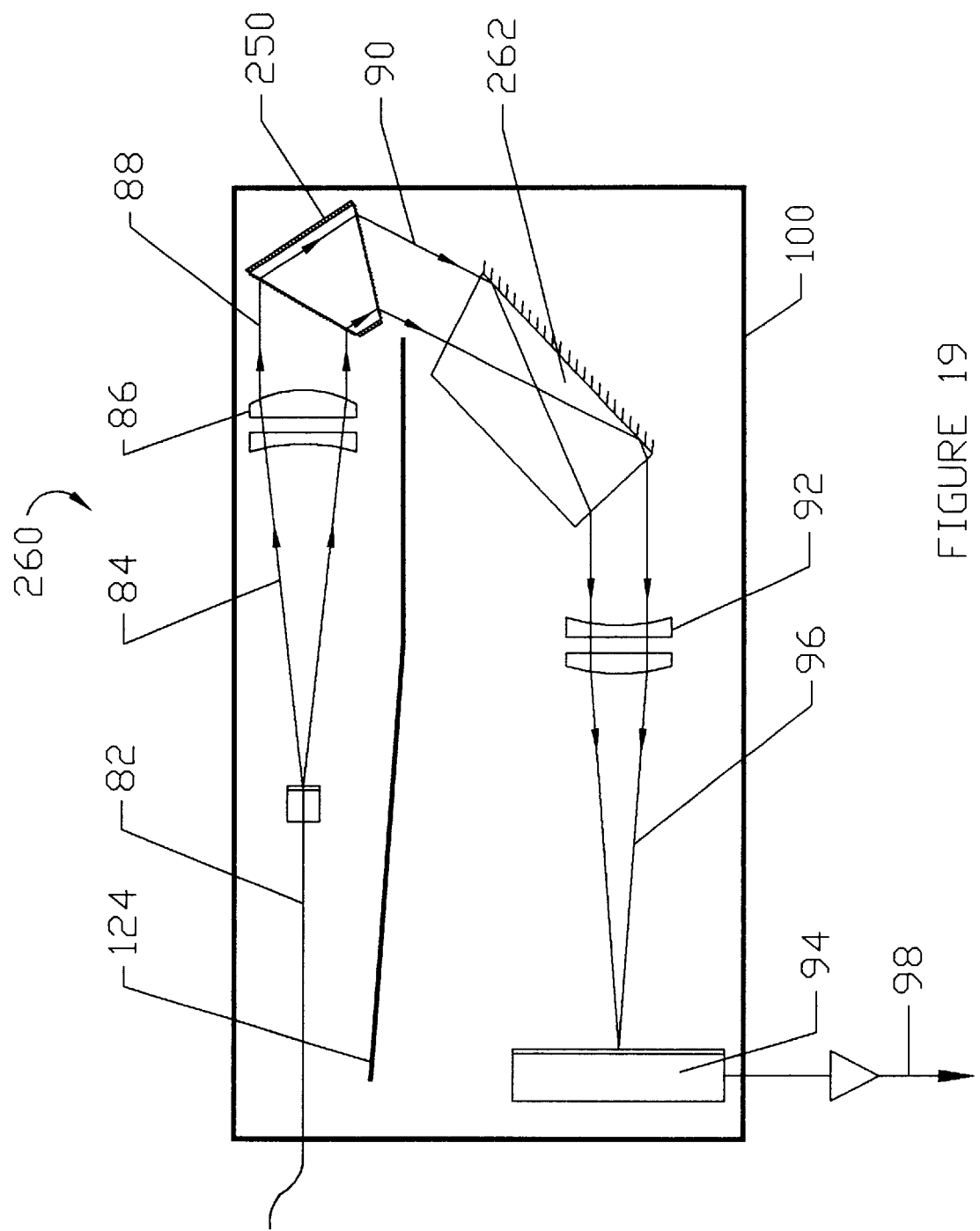

The spectrophotometer device 260 of FIG. 19 is essentially identical to the spectrophotometer device 217A of FIG. 13 with the exception that diffraction grating element 10 of device 217A is replaced in device 260 with the dual cascaded transmission grating element 250 of FIG. 18. Also, the linearizing prism element 218 and the beam fold mirror element 122 of device 217A have been combined into the single prism element 262 in device 260 that performs the dual functions of beam fold mirror and linearizing prism element. The dual functioning prism element 262 can achieve good athermalization performance since fabricating it with a glass material having a low thermal coefficient of refraction does not affect the beam folding mirror function of the element. Because the grating element 10 in FIG. 13 is replaced with element 250 in device 260, device 260 effectively has approximately twice the wavelength dispersion power as that achieved with device 217A. The higher wavelength dispersion power of the device 260 enables this device to utilize a shorter focal length for the focusing lens assembly 92 in the device and/or the device can be used in WDM fiber-optic communication systems having finer wavelength spacing between wavelength channel signals. The ability to work with WDM systems having finer spacing between their wavelength channel signals is becoming more important since the space between wavelength channels in fiber-optic communication systems is continuing to decrease.

Figure 20:
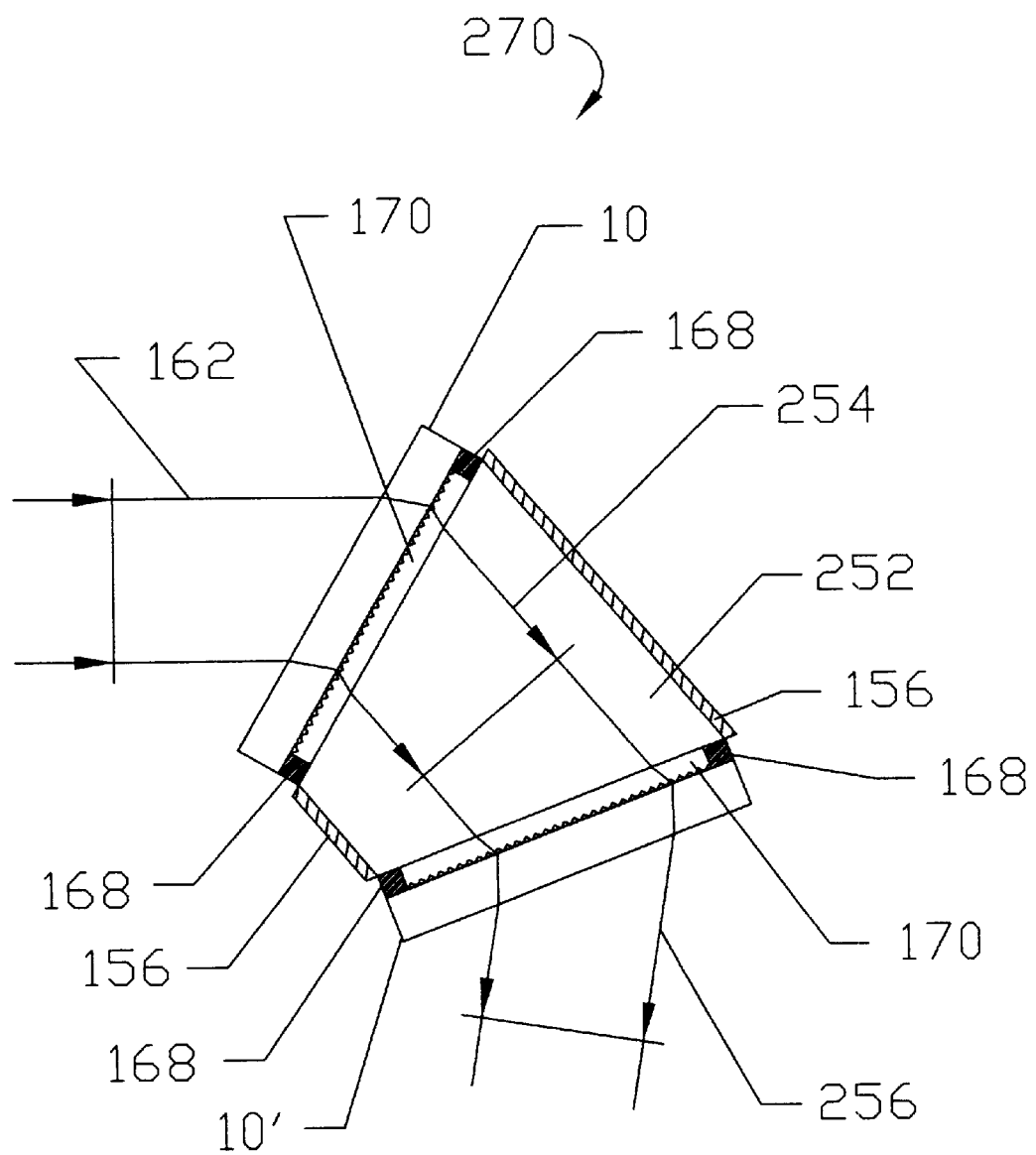

FIG. 20 illustrates a dual cascaded transmission grating device 270 which is similar to the device 250 of FIG. 18 but differs from that device by using surface-relief transmission grating elements 10 and 10' that are, respectively, attached to the input and output optical transmitting surfaces of glass block 252. The grating surfaces of elements 10 and 10' are encapsulated using sealing element 168 in substantial accordance with the method used to encapsulate the grating surface of element 10 in device 160 of FIG. 9. As illustrated in the examples, not every sealing element will function well in this device. The device 270 functions as described for the device 250 of FIG. 18.

Figure 21:
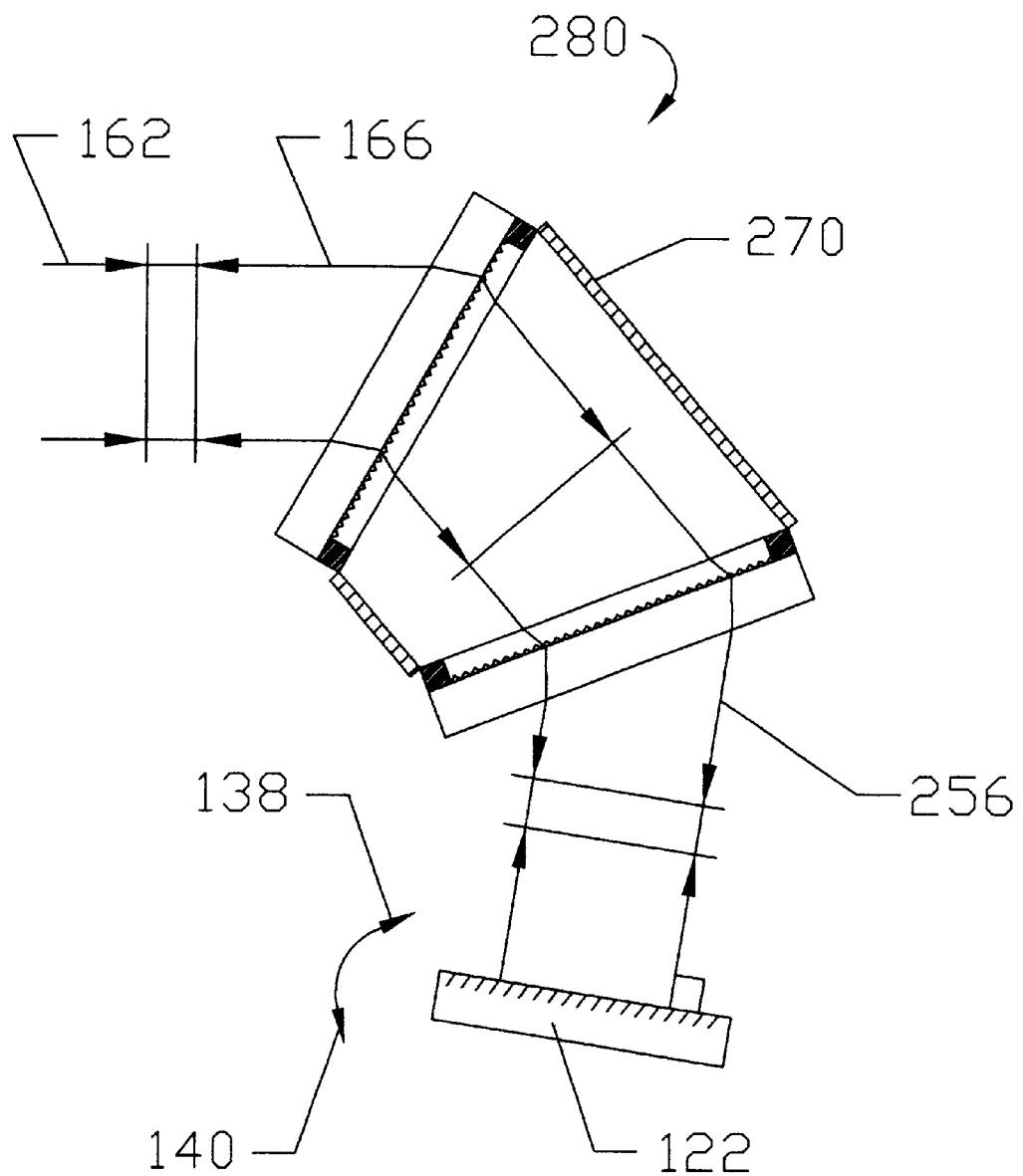

FIG. 21 illustrates a dual pass multi-grating device 280 that is similar to the device 130 of FIG. 7 but replaces the diffraction grating element 10 of device 130 with dual cascaded grating device 270 of FIG. 20. As depicted in FIG. 21, a single collimated wavelength beam 162 is incident on the device 280 at the Littrow diffraction condition for the device 280 arrangement and is retrodiffracted back along the incident beam 162 as beam 166. Device 280 functions essentially as described for device 130 of FIG. 7 with the exception that the wavelength dispersion power of the device 280 is substantially two times as great as that achieved with device 130 for the case where the grating elements 10 and 10' of device 280 have the same $\lambda/D$ value as the grating element 10 in device 130. The device 280 can have an effective $\lambda/D$ ratio of about 3.2 to 4.8 and still achieve essentially equal diffraction efficiency values for S and P polarized optical components by using grating elements 10 and 10' that each have $\lambda/D$ values in the range of about 0.8 to 1.2. The angular separation between wavelength beams for device 280 is calculated with Equation (6) as $d\theta_{dS}=2d\theta_{d1}+2d\theta_{d2}$, where $d\theta_{d1}$ and $d\theta_{d2}$ are, respectively, the angular separation for grating elements 10 and 10', as calculated by Equation (2).

Figure 22:
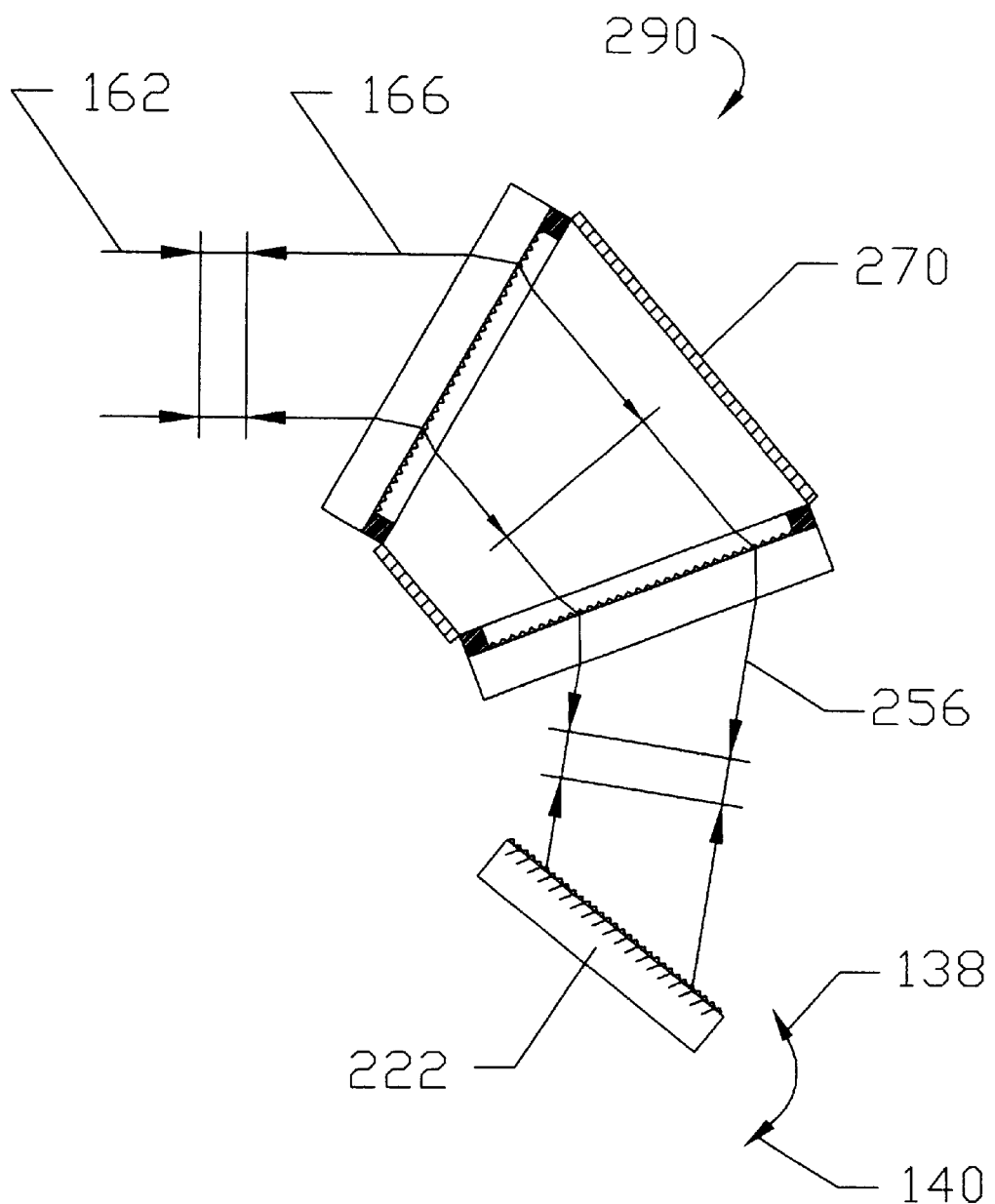

FIG. 22 illustrates a dual pass multi-grating device 290 that is similar to the device 220 of FIG. 15 but replaces the diffraction grating element 10 of device 220 with dual cascaded grating device 270 of FIG. 20. As depicted in FIG. 20, a single collimated wavelength beam 162 is incident on the device 290 at the Littrow diffraction condition for the device 290 arrangement and is retrodiffracted back along the incident beam 162 and beam 166. Device 290 functions essentially as described for device 220 of FIG. 15 with the exception that the dispersion wavelength power of the device 220 is approximately 1.67 times greater than that achieved for the device 220 for the case where device 220 and device 290 use grating elements having essentially the same $\lambda/D$ values. The device 290 can have an effective $\lambda/D$ ratio of about 5.0 to 8.8 and still achieve essentially equal diffraction efficiency values for S and P polarized optical components when the surface-relief transmission grating elements used in the device each have $\lambda/D$ values of about 0.8 to 1.2 and the surface-relief reflection grating element 222 has a $\lambda/D$ value of about 0.7 to 0.85. The angular separation between wavelength beams for device 290 is calculated with Equation (6) as $d\theta_{dS}=2d\theta_{d1}+2d\theta_{d2}+d\theta_3$, where $d\theta_{d1}$, $d\theta_{d2}$, and $d\theta_{d3}$ are, respectively, the angular separation for grating elements 10, 10' and 222, as calculated with Equation (2).

Figure 23:
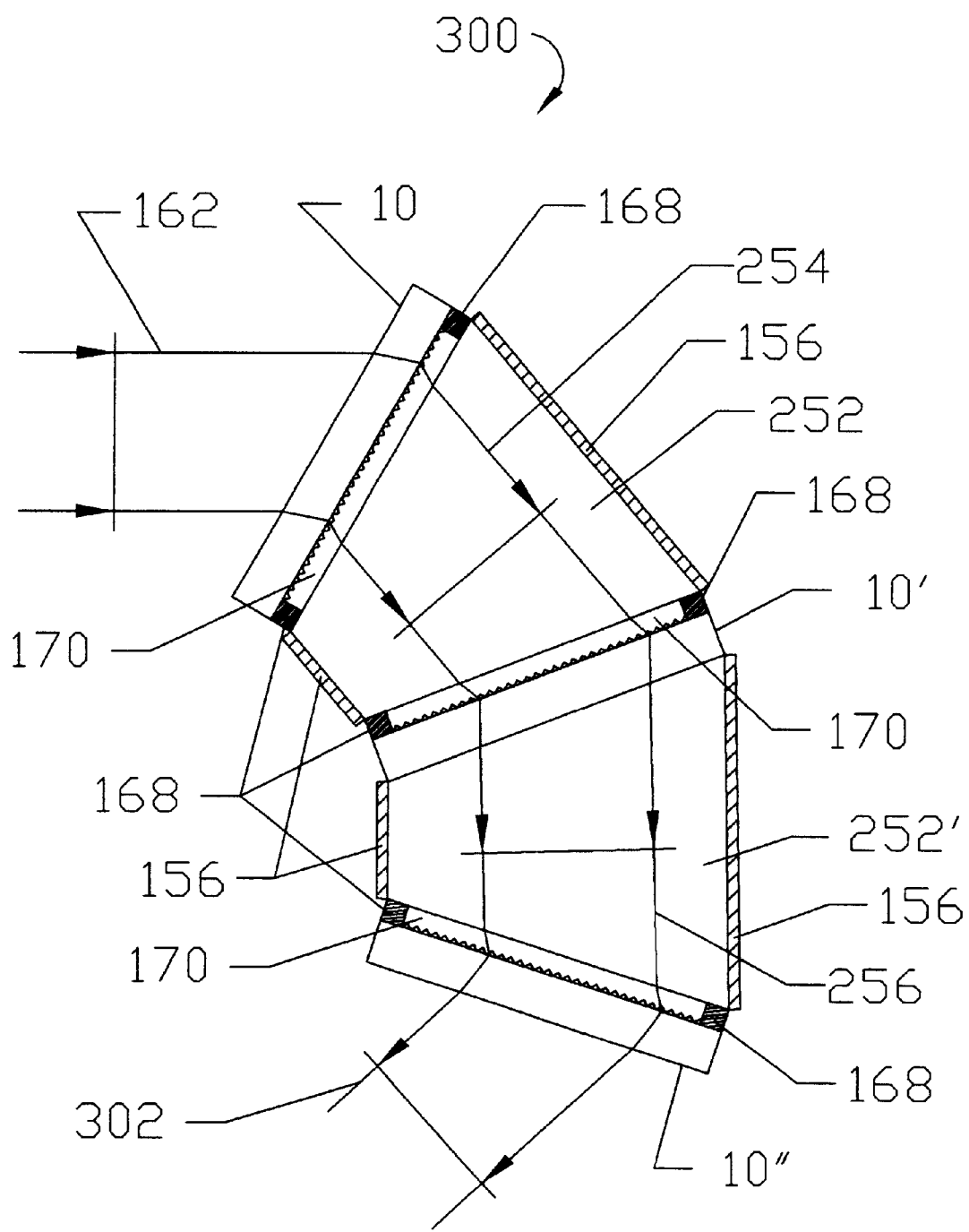

The transmission multi-grating device 300 depicted in FIG. 23 is similar to the device 270 in FIG. 20, with the exception that the dispersion power has been further increased by stacking a third diffraction grating element 10" to the grating elements 10 and 10' that are incorporated in device 270 of FIG. 20. Device 300 functions as described for the device 270 of FIG. 20 with the exception that, in device 300, the collimated beam 256 diffracted from grating element 10' propagates in the glass block 252' to grating element 10" where it is diffracted as collimated beam 302. The effective $\lambda/D$ ratio value for the device 300 is essentially equal to the sum of the $\lambda/D$ values for the individual grating elements 10, 10' and 10". Therefore, device 300 can be fabricated with an effective $\lambda/D$ ratio value of about 2.4 to 3.6 while still achieve essentially equal diffraction efficiency values for S and P polarized optical components by using surface-relief transmission grating elements for gratings 10, 10' and 10" that each have $\lambda/D$ values in the range of about 0.8 to 1.2. The angular separation between wavelength beams for device 300 is calculated with Equation (6) as $d\theta_{dS}=d\theta_{d1}+d\theta_{d2}+d\theta_{d3}$, where $d\theta_{d1}$, $d\theta_{d2}$, and $d\theta_{d3}$ are, respectively, the angular separation for grating elements 10, 10' and 10", as calculated with Equation (2).

In device 300 the individual grating elements 10, 10' and 10" are attached to the corresponding optical transmitting surfaces of glass block elements 252 and 252' using sealing elements 168. Sealing elements 168 encapsulate the grating surfaces of elements 10, 10' and 10" in substantial accordance with the method used to encapsulate the grating surface of element 10 in device 160 of FIG. 9. As depicted in FIG. 23, grating element 10' is optically attached to glass block 252'. One could use optical cement to bond grating element 10' to glass block 252' or one could directly optically contact grating element 10' to glass block 252'.

As depicted in FIG. 23, the substrate material of grating element 10' and the glass block 252' have essentially the same index of refraction and, therefore, the beam 256 propagates from grating element 10' into glass block 252' as if the combination of elements 10' and 252' were fabricated from a single continuous glass block element for the case where these elements are either optically contacted together or bonded using an optical cement that has an index of refraction that is essentially equal to that of the refractive indices used for elements 10' and 252'. For the case where the grating element 10' and glass block element 252' have different indices of refraction and/or the optical cement used to bond elements 10' and 252' together has a different index of refraction relative to the indices of refraction for elements 10' and 252', the beam 256 propagates from grating element 10' into glass block element 252' but some of its intensity is lost due to the reflection loss that occurs at the interface boundary surface between materials that have different indices of refraction. These reflection losses are less than 0.5 percent per interface boundary surface when the indices of refraction for elements 10' and 252' and the optical cement used to bond them together are relatively close, that is, when the difference in these indices of refraction are less than approximately 0.2 for materials having an index of refraction in the range of about 1.40 to 1.70.

The optical bonding of grating element 10' to glass block element 252' in device 300 of FIG. 23, in effect, creates a surface-relief transmission grating surface on the input optical transmitting surface of block element 252'. While this technique for creating a grating surface on the optical transmitting surface of a glass block element is only illustrated in FIG. 23, it can be used to create the transmission grating surface 15 on the input optical transmitting surface of the glass blocks in FIGS. 8, 12, 14 and 16 and the grating surfaces 15 and 15' on the input and output optical transmitting surfaces of glass block 252 in FIG. 18. This method of creating a surface grating 15 on the input and/or output transmitting surfaces of a glass block by optically bonding a grating element 10 to the surface of the glass block element provides significant advantages with regard to manufacturing the grating surfaces 15 on the input optical transmitting surfaces of the glass blocks in FIGS. 8, 12, 14 and 16 and the grating surfaces 15 and 15' on the input and output optical transmitting surfaces of the glass block in FIG. 18.

It is much easier to create a surface-relief photoresist grating on a parallel plate substrate element than to create a surface-relief photoresist grating on a non-parallel shaped glass block element. Also, multiple surface-relief photoresist grating elements can be fabricated on a single large substrate element, in the same manner that multiple integrated circuit elements are fabricated on a single silicon wafer. A large substrate containing multiple grating elements can be cut up to yield smaller grating elements having a size suitable for the devices that they will be used with. These grating elements cut from the larger substrate element can be used as a stand alone element as illustrated in FIGS. 5, 6, 7 and 15, attached to a glass block element with an air spacing layer between the grating surface and the optical transmitting surface of the glass block element as illustrated in FIGS. 9, 16, 17, 20, 21 and 23, or optically bonded to a glass element as illustrated in FIG. 23, and, while not specifically illustrated, used to create the grating surface on the glass block elements incorporated in the devices illustrated in FIGS. 8, 10A, 10B, 11A, 11B, 12, 14, 16, and 17.

One can further increase the wavelength dispersion power of the transmission multi-grating device 300 of FIG. 23 by either adding another transmission grating element to the device, incorporating a beam fold mirror in the device that retroreflects the diffracted beam 302 back through the device or by incorporating a reflecting grating element in the device that retrodiffracts the diffracted beam 302 back through the device. It is anticipated that the wavelength dispersion power of the devices shown in this specification are suitable for both present and future grating-based devices used in fiber-optic communication systems.

Figure 24:
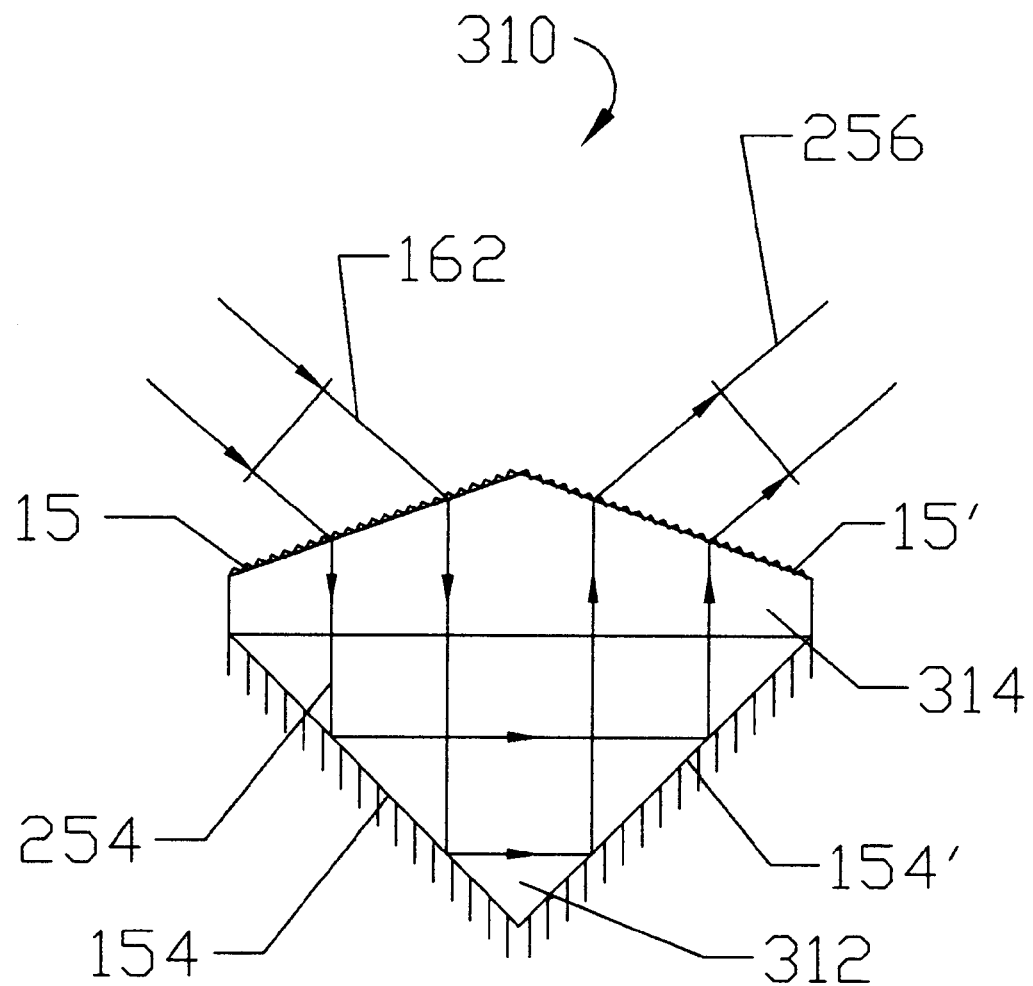

FIG. 24 illustrates a dual cascaded transmission grating device 310 which is similar to the device 250 of FIG. 18. Device 310 functions essentially as described for device 250 with the exception that the beam 254 diffracted from grating 15 undergoes two reflections within the glass block element in device 310 before being incident on grating 15' which diffracts it as beam 256. As depicted in FIG. 24, the glass block element of device 310 is composed of two glass block elements 312 and 314 that are optically bonded together. Glass block elements 312 and 314 are fabricated from the same type of glass material and are bonded together by being either directly optically contacted or by using an optical cement that has an index of refraction that is essentially equal to the refractive index of glass block elements 312 and 314 and, thereby forms essentially a single continuous glass block element. The block element 312 is a roof prism element having a 90-degree angle between its reflective mirror coated surfaces 154 and 154'. The block element 314 is a prism element having a base length that matches the length of the hypotenuse leg of block element 312 while the enclosed angle between the other two leg surfaces of element 314 is chosen to facilitate the diffraction angle conditions of device 310.

Device 310 is included in this specification to illustrate that beam folding mirror surfaces can be incorporated into the cascaded multi-grating devices presented in this specification and, thereby, change the angular propagation path that the beam undergoes with the device and the angular direction of the beam exiting the device relative to the incident beam direction. Comparison of device 310 in FIG. 24 with device 250 of FIG. 18 shows that the inclusion of beam folding mirror surfaces as implemented in the embodiment in FIG. 24 does not essentially affect the wavelength dispersion power of the device.

One of the most fundamental operations in a communication network is the selective switching (add/drop) of signals between different transmission paths of the network. A number of techniques have been demonstrated for building optically based add/drop wavelength multiplex (ADWM) devices that optically switch different wavelength channels between different fiber ports in a WDM fiber-optic communication system. U.S. Pat. No. 5,960,133 discloses methods for building ADWM devices that utilize reflection grating elements to perform the wavelength channel selection function in these devices. The entire disclosure of this United States patent is hereby incorporated by reference into this specification.

Figure 25A:
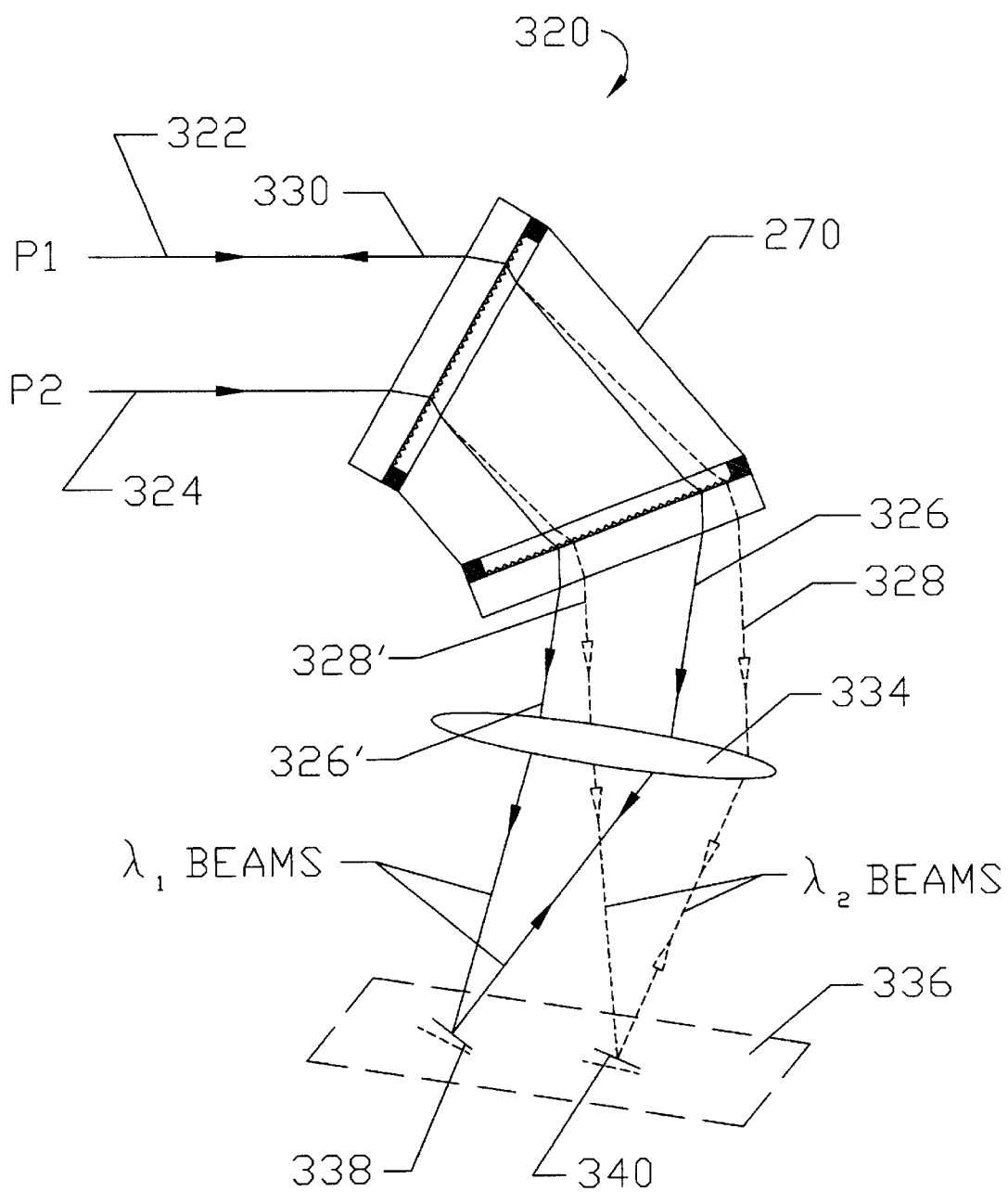
FIGS. 25A, 25B, and 26 illustrate wavelength-division add/drop multiplexer devices that incorporate the dual cascaded grating element of FIG. 20.
Figure 25B:
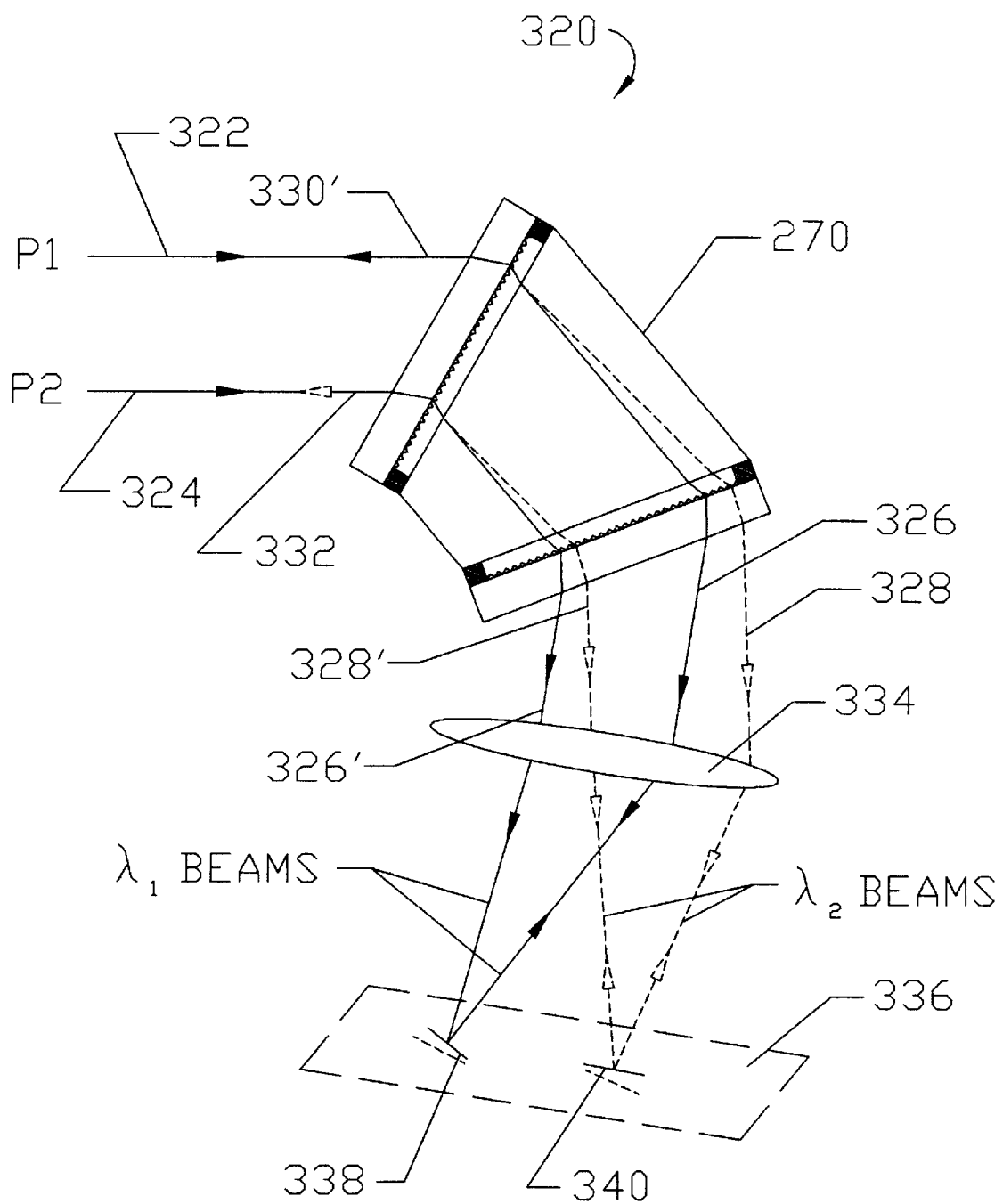

Schematically illustrated in FIGS. 25A and 25B is an ADWM device 320 that is similar to the device 19 in FIG. 2 of U.S. Pat. No. 5,960,133, but differs from that device in that device 320 uses dual cascaded transmission grating element 270 of FIG. 20 in place of the reflection grating element used in the FIG. 2 device 19 of U.S. Pat. No. 5,960,133. Because the elements used to fabricate the input and output ports and the micro electromechanical (MEM) mirror switching elements of the ADWM devices disclosed in U.S. Pat. No. 5,960,133 are relatively large, these ADWM devices can benefit from the flexibility of element placement provided by replacing the reflection grating elements used in the ADWM devices of U.S. Pat. No. 5,960,133 with surface-relief transmission grating-based elements, in the same manner that the wavelength channel monitoring devices of FIGS. 5 and 6 benefit from the use of transmission grating element 10. These ADWM devices can also benefit from the increased wavelength dispersion power provided by the cascaded transmission grating arrangements presented in this specification, as illustrated by device 320 in FIGS. 25A and 25B.

With reference to FIG. 25A, ports P1 and P2 provide generally parallel but separate optical beams 322 and 324 that are incident to the dual cascaded grating element 270. Beams 322 and 324 contain $\lambda_1$ and $\lambda_2$ wavelength channel signals. After diffraction from element 270 the incident beams 322 and 324 are separated into their respective wavelength components. The $\lambda_1$ wavelength components of beams 322 and 324 are, respectively, 326 and 326' and are depicted in FIG. 25A as solid lines while the $\lambda_2$ wavelength components of beams 322 and 324 are, respectively, 328 and 328' and are depicted as dashed lines in FIG. 25A. As illustrated in FIG. 25A, the diffracted beams having different wavelengths are angularly separated while those of the same wavelength remain substantially parallel. A lens 334 focuses all of the beams from element 270 onto a micro-mirror array 336 comprising separately tiltable micro-mirror elements 338 and 340.

In the first position of the micro-mirror elements 338 and 340, illustrated in FIG. 25A by the solid lines, the mirror elements 338 and 340 reflect both wavelength beams received from port P1 directly back to port P1 as beam 330. That is, in this first position the mirrors are orientated perpendicular to the beams 326 and 328. For this first mirror position no wavelength signal channels are either added to or dropped from port P1 of the device 320. However, when mirror elements 338 and 340 are in the second position, illustrated by the dotted lines in FIG. 25A, the mirror elements 338 and 340 reflect wavelength beams received from port P1 to port P2. That is, in the second position the mirror element 338 is orientated perpendicular to the bisector of the beams 326 and 326' and the mirror element 340 is orientated perpendicular to the bisector of the beams 328 and 328'. In the second position, the mirror elements 338 and 340 also reflect wavelength beams received from port P2 to port P1. For this second mirror position both the $\lambda_1$ and $\lambda_2$ wavelength channel signals of beam 322 are dropped from port 1 and added to port 2 while both the $\lambda_1$ and $\lambda_2$ wavelength channel signals of beam 324 are dropped from port 2 and added to port 1.

FIG. 25B illustrates the case where mirror element 338 of device 320 is orientated in the first position, same as illustrated in FIG. 25B, while mirror element 340 is orientated in the second position. For the mirror orientation arrangement in FIG. 25B, the $\lambda_1$ wavelength beam from port 1 is reflected back to port 1 and comprises part of beam 330' while the $\lambda_2$ wavelength beam from port 1 is reflected to port 2 as beam 332 and the $\lambda_2$ wavelength beam from port 2 is reflected to port 1 and comprises part of beam 330'. For the mirror arrangement in FIG. 25B, the $\lambda_2$ wavelength channel signal of beam 322 is dropped from port 1 of device 320 and added to port 2 of the device while the $\lambda_2$ wavelength channel signal of beam 324 from port 2 is added to port 1 of the device. While only two wavelength channel signals and only two micro-mirror elements are depicted in device 320 of FIGS. 25A and 25B, it is evident that device 320 can be fabricated with a micro-mirror array 336 having a large number of micro-mirror elements and, thereby enable device 320 to be used to add/drop a large number of wavelength channel signals.

As stated in U.S. Pat. No. 5,690,133, the device 19 of FIG. 2 of that patent, that is similar to that of device 320 of FIGS. 25A and 25B, has many desirable characteristics but suffers from some problems. One problem being that optical circulator devices have to be connected to the ports P1 and P2 to separate wavelength beam signals going in opposite directions. Optical circulator devices are expensive and add optical insertion loss to the ADWM device. A further problem with the device 320 is that it cannot simultaneously direct the $\lambda_1$ wavelength beam from port P1 to port P1 while directing the $\lambda_1$ wavelength beam from port P2 to port P2, or perform this same simultaneous switching function for the same wavelength for any of the other wavelength channel beams in the device.

Figure 26:
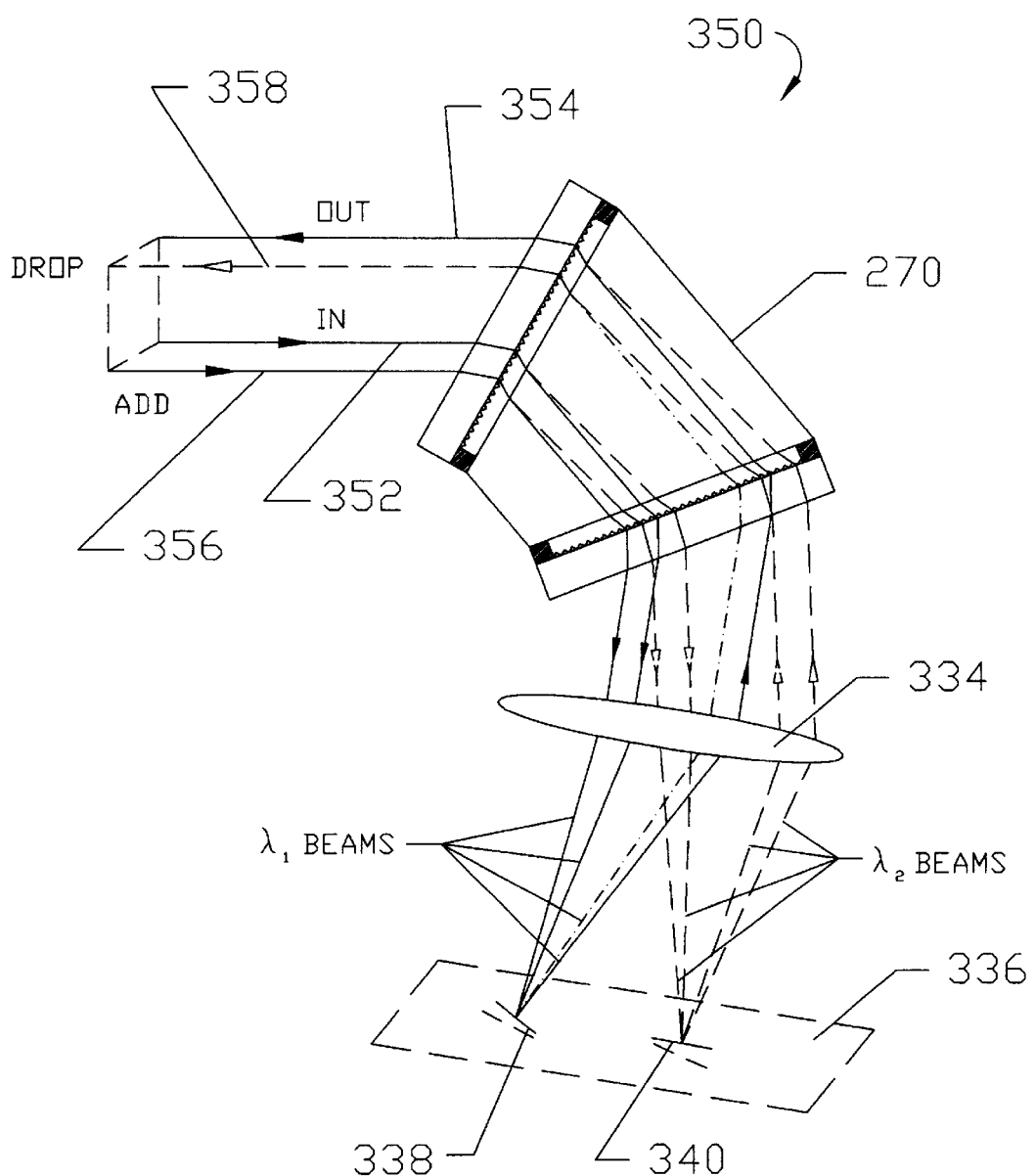

FIG. 5 in U.S Pat. No. 5,960,133 shows what is claimed as an improved micro-mirror based add/drop device relative to the device 19 of FIG. 2 of this patent. Schematically illustrated in FIG. 26 is an ADWM device 350 that is similar to the FIG. 5 device in U.S. Pat. No. 5,960,133, but differs from that device in that device 350 uses dual cascaded transmission grating element 270 in place of the reflection grating element used in the FIG. 5 device of U.S Pat. No. 5,960,133. The device 350 functions similar to that stated for device 320 of FIGS. 25A and 25B, with the exception that device 350 uses four parallel, direction, input and output beam paths 352, 354, 356, and 358 arranged in a two-dimensional array. The four beams in this arrangement are the input beam 352, the output beam 354, the add beam 356, and the drop beam 358. The input and add beams 352 and 356 propagate oppositely from the output and drop beams 354 and 358.

As explained in U.S. Pat. No. 5,960,133, the incorporation of the four parallel beam paths 352, 354, 356, and 358 into device 270 enables this add/drop device to function without the need for optical circulator devices and enables the device 350 to simultaneously switch a $\lambda_1$ wavelength channel signal from the input beam path 352 to the drop beam path 358 while switching a $\lambda_1$ wavelength channel signal from the add beam path 356 to the output beam path 354.

Replacement of the reflection grating elements in the FIG. 2 and FIG. 5 devices of U.S. Pat. No. 5,960,133 with a surface-relief transmission grating or a dual cascaded transmission grating element, as illustrated in FIGS. 25A, 25B and 26, does not change the basic add/drop functions of these devices but improves device layout configuration while providing increased wavelength dispersion power, which becomes increasingly important as the wavelength spacing in WDM fiber-optic systems decreases.

Figure 27A:
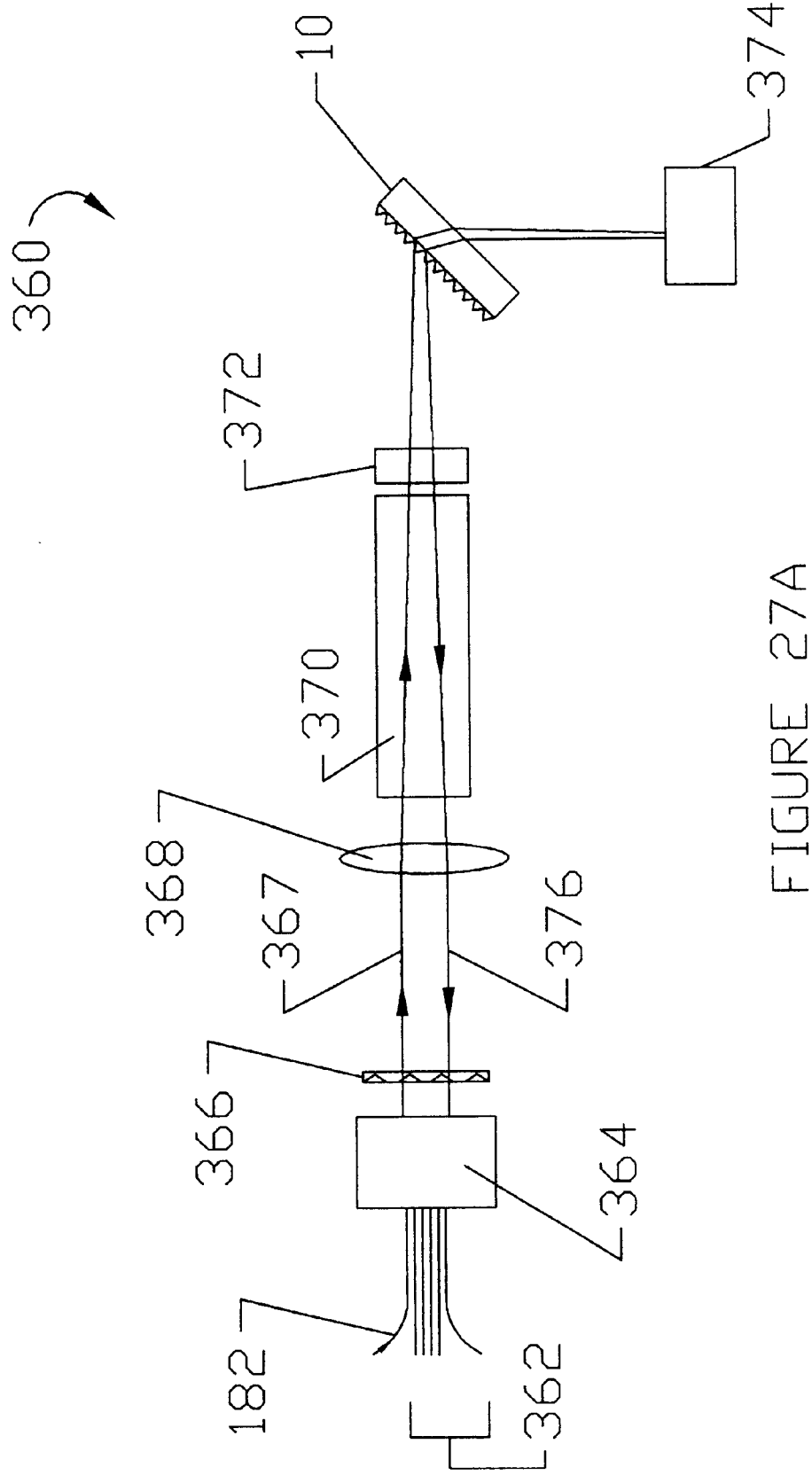
FIG. 27A is a schematic side view of a transmission grating-based demultiplexer fiber-optic unit.

A schematic side view is illustrated in FIG. 27A of a Mux/Demux device 360 that is similar to the device shown in FIG. 1 of a paper by S. Bourzeix, et al. entitled "Athermalized DWDM Multiplexer/Demultiplexer," (2000 National Fiber Optic Engineers Conference Technical Proceedings, Vol. 2, pages 317–320), but differs primarily from that device in that device 360 uses surface-relief transmission grating element 10 in place of the surface-relief reflection grating element used in the FIG. 1 device of the Bourzeix, et al. paper. The use of transmission grating element 10 in device 360 facilitates the placement of the dihedral retroreflecting mirror element 374 in relation to the grating element 10 while enabling the grating to operate closer to the Littrow diffraction condition, relative to that achieved when a reflection grating element is incorporated into the device. Also, the use of transmission grating element 10 of FIG. 27A enables the dihedral mirror element 374 of this figure to be incorporated into a glass block element that includes the transmission grating, similar to the arrangement illustrated in FIGS. 8 and 9. It is much more difficult to incorporate the dihedral mirror element into a glass block element that includes the grating when a reflection grating is used in the device.

As depicted in FIG. 27A, input optical wavelength channel signal information is delivered to device 360 by transmission fiber 182. Input fiber 182 and output fibers 362 are held and spatially positioned relative to each other and the other optical components in device 360 by the fiber-optic array element 364. The optical beam emerging from the end of input fiber 182 is incident on a lens element (not shown)

in the microlens array 366. Microlens array 366 reduces the divergence angle of the beam from input fiber 182 by about 1 degree, which increases the relative channel width of the device. Beam 367 from the microlens array 366 is collimated by lens 368. The collimated beam 367 from lens 368 propagates through the birefringent crystal element 370, through the halfwave retardation plate 372, to the grating element 10 where the beam is diffracted to the dihedral mirror element 374, the retroreflected beam from mirror element 374 propagates back to grating element 10 where it is rediffracted and propagates back through the halfwave retardation plate 372 and birefringent crystal element 370 to lens 368. The converging beam 376 from lens 368 is incident on microlens array 366, which focuses the angularly separated wavelength channel beams of beam 376 onto their corresponding output fibers 362 held in the fiber-optic array element 364.

Figure 27B:
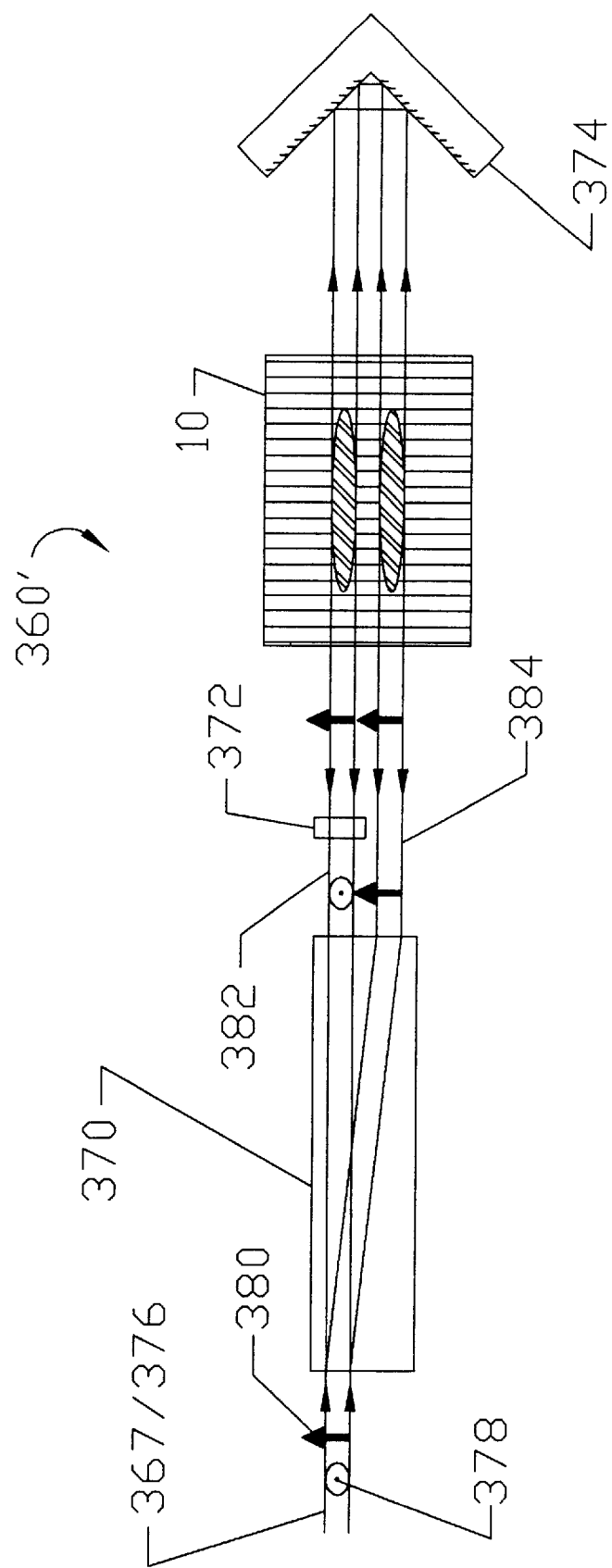
FIG. 27B is a schematic top view of some the optical components used in the demultiplexer device of FIG. 27A.

A schematic top view in FIG. 27B of a portion of the device 360 more clearly illustrates how the birefringent crystal element 370, halfwave retardation plate 372 and dihedral mirror element 374 collectively function together to control the polarization direction of the optical beam incident on grating element 10 and, thereby, enable the device 360 to achieve radiometric throughput efficiency values for S and P polarizations that are equal to within about 5 percent of each other. As depicted in FIG. 27A, the incident beam to grating element 10 and the diffracted beam from grating element 10 both make an angle of about 45 degrees with regard to the normal to the surfaces of element 10. Therefore, the grating element 10 in device 360 has a $\lambda/D$ ratio value of approximately 1.4142, which according to the data in FIG. 4 results in the S polarized optical beam having almost 100 percent diffraction efficiency while the P polarized beam has almost zero percent diffraction efficiency. For the configuration depicted in device 360, essentially only the S polarized optical component is diffracted from grating element 10 and, therefore, the other optical elements collectively function together to ensure that only a S polarized beam is incident on the grating element 10.

With reference to FIG. 27B, the incident beam 367 to the birefringent crystal element 370 is composed of both S and P polarized optical components where the P component 378 is depicted as an ellipse with a dot at its center while the S component 380 is depicted as a bold arrow figure. Only the S and P polarization components to the left of element 370 in FIG. 27B are labeled with their respective numbers 380 and 378. When beam 367 propagates through the birefringent crystal element 370 its S and P polarized optical beam components propagate at an angle with respect to each other. As illustrated in FIG. 27B, the P polarized beam component of beam 367 propagates essentially straight through element 370 while the S polarized beam component of beam 367 is refracted at an angle relative to the P polarization beam direction as it propagates through element 370. The length of the birefringent crystal element 370 is chosen so that the P polarized beam path 382 exiting the element 370 is spatially separated from the S polarized beam path 384 exiting the element 370, as illustrated in FIG. 27B.

The beam paths 382 and 384 are parallel and spatially separated as they propagate through grating element 10 and dihedral mirror element 374. As illustrated in FIG. 27B, the dihedral mirror element 374 has a 90 degree angle between its reflecting mirror surfaces and, thereby, functions as a retroreflecting mirror element that redirects the beam propagating from element 10 to element 374 along beam path 382 to propagate back to element 10 along beam path 384 while redirecting the beam that propagates from element 10 to element 374 along beam path 384 to propagate back to element 10 along beam path 382. Positioned in beam path 382, but not in beam path 384, is halfwave retardation plate 372 that converts the polarization direction of the oppositely propagating beams in beam path 382 from P polarization to S polarization for the beam propagating from element 370 to element 10 and from S polarization to P polarization for the beam propagating from element 10 to element 370. The birefringent crystal element 370 functions in a reversible manner and, thereby, recombines the beams propagating in beam paths 382 and 384 that are incident to element 370 into a single beam 376 that propagates from element 370 to lens 368.

For the optical arrangement illustrated in FIG. 27B, the beams propagating in either direction of beam paths 282 or 284 that are incident on grating element 10 are S polarized and, therefore, have equal diffraction efficiency values which enables the device 360 to achieve radiometric throughput efficiency values for S and P polarized optical components that are equal to within about 5 percent of each other. The diffraction grating and dihedral mirror arrangement in device 360 functions as a dual pass cascaded grating arrangement, as described for the dual pass grating device 130 of FIG. 7. The wavelength dispersion power of device 360 is equal to approximately twice the value of the wavelength dispersion power of grating element 10 used in the device. The angular separation between the different wavelength channel beams exiting element 370 of device 360 are calculated using Equation (4). The $\lambda/D$ value for the grating element 10 in device. 360 is effectively doubled. As shown by data presented in Pages 179–182 of the Loewen text discussed elsewhere in this specification, one can achieve greater than 70 percent diffraction efficiency for S polarization for surface-relief transmission gratings having $\lambda/D$ ratio values of about 0.8 to approximately 2.0. Therefore, device 360 can be fabricated with an effective $\lambda/D$ ratio value of about 1.6 to 4.0 and still achieve essentially equal radiometric throughput efficiency for values for S and P polarized optical components, that is, having values within about 5 percent of each other.

Figure 28:
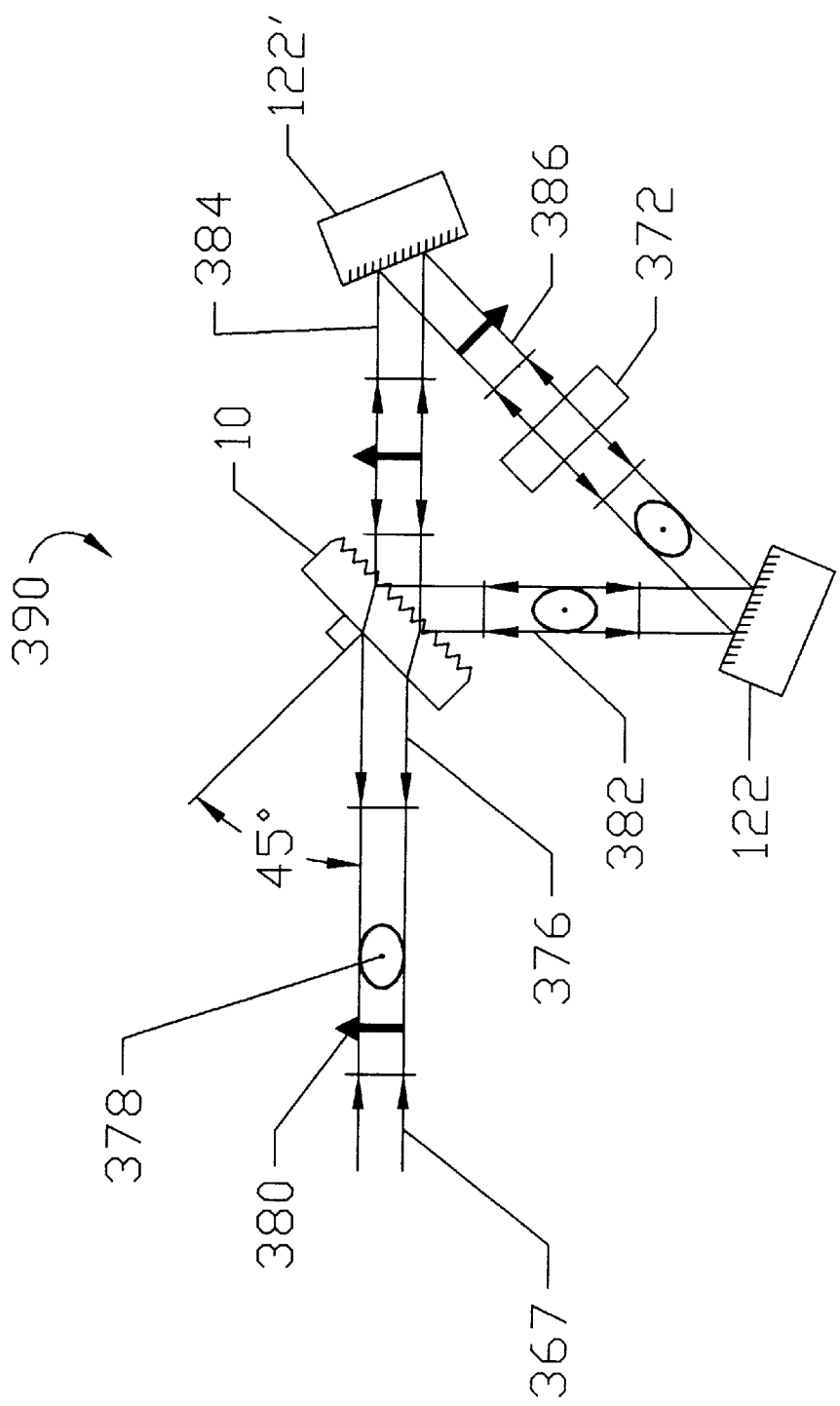
FIG. 28 is a schematic of yet another dual pass grating-based wavelength section unit utilizing the transmission grating element of FIG. 1.

A schematic side view is illustrated in FIG. 28 of a grating and mirror arrangement that enables the device 390 of this figure to achieve essentially equal radiometric throughput efficiency values for S and P optical polarization components while using a surface-relief transmission grating element 10 having a $\lambda/D$ value of about 1.4142. As depicted in FIG. 28, the incident beam 367 to device 390 is composed of both S and P polarized optical components where the S component 378 is depicted as an ellipse with a dot at its center while the P component 380 is depicted as a bold arrow. Only the S and P polarized components to the left of grating element 10 are labeled with their respective numbers 378 and 380. Though it may appear that the polarization direction convention used in FIG. 28 is opposite to that used in FIG. 27B, they are the same since FIG. 28 provides a side view relative to grating element 10 while FIG. 27B provides a top view relative to grating element 10.

Incident beam 367 of device 390 makes an angle of 45 degrees with respect to the normal of the surface of grating element 10 and, therefore, if it is assumed that grating element 10 of device 390 has $\lambda/D$ value of about 1.4142 and a grating aspect ratio in the range of 1.3 to 2.0, then according to the data in FIG. 4 the following diffraction conditions occur, which are depicted in FIG. 28. Grating element 10 diffracts essentially 100 percent of the S polarized beam component of the incident beam 367 while passing through undiffracted essentially 100 percent of the P polarized beam component of beam 367. For these diffraction conditions, grating element 10 performs the same function as the birefringent crystal element 370 of FIGS. 27A and 27B in that grating element 10 functions as a polarization beam splitter element. Combining the polarization beam splitter function into grating element 10 improves device performance with regard to optical insertion loss and wavefront errors, as well as device cost, relative to the device 360 arrangement in FIGS. 27A and 27B which incorporates a polarization beam splitter element based on a birefringent crystal component. Also, grating element 10 in device 390 can have essentially half the width used for the grating element in device 360 in FIGS. 27A and 27B since the beam propagating through element 10 in device 390 are collinear versus the spatial separated arrangement in device 360.

Both the diffracted and undiffracted beams in device 390 make an angle of 45 degrees to the normal to the grating surface of element 10. The S polarized diffracted beam propagates along beam path 382 of device 390 until beam fold mirror element 122 redirects it along beam path 386 in a counterclockwise direction. The P polarized undiffracted beam propagates along beam path 384 of device 390 until beam fold mirror element 122' redirects it along beam path 386 in a clockwise direction. Halfwave retardation plate 372 positioned in beam path 386 converts the polarization direction of the oppositely propagating beams in beam path 386 from P polarization to S polarization for the clockwise propagating beam and from S polarization to P polarization for the counterclockwise propagating beam. The counterclockwise propagating P polarized beam in beam path 386 is redirected by beam fold mirror element 122' along beam path 384 while the clockwise propagating S polarized beam in beam path 386 is redirected by beam fold mirror element 122 along beam path 382.

Grating element 10 functions in a reversible manner and, therefore, element 10 diffracts essentially 100 percent of the clockwise propagating S polarized beam in beam path 382 while passing through undiffracted essentially 100 percent of the counterclockwise propagating P polarized beam in beam path 384. Both of these diffracted and undiffracted beams propagate back along the incident beam path 367 as beam 367. Because grating element 10 functions in a reversible manner, the S and P polarized optical components of beam 367 have essentially equal values, thereby enabling device 390 to have essentially equal radiometric efficiency values for S and P polarizations.

It should be noted that while the S and P polarized components of the incident beam 367 pass twice through grating element 10 of device 390, each of these polarization components is only diffracted once by element 10 and, therefore, device 390 has a wavelength dispersion power as measured by its effective $\lambda/D$ value that is just equal to that of grating element 10, which for the example depicted in FIG. 28 corresponds to a $\lambda/D$ value of about 1.4142. As shown by the data on Pages 179–182 of the Loewen text discussed elsewhere in this specification, the polarization beam splitter function depicted for grating element 10 in device 390 can be achieved for surface-relief transmission gratings having a $\lambda/D$ value of about 1.4142 to approximately 2.0 and, therefore, the effective $\lambda/D$ value for device 390 can be from about 1.4142 to approximately 20 while achieving essentially equal radiometric throughput efficiency values for the S and P polarization components.

A major objective when designing grating-based devices for fiber-optic communication system applications is to incorporate techniques in the design for passively athermalizing the performance of the devices so that they meet operating specifications when used over the 70 degree centigrade temperature range specified for fiber-optic telecommunication applications without the need for active control. One of the major factors in these design techniques is to fabricate the surface-relief transmission grating element on a low thermal expansion substrate material because the thermal expansion coefficient of the substrate material determines how rapidly the grating line spacing changes as a function of temperature change for surface-relief gratings having a grating forming layer thickness that is extremely small in comparison to the substrate thickness. Change in the grating line spacing of a grating element causes a corresponding change in the angle of the beam diffracted by the element, which results in a positionally change of the focused diffracted beam at the focal plane of the Mux/Demux, wavelength channel monitoring or ADWM device incorporating the grating element. These changes in focused beam position give rise to increased optical insertion loss in the device and if large enough cause a shifting of data information between adjacent wavelength channels in the device.

The change in diffracted beam angle as a function of change in grating line spacing is calculated by differentiating Equation (1) with respect to dD, which gives:

$$d\theta_d = -\frac{\lambda \, dD}{D^2 \cos \theta_d}. \tag{7}$$

When the change in the grating line spacing is due to the thermal expansion change of the grating substrate material, $$dD = \alpha D \, dT, \tag{8}$$

where $\alpha$ is the thermal expansion coefficient of the substrate material and dT is the temperature change. Substituting Equation (8) into Equation (7) gives:

$$d\theta_d = -\frac{\lambda}{D} \frac{\alpha \, dT}{\cos \theta_d}. \tag{9}$$

Equation (9) is used to calculate how the diffracted beam angle changes as a function of the thermal expansion coefficient of the substrate material used for fabricating photoresist surface-relief transmission grating elements. For these calculations it was assumed that the grating element has a $\lambda/D$ ratio of 1.1 for a wavelength of 1550 nanometers and that $\theta_1 = \theta d = 33.4°$ for a wavelength of 1550 nanometers. Using these assumptions, the change in diffracted beam angle associated with a 70 degree centigrade temperature change and the corresponding spatial positionally change at the focal plane caused by this angular change was calculated for a Mux/Demux device incorporating a focusing lens assembly having a focal length of $f_1 = 40$ millimeters and for a wavelength channel monitoring device incorporating a focusing lens assembly having a focal length of $f_2 = 80$ millimeters. Results for these calculations are presented in Table I for different transmission glass types.

TABLE I

| Glass Type | Thermal Expansion Coefficient ($\times 10^{-7}/°$ C.) | Change in Diffraction Angle in Arc Seconds | Change in Spatial Position at Focal Plane in microns for $f_1$ | $f_2$ |
|---|---|---|---|---|
| BK7 | 70 | 133.18 | 25.8 | 51.6 |
| Fused Silica | 5.5 | 10.46 | 2.0 | 4.0 |
| O'Hara Clearceram-Z | 0.8 | 1.52 | 0.30 | 0.60 |
| ULE | 0.15 | 0.28 | 0.06 | 0.12 |

Assuming that the input/output fiber-optic array in the Mux/Demux device has a 25 micron spacing between fiber centers and that the photodetector linear array used in the wavelength channel monitoring device has a 50 micron spacing between photodetector elements, then it is evident from the data presented in Table I that BK7 should not be used as the substrate material for transmission gratings used in these devices unless other means are provided to compensate for the change in diffracted beam angle that occurs with this material as a result of temperature change. It is also evident from the data in Table I that fused silica could be used as the substrate material for the transmission gratings used in these devices but better results would be achieved by using either the O'Hare Clearceram-Z material or the ULE glass material.

While the device examples presented in this specification have focused on different arrangements for using surface-relief transmission grating elements for fabricating Mux/Demux, on-line wavelength channel monitoring and add/drop devices used in WDM fiber-optic systems, it is evident that these transmission gratings and the different usage arrangements described in this specification can also be used to construct tunable laser sources used in fiber-optic communication systems and to build spectrophotometer instruments used by field and laboratory personnel for measuring the wavelength component properties of WDM fiber-optic systems.

The following examples for the life test results achieved for photoresist surface-relief transmission grating elements are presented to illustrate the claimed invention and are not to be deemed limitative thereof. Unless otherwise specified, in all examples, all parts are by weight and all temperatures are in degrees centigrade.

In these life test examples, reference is made to the Bellcore GR1209 and GR1221 reliability guidelines for fiber-optic devices, which require that statistical data be provided based on testing multiple numbers of the same device and that test data be provided for up to 2000 hours of test time. The Bellcore tests require that the item tested, when subject to 85 degrees centigrade and 85% relative humidity, has less than 0.5 decibel optical insertion loss variation after being tested for 500 hours at these conditions.

A change of 0.1 decibel in optical insertion-loss corresponds to a change of 2.276 percent in the radiometric throughput efficiency of the item while a 0.5 decibel change corresponds to a 10.875 percent change in the radiometric throughput efficiency of the item. A change in optical insertion-loss for the tested surface-relief grating elements correlates to a change in the diffraction efficiency of the grating element caused by a change in the depth of the surface-relief grating groove height h. A change in the grating groove height h can occur in photoresist surface-relief gratings under conditions that cause the photoresist to flow.

All of the grating elements used in the life test experiments for the examples presented in this specification had a surface-relief transmission grating fabricated using in Shipley S1813 Photo Resist. All of the example grating elements used in these life test experiments had a grating line spacing equal to the 633 nanometer wavelength light used to measure the diffraction efficiency performance of the examples under life test. The diffraction efficiency for each example grating element was performed using the S polarized optical component at the Littrow diffraction condition, that is, $\theta_i = \theta_d$, which for the gratings in this test corresponded to $\theta_i = \theta_d = 30$ degrees. Diffraction efficiency data for each example grating element was taken before the element was tested at the Bellcore test conditions of 85 degrees centigrade and 85 percent relative humidity, and at different time intervals after the element began testing at these Bellcore test conditions. The number of time intervals that each element was tested depended on how long it took the element to fail, if it failed, or the number of hours the element has undergone testing when the data was assembled for the examples reported in this specification.

All of the surface-relief transmission diffraction grating examples for these life test experiments consisted of circular disk substrates having a diameter of either 100 or 120 millimeters. Each disk substrate contained 5 essentially identical plane diffraction grating segments arranged symmetrically around the center of the disk. This type of circular disk grating element is commercially available from Holotek LLC and is sold as a hologon element. Each of the example hologon disks used for these life test experiments was prepared in accordance with the processing procedures described in FIG. 3 of this specification, except for the Comparative Examples 1, 2, and 3. An area of one of the 5 grating segments on each example hologon disk was circled with a permanent marker pen, the circled area being used to measure the diffraction efficiency of that example before and during testing at the Bellcore conditions.

Each of the example hologon disks for these life test experiments was configured as either a bare hologon substrate disk that was uncovered during the life testing by any protective element and hologon disks having a cover glass disk that protected the grating surface, similar to the encapsulated grating surface configuration in FIG. 9 of this specification. Different sealing compounds were used, in the different comparative examples that used this covered hologon disk structure, to bond the cover glass disk to the hologon substrate disk. All covered hologon disk examples in these tests used 0.002 inch shims to space the hologon substrate grating surface from the cover disk surface.

COMPARATIVE EXAMPLE 1

The hologon disks for Example 1 were processed using steps 50 through 60 of FIG. 3 of this specification, but did not include steps 62 and 64 of FIG. 3. After step 60 of FIG. 3, the dried hologon substrate disks and their cleaned matching cover disks were placed in an 82 degrees centigrade oven for 1 hour. After cooling down to room temperature the hologon substrate disks and their cover disks were bonded together using Norland 61 and 68 ultraviolet light curable adhesives. The Norland 61 adhesive was used to seal the center of the hologon assembly which had a through hole, while the Norland 68 adhesive was used to seal the circumference of the hologon disk assembly. The Norland adhesives were cured using a lamp having a ultraviolet spectrum output in the range of 350 to 430 nanometers. As part of the initial sealing process, small vent holes were left in the outer sealing ring on the hologon covered assemblies, and the vented assemblies were placed in a vacuum oven at 70 degrees centigrade for 30 minutes to help remove any residuals associated with the ultraviolet adhesives. After removal from the vacuum oven the hologons were cooled to room temperature and the vent holes sealed.

The Norland Optical Adhesive 61, and the Norland Optical Adhesive 68, were obtained from Norland Products Incorporated of 695 Joyce Kilmer Avenue, New Brunswick, N.J. According to the Material Safety Data Sheets for these products, "The specific chemical identity and concentration is being withheld from this data sheet as a trade secret."

The covered hologon assemblies bonded using the Norland adhesives were subjected to a temperature of 85 degrees centigrade and a relative humidity of 85 percent. In less than 2 hours under these test conditions, both sets of hologons failed completely, that is, the grating surface structure disappeared under these conditions.

COMPARATIVE EXAMPLE 2

The uncovered hologon disk for Example 2 was made substantially in accordance with the procedure used to prepare the Example 1 hologons with the exception that the bare photoresist surface of the hologon substrate disk, after cooling to room temperature following the 1 hour bake at 82 degrees centigrade, was exposed to a lamp for 30 minutes having an ultraviolet spectrum output in the range of 350 to 430 nanometers. The grating surface structure of the uncovered hologon made in accordance with this procedure failed completely in less than two hours when subjected to a temperature of 85 degrees centigrade and a relative humidity of 85 percent.

COMPARATIVE EXAMPLE 3

The uncovered hologon disk for this example was processed using steps 50 through 60 of FIG. 3 of this specification, but did not include steps 62 and 64 of FIG. 3. After step 60 of FIG. 3, the dried bare photoresist surface of the hologon disk was simultaneously subjected to a temperature of about 110 degrees centigrade while being irradiated with ultraviolet light at a wavelength of 260 nanometers for approximately 20 minutes. It was observed that this post-baked/UV exposure procedure caused the hologon to change from a yellow to a clear to a light-to-medium brown color. This uncovered bare hologon experienced essentially no change in diffraction grating efficiency after being tested for over 300 hours at the 85 degrees centigrade and 85 percent relative humidity test conditions.

COMPARATIVE EXAMPLE 4

The uncovered hologon disk for this example was processed using all of the steps of FIG. 3 of this specification. Exposure of the bare photoresist surface of the hologon disk at ambient room temperature and pressure conditions to the 260 nanometer DUV light source in step 62 of FIG. 3 bleached the photoresist layer and, thereby changed the color of the photoresist layer from a yellow color to an substantially optically clear color having no visible observable color tint. The photoresist layer stays substantially optically clear not only after being heated in processing step 64 of FIG. 3 but also after being tested for about 1,000 hours at the aforementioned Bellcore test conditions. After exposure to the DUV light source, the hologon disk was in step 62 of FIG. 3 heated to a temperature of about 110 to 115 degrees centigrade for approximately 30 minutes. The uncovered bare hologon made in accordance with this procedure experienced less than a 0.2 decibel change in its diffraction efficiency performance after being subject to testing at a temperature of 85 degrees centigrade and a relative humidity of 85 percent for in excess of 1,700 hours and, therefore, meets the aforementioned Bellcore test conditions.

COMPARATIVE EXAMPLE 5

The uncovered hologon disk for this example was processed using the procedure used to prepare Example 4, with the exception that after the bare photoresist surface of the hologon is exposed to the 260 nanometer radiation for about 10 minutes at ambient room temperature and pressure conditions, the hologon was heated in step 62 of FIG. 3 of this specification to a temperature of about 140 to 150 degrees centigrade for about 30 minutes. As was the case for the procedure used to process Example 4, the hologon for these processing conditions was substantially optically clear with no visible observable color tint. The uncovered bare hologon made in accordance with this procedure experienced less than 0.3 decibel change in its diffraction efficiency performance after being subjected to testing at a temperature of 85 degrees centigrade and a relative humidity of 85 percent for in excess of 1,700 hours and, therefore, meets the aforementioned Bellcore test conditions.

COMPARATIVE EXAMPLE 6

The hologon substrate disk used for this covered hologon disk example was processed using all of the steps of FIG. 3 of this specification, similar to the procedures used to process Examples 4 and 5. The processing of this hologon substrate differs from the procedure used to process Examples 4 and 5 in that in 64 of FIG. 3 the hologon substrate disk was heated to a temperature of about 130 to 135 degrees centigrade for about 30 minutes. As was the case for the procedures used to process Examples 4 and 5, the hologon for these processing conditions was substantially optically clear with no visible observable color tint.

The hologon substrate for this example was bonded to its clean cover disk using AB 9001 MT Epoxy, manufactured by Fiber Optic Center, Inc. of 23 Centre Street, New Bedford, Mass. The photoresist was removed from the hologon substrate disk in the areas where the epoxy adhesive was to be applied to form the bond. After applying the epoxy to the example, it sat at room temperature for 15 hours and then was finish-cured in a dry oven at 85 degrees centigrade for 30 minutes, followed by 100 degrees centigrade for 30 minutes.

The bonded hologon of this example, after being subjected to a temperature of 85 degrees centigrade and a relative humidity of 85 percent for more than 1,000 hours, had an optical insertion loss of less than 0.3 decibels and, therefore, meets the aforementioned Bellcore test conditions.

COMPARATIVE EXAMPLE 7

The hologon substrate disk used for this covered disk example was processed using the procedure of Example 6. The hologon substrate for this example was bonded to its clean cover disk using EPO-TEK 353ND epoxy, manufactured by Epoxy Technology of 14 Fortune Drive, Billerica, Mass.,; this adhesive is a two component, 100% solids heat curing epoxy designed for high temperature applications; it is comprised of an acrylonitrile curing agent, and it is also comprised of less than about 75 weight percent of Bisphenol F.

The EPO-TEK 353ND epoxy had a low viscosity, and thus it was mixed by volume in a ratio of approximately 1 part epoxy to 9 parts of fused silica particles sintered together in chain-like formations and sold under the name of "Cab-O-Sil" by the Cabot Corporation of 1020 West Park Avenue, Kokoma, Ind.

The photoresist was removed from the hologon substrate disk in the areas where the epoxy adhesive was to be applied to form the bond. After applying the adhesive to the example, it sat at room temperature for 15 hours and then was finish-cured in a dry oven at 85 degrees centigrade for 30 minutes, followed by 100 degrees centigrade for 30 minutes.

The bonded sealed hologon of this example, after being subjected to a temperature of 85 degrees centigrade and a relative humidity of 85 percent for more than 1,000 hours, had an optical insertion loss of less than 0.3 decibels and, therefore, meets the aforementioned Bellcore test conditions.

COMPARATIVE EXAMPLE 8

The hologon substrate disk used for this covered disk example was processed using the procedure for Example 6. The hologon substrate for this example was bonded to its clean cover disk using Devcon Aluminum Putty (F) 10610 Epoxy manufactured by ITW Devon of Danvers, Mass.

The photoresist was removed from the hologon substrate disk in the areas where the epoxy adhesive was to be applied to form the bond. After applying the adhesive to the example, it sat at room temperature for 15 hours and then was finish-cured in a dry oven at 85 degrees centigrade for 30 minutes, followed by 100 degrees centigrade for 30 minutes.

The bonded hologon of this example, after being subjected to a temperature of 85 degrees centigrade and a relative humidity of 85 percent for 500 hours, had an optical insertion loss of approximately 0.5 decibels, and after 1,000 hours the optical insertion loss increased to approximately 1.0 decibels. This example just meets the aforementioned Bellcore test conditions of having no more than a 0.5 decibel change in optical insertion loss for 500 hours of test time.

COMPARATIVE EXAMPLE 9

The hologon substrate disk used for this covered disk example was processed using he procedure of Example 6. The hologon substrate for this example was bonded to its clean cover disk using Scotch-Weld Epoxy Adhesive DP-190, which contained epoxy resin, kaolin, aliphatic polymer diamine, and carbon black; this multi-component adhesive was sold by the Minnesota Mining and Manufacturing Corporation of St. Paul, Minn.

The photoresist was removed from the hologon substrate disk in the areas where the epoxy adhesive was to be applied to form the bond. After applying the adhesive to the example, it sat at room temperature for 15 hours and then was finish-cured in a dry oven at 85 degrees centigrade for 30 minutes, followed by 100 degrees centigrade for 30 minutes.

The bonded sealed hologon of this example, after being subjected to a temperature of 85 degrees centigrade and a relative humidity of 85 percent for more 500 hours, had an optical insertion loss of approximately 1.0 decibels, and after 1,000 hours the optical insertion loss increased to approximately 1.6 decibels. This example does not meet the aforementioned Bellcore test conditions.

COMPARATIVE EXAMPLE 10

The hologon substrate disk used for this covered disk example was processed using the procedure of Example 6. The hologon substrate for this example was bonded to its clean cover disk using the same Norland 61 and 68 optical adhesives used to bond the hologon disks in Example 1. The bonding technique used for this example is the same as used for Example 1, in which the adhesives are applied to the hologon substrate disk without removing the photoresist form areas where the adhesives were applied to from the bond.

The bonded sealed hologon of this example, after being subjected to a temperature of 85 degrees centigrade and a relative humidity of 85 percent for more 500 hours, had an optical insertion loss in the range of 3.3 decibels, and after about 900 hours the optical insertion loss increased to about 20 decibels. This example does not meet the aforementioned Bellcore test conditions.

COMPARATIVE EXAMPLE 11

The hologon substrate disk used for this covered disk example was processed using the procedure of Example 6. The hologon substrate for this example was bonded to its clean cover disk using ELC 2728 ultraviolet light curable epoxy manufactured by Electro-Lite Corporation of 43 Miry Brook Road, Danbury, Conn.

The ultraviolet curable epoxy was applied to the hologon substrate disk without removing the photoresist from areas where the epoxy was applied to from the bond. After the epoxy was applied to the example, it was cured using a lamp having an ultraviolet spectrum output in the range of about 350 to 430 nanometers.

The bonded sealed hologon of this example, after being subject to a temperature of 85 degrees centigrade and a relative humidity of 85 percent for about 500 hours, had an optical insertion loss in the range of 4.7 decibels and after about 900 hours the optical insertion loss increased to about 5.3 decibels. This example does not meet the aforementioned Bellcore test conditions.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

I claim:

1. An optical wavelength selection apparatus comprising a surface-relief diffraction grating assembly, a collimating lens assembly for collimating optical beams to said surface-relief diffraction grating assembly, and a focusing lens assembly for focusing beams diffracted from said surface-relief diffraction grating assembly, wherein said surface-relief diffraction grating assembly is comprised of a substrate and, bound to such substrate, a photoresist surface-relief diffraction grating, wherein said surface-relief diffraction grating assembly has an initial diffraction efficiency, and wherein, after said surface-relief diffraction grating assembly has been subjected to a temperature of 85 degrees centigrade and a relative humidity of 85 percent for 1,000 hours, said surface-relief diffraction grating assembly has a diffraction efficiency that is less than 6 percent different from said initial diffraction efficiency.

2. The surface-relief diffraction grating assembly as recited in claim 1, wherein said photoresist surface relief diffraction grating has a substantially sinusoidal shape.

* * * * *